United States Patent
Levitsky et al.

(10) Patent No.: US 11,528,092 B2
(45) Date of Patent: Dec. 13, 2022

(54) LATENCY MINIMIZATION FOR RETRANSMISSIONS IN COMMUNICATIONS SYSTEMS WITH MULTI-LEVEL CODING AND MULTI-LEVEL SEQUENTIAL DEMODULATION AND DECODING AND CODE BLOCK GROUPING FROM DIFFERENT COMPONENT CODES

(71) Applicant: QUALCOMM incorporated, San Diego, CA (US)

(72) Inventors: Michael Levitsky, Rehovot (IL); Assaf Touboul, Netanya (IL); Daniel Paz, Geva Carmel (IL)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 17/359,160

(22) Filed: Jun. 25, 2021

(65) Prior Publication Data
US 2022/0069941 A1 Mar. 3, 2022

Related U.S. Application Data

(60) Provisional application No. 63/073,823, filed on Sep. 2, 2020.

(51) Int. Cl.
*H04L 1/00* (2006.01)
*H03M 13/25* (2006.01)
(Continued)

(52) U.S. Cl.
CPC .......... *H04L 1/0057* (2013.01); *H03M 13/05* (2013.01); *H03M 13/251* (2013.01);
(Continued)

(58) Field of Classification Search
CPC ... H04L 1/0041; H04L 1/0045; H04L 1/0054; H04L 1/0057; H04L 1/1816; H04L 1/1819; H04L 1/1812; H04L 1/1896
See application file for complete search history.

(56) References Cited

U.S. PATENT DOCUMENTS

| 2006/0026491 A1* | 2/2006 | Shoemake | ............ | H04L 1/0026 |
| | | | | 714/776 |
| 2018/0026755 A1* | 1/2018 | Meng | .................... | H04L 1/0052 |
| | | | | 370/429 |

(Continued)

FOREIGN PATENT DOCUMENTS

JP 2009055207 A 3/2009

OTHER PUBLICATIONS

International Search Report and Written Opinion—PCT/US2021/043338—ISA/EPO—dated Nov. 19, 2021.

*Primary Examiner* — Shelly A Chase
(74) *Attorney, Agent, or Firm* — Holland & Hart LLP

(57) ABSTRACT

Methods, systems, and devices for wireless communications employing multi-level coding with set partitioning on transmitting side and multi-level sequential decoding on the receiving side for latency minimization are described. In some systems, a transmitting device may transmit a code block group (CBG) to a receiving device including a first set of code blocks associated with a first decoding level and a second set of code blocks associated with a second decoding level. The receiving device may unsuccessfully decode one or more code blocks of the first set or the second set of code blocks and transmit a feedback message to the transmitting device. The transmitting device may determine that the data to be communicated via the CBG is latency-sensitive data and, as such, determine to retransmit both the first set and the (Continued)

second set of code blocks to the receiving device in response to receiving the feedback message.

30 Claims, 20 Drawing Sheets

(51) Int. Cl.
*H03M 13/39* (2006.01)
*H03M 13/05* (2006.01)
(52) U.S. Cl.
CPC ...... *H03M 13/3977* (2013.01); *H04L 1/0041* (2013.01); *H04L 1/0054* (2013.01)

(56) References Cited

U.S. PATENT DOCUMENTS

| | | |
|---|---|---|
| 2018/0324816 A1 | 11/2018 | Islam et al. |
| 2019/0007170 A1* | 1/2019 | Sun ........................ H04L 1/0013 |
| 2019/0140784 A1 | 5/2019 | Xi et al. |
| 2019/0158227 A1 | 5/2019 | Gupta et al. |
| 2019/0191486 A1* | 6/2019 | Myung ................. H04W 72/14 |
| 2020/0099480 A1 | 3/2020 | Grovlen et al. |

* cited by examiner

Codeword 220-a

Codeword 220-b

US 11,528,092 B2

LATENCY MINIMIZATION FOR RETRANSMISSIONS IN COMMUNICATIONS SYSTEMS WITH MULTI-LEVEL CODING AND MULTI-LEVEL SEQUENTIAL DEMODULATION AND DECODING AND CODE BLOCK GROUPING FROM DIFFERENT COMPONENT CODES

CROSS REFERENCE

The present Application for Patent claims the benefit of U.S. Provisional Patent Application No. 63/073,823 by LEVITSKY et al., entitled "LATENCY MINIMIZATION FOR RETRANSMISSIONS IN COMMUNICATIONS SYSTEMS WITH MULTI-LEVEL CODING AND MULTI-LEVEL SEQUENTIAL DEMODULATION AND DECODING AND CODE BLOCK GROUPING FROM DIFFERENT COMPONENT CODES," filed Sep. 2, 2020, assigned to the assignee hereof, and expressly incorporated by reference herein.

TECHNICAL FIELD

The following relates to wireless communications, including latency minimization for retransmissions in communications systems with multi-level coding and multi-level sequential demodulation and decoding and code block grouping from different component codes.

BACKGROUND

Wireless communications systems are widely deployed to provide various types of communication content such as voice, video, packet data, messaging, broadcast, and so on. These systems may be capable of supporting communication with multiple users by sharing the available system resources (e.g., time, frequency, and power). Examples of such multiple-access systems include fourth generation (4G) systems such as Long Term Evolution (LTE) systems, LTE-Advanced (LTE-A) systems, or LTE-A Pro systems, and fifth generation (5G) systems which may be referred to as New Radio (NR) systems. These systems may employ technologies such as code division multiple access (CDMA), time division multiple access (TDMA), frequency division multiple access (FDMA), orthogonal frequency division multiple access (OFDMA), or discrete Fourier transform spread orthogonal frequency division multiplexing (DFT-S-OFDM). A wireless multiple-access communications system may include one or more base stations or one or more network access nodes, each simultaneously supporting communication for multiple communication devices, which may be otherwise known as user equipment (UE).

Information transmitted between network nodes may be encoded to improve the reliability of the transmitted information. For example, a coding scheme may provide redundancy, which may be used to correct errors that result from the transmission environment. Some wireless communications systems may use multi-level coding and multi-level sequential demodulation and decoding to improve spectral efficiency. A device may employ a hierarchical hybrid automation repeat request (HARQ) procedure that allows for a gradual retransmission of different coding levels that reduces the volume of the retransmitted data. In some cases, hierarchical HARQ procedures related to multi-level coding may lead to an increased overall latency for the corresponding data allocation.

SUMMARY

The described techniques relate to improved methods, systems, devices, and apparatuses that support latency minimization for retransmissions in communications systems with multi-level coding and multi-level sequential demodulation and decoding and code block grouping from different component codes. Generally, the described techniques provide for latency minimization techniques within a hierarchical hybrid automation repeat request (HARQ) procedure across different decoding levels in systems using multi-level coding and multi-level sequential demodulation and decoding. One such procedure may include a user equipment (UE) receiving a code block group (CBG) from a base station which includes code blocks associated with different codewords, each codeword associated with a different decoding level. For example, the CBG may include a first set of code blocks that are associated with a first codeword (and likewise associated with a first decoding level) and a second set of code blocks that are associated with a second codeword (and likewise associated with a second decoding level). The UE may determine that a decoding procedure associated with at least one of the first set of code blocks (or the corresponding first codeword) or the second set of code blocks (or the corresponding second codeword) is unsuccessful. In some examples, the decoding procedure may have failed for the first set of code blocks. In some other examples, the decoding procedure may have failed for the second set of code blocks. In either example, the UE may transmit a feedback message (e.g., HARQ feedback) to the base station indicating that the decoding procedure was unsuccessful for the CBG.

In response, the base station may retransmit the CBG (e.g., all code blocks and corresponding codewords of the CBG) to the UE. For example, the base station may retransmit both the first set of code blocks and the second set of code blocks to the UE regardless of which set of code blocks (or which corresponding codeword or at which corresponding decoding level) failed the decoding procedure at the UE for the previous redundancy version transmissions. As such, the UE may receive the retransmitted CBG and have both the first set of code blocks associated with the first codeword and the second set of code blocks associated with the second codeword that are coupled through the same occupied channel resources retransmitted together and available for a sequential demodulation and decoding procedure. In some cases, this may allow or enable the UE to have a guaranteed a priory known partitioning information for the second decoding level related code blocks in case that the first (lower) decoding level related code blocks successfully passed a cyclic redundancy check (CRC) after the previous retransmission. In some other cases, this may allow or enable the UE to have multiple retransmissions of the second decoding level related code blocks available for immediate HARQ combining once the first decoding level related code blocks are successfully decoded after some number of retransmissions. The described approach may reduce latency and, in some implementations, the base station and the UE may implement the described latency minimization techniques upon determining that the data associated with the CBG is latency-sensitive data (e.g., data that is highly latency sensitive, such as data associated with a low-latency constraint or requirement).

A method of wireless communication at a UE is described. The method may include receiving, from a base station in a first transmission time interval (TTI), a CBG including a set of code blocks associated with a set of codewords, each codeword of the set of codewords associated with one of a set of decoding levels of a decoding procedure for the CBG, determining that the decoding procedure associated with at least one of a first set of code blocks of the set of code blocks or a second set of code blocks of the set of code blocks is unsuccessful, where the first set of code blocks are associated with a first codeword, and the second set of code blocks are associated with a second codeword, transmitting, to the base station, a feedback message including an indicator that the decoding procedure was unsuccessful for the CBG based on the determining that the decoding procedure associated with at least one of the first set of code blocks or the second set of code blocks is unsuccessful, and receiving, from the base station in a second TTI and based on the transmitted feedback message, a retransmission of the CBG including both the first set of code blocks and the second set of code blocks.

An apparatus for wireless communication at a UE is described. The apparatus may include at least one processor, memory coupled (e.g., operatively, communicatively, functionally, electronically, or electrically) to the at least one processor, and instructions stored in the memory. The instructions may be executable by the at least one processor to cause the apparatus to receive, from a base station in a first TTI, a CBG including a set of code blocks associated with a set of codewords, each codeword of the set of codewords associated with one of a set of decoding levels of a decoding procedure for the CBG, determine that the decoding procedure associated with at least one of a first set of code blocks of the set of code blocks or a second set of code blocks of the set of code blocks is unsuccessful, where the first set of code blocks are associated with a first codeword, and the second set of code blocks are associated with a second codeword, transmit, to the base station, a feedback message including an indicator that the decoding procedure was unsuccessful for the CBG based on the determining that the decoding procedure associated with at least one of the first set of code blocks or the second set of code blocks is unsuccessful, and receive, from the base station in a second TTI and based on the transmitted feedback message, a retransmission of the CBG including both the first set of code blocks and the second set of code blocks.

Another apparatus for wireless communication at a UE is described. The apparatus may include means for receiving, from a base station in a first TTI, a CBG including a set of code blocks associated with a set of codewords, each codeword of the set of codewords associated with one of a set of decoding levels of a decoding procedure for the CBG, determining that the decoding procedure associated with at least one of a first set of code blocks of the set of code blocks or a second set of code blocks of the set of code blocks is unsuccessful, where the first set of code blocks are associated with a first codeword, and the second set of code blocks are associated with a second codeword, transmitting, to the base station, a feedback message including an indicator that the decoding procedure was unsuccessful for the CBG based on the determining that the decoding procedure associated with at least one of the first set of code blocks or the second set of code blocks is unsuccessful, and receiving, from the base station in a second TTI and based on the transmitted feedback message, a retransmission of the CBG including both the first set of code blocks and the second set of code blocks.

A non-transitory computer-readable medium storing code for wireless communication at a UE is described. The code may include instructions executable by at least one processor to receive, from a base station in a first TTI, a CBG including a set of code blocks associated with a set of codewords, each codeword of the set of codewords associated with one of a set of decoding levels of a decoding procedure for the CBG, determine that the decoding procedure associated with at least one of a first set of code blocks of the set of code blocks or a second set of code blocks of the set of code blocks is unsuccessful, where the first set of code blocks are associated with a first codeword, and the second set of code blocks are associated with a second codeword, transmit, to the base station, a feedback message including an indicator that the decoding procedure was unsuccessful for the CBG based on the determining that the decoding procedure associated with at least one of the first set of code blocks or the second set of code blocks is unsuccessful, and receive, from the base station in a second TTI and based on the transmitted feedback message, a retransmission of the CBG including both the first set of code blocks and the second set of code blocks.

In some examples of the method, apparatuses, and non-transitory computer-readable medium described herein, determining that the decoding procedure associated with at least one of the first set of code blocks or the second set of code blocks may be unsuccessful may include operations, features, means, or instructions for determining that the decoding procedure associated with the first set of code blocks may be successful, and determining that the decoding procedure associated with the second set of code blocks may be unsuccessful.

Some examples of the method, apparatuses, and non-transitory computer-readable medium described herein may further include operations, features, means, or instructions for storing a decoded payload associated with the first set of code blocks in a buffer at the UE.

Some examples of the method, apparatuses, and non-transitory computer-readable medium described herein may further include operations, features, means, or instructions for storing a log likelihood ratio associated with the second set of code blocks associated with the second codeword and a HARQ process identifier.

Some examples of the method, apparatuses, and non-transitory computer-readable medium described herein may further include operations, features, means, or instructions for decoding, in the second TTI and based on receiving the retransmission of the CBG, the second set of code blocks associated with the second codeword using the stored log likelihood ratio, determining that the decoding procedure associated with the retransmission of the second set of code blocks may be successful based on the decoding, and transmitting, to the base station, a second feedback message indicating that the decoding procedure associated with the retransmission of the CBG may be successful.

In some examples of the method, apparatuses, and non-transitory computer-readable medium described herein, decoding the second set of code blocks during the second TTI may include operations, features, means, or instructions for decoding the second set of code blocks of the retransmission of the CBG received during the second TTI after HARQ combining with the second set of code blocks of the CBG received during the first TTI.

Some examples of the method, apparatuses, and non-transitory computer-readable medium described herein may further include operations, features, means, or instructions for re-modulating a redundancy version of the first set of code blocks of the retransmission of the CBG during the second TTI based on the stored decoded payload associated with the first set of code blocks, and determining set partitioning information for demodulation of the second set of code blocks of the retransmission of the CBG during the second TTI based on the stored decoded payload associated with the first set of code blocks and re-encoding for obtaining a corresponding redundancy version that defines the set partitioning information.

Some examples of the method, apparatuses, and non-transitory computer-readable medium described herein may further include operations, features, means, or instructions for refraining from decoding the first set of code blocks of the retransmission of the CBG during the second TTI based on the determining that the decoding procedure associated with the first set of code blocks may be successful during the first TTI.

In some examples of the method, apparatuses, and non-transitory computer-readable medium described herein, determining that the decoding procedure associated with one of the first set of code blocks or the second set of code blocks may be unsuccessful further may include operations, features, means, or instructions for determining that the decoding procedure associated with the first set of code blocks may be unsuccessful, and deferring the decoding procedure associated with the second set of code blocks based on the determining that the decoding procedure associated with the first set of code blocks may be unsuccessful.

Some examples of the method, apparatuses, and non-transitory computer-readable medium described herein may further include operations, features, means, or instructions for storing a log likelihood ratio associated with the first set of code blocks associated with the first codeword and a HARQ process identifier, and storing post-processing samples corresponding to resources occupied by the second set of code blocks associated with the second codeword, the second set of code blocks corresponding to the first set of code blocks, where the post-processing samples may be stored in a corresponding buffer.

Some examples of the method, apparatuses, and non-transitory computer-readable medium described herein may further include operations, features, means, or instructions for successfully decoding the first set of code blocks associated with the first codeword during the second TTI based on receiving the retransmission of the CBG and using the stored log likelihood ratio for HARQ combining with the retransmission of the CBG, determining set partitioning information for demodulation of the second set of code blocks of the retransmission of the CBG during the second TTI based on successfully decoding the first set of code blocks during the second TTI, and decoding the second set of code blocks of the retransmission of the CBG during the second TTI based on the set partitioning information for the demodulation of the second set of code blocks.

In some examples of the method, apparatuses, and non-transitory computer-readable medium described herein, successfully decoding the first set of code blocks associated with the first codeword during the second TTI may include operations, features, means, or instructions for decoding the first set of code blocks of the retransmission of the CBG received during the second TTI after the HARQ combining with the first set of code blocks of the CBG received during the first TTI.

In some examples of the method, apparatuses, and non-transitory computer-readable medium described herein, decoding the second set of code blocks of the retransmission of the CBG during the second TTI may include operations, features, means, or instructions for decoding the second set of code blocks of the retransmission of the CBG received during the second TTI after the HARQ combining with the second set of code blocks of the CBG received during the first TTI, where the HARQ combining may be based on the stored post-processing samples.

In some examples of the method, apparatuses, and non-transitory computer-readable medium described herein, the HARQ combining may include operations, features, means, or instructions for determining a first log likelihood ratio associated with the second set of code blocks associated with the second codeword received during the first TTI based on the set partitioning information and the stored post-processing samples, and combining the first log likelihood ratio with a corresponding second log likelihood ratio associated with the second set of code blocks associated with the second codeword received during the second TTI.

Some examples of the method, apparatuses, and non-transitory computer-readable medium described herein may further include operations, features, means, or instructions for transmitting, to the base station, an indication of a capability of the UE to support hierarchical acknowledgment feedback, a number of HARQ processes across the set of decoding levels, and a corresponding number of samples buffers of the UE, where receiving the retransmission of the CBG including the first set of code blocks associated with the first codeword and the second set of code blocks associated with the second codeword using a same redundancy version for both the first set of code blocks and the second set of code blocks may be based on the capability of the UE.

Some examples of the method, apparatuses, and non-transitory computer-readable medium described herein may further include operations, features, means, or instructions for receiving, from the base station, a control message responsive to the feedback message, the control message including a retransmission indicator for the CBG.

Some examples of the method, apparatuses, and non-transitory computer-readable medium described herein may further include operations, features, means, or instructions for determining that the retransmission indicator includes a HARQ process identifier and a redundancy version associated with the first codeword and the second codeword, where receiving the retransmission of the CBG including both the first set of code blocks and the second set of code blocks includes receiving a retransmission of first codeword and the second codeword associated with the first set of code blocks and the second set of code blocks, respectively.

In some examples of the method, apparatuses, and non-transitory computer-readable medium described herein, the control message includes a downlink control information (DCI) message.

In some examples of the method, apparatuses, and non-transitory computer-readable medium described herein, transmitting the feedback message may include operations, features, means, or instructions for transmitting the feedback message including the indicator that the decoding procedure was unsuccessful for the CBG and an indication of a lowest failing decoding level for the CBG, where the indication may be of a first decoding level associated with the first codeword if the decoding procedure was unsuccessful for the first set of code blocks or of a second decoding level associated with the second codeword if the decoding procedure was unsuccessful for the second set of code blocks.

In some examples of the method, apparatuses, and non-transitory computer-readable medium described herein, the first codeword may be associated with a first and lower decoding level and the second codeword may be associated with a second and higher decoding level.

In some examples of the method, apparatuses, and non-transitory computer-readable medium described herein, the UE may be configured to support multi-level coding with a multi-level sequential demodulation and decoding scheme.

In some examples of the method, apparatuses, and non-transitory computer-readable medium described herein, the first TTI includes a first subframe or a first slot, and the second TTI includes a second subframe or a second slot.

A method of wireless communication at a base station is described. The method may include transmitting, to a UE in a first TTI, a CBG including a set of code blocks associated with a set of codewords, where each codeword of the set of codewords is associated with one of a set of decoding levels of a decoding procedure for the CBG, a first set of code blocks of the set of code blocks are associated with a first codeword of the set of codewords, and a second set of code blocks of the set of code blocks are associated with a second codeword of the set of codewords, receiving, from the UE, a feedback message including an indicator that the decoding procedure was unsuccessful for at least one of the first set of code blocks or the second set of code blocks, and transmitting, to the UE in a second TTI and based on the received feedback message, a retransmission of the CBG including both the first set of code blocks and the second set of code blocks.

An apparatus for wireless communication at a base station is described. The apparatus may include at least one processor, memory coupled (e.g., operatively, communicatively, functionally, electronically, or electrically) to the at least one processor, and instructions stored in the memory. The instructions may be executable by the at least one processor to cause the apparatus to transmit, to a UE in a first TTI, a CBG including a set of code blocks associated with a set of codewords, where each codeword of the set of codewords is associated with one of a set of decoding levels of a decoding procedure for the CBG, a first set of code blocks of the set of code blocks are associated with a first codeword of the set of codewords, and a second set of code blocks of the set of code blocks are associated with a second codeword of the set of codewords, receive, from the UE, a feedback message including an indicator that the decoding procedure was unsuccessful for at least one of the first set of code blocks or the second set of code blocks, and transmit, to the UE in a second TTI and based on the received feedback message, a retransmission of the CBG including both the first set of code blocks and the second set of code blocks.

Another apparatus for wireless communication at a base station is described. The apparatus may include means for transmitting, to a UE in a first TTI, a CBG including a set of code blocks associated with a set of codewords, where each codeword of the set of codewords is associated with one of a set of decoding levels of a decoding procedure for the CBG, a first set of code blocks of the set of code blocks are associated with a first codeword of the set of codewords, and a second set of code blocks of the set of code blocks are associated with a second codeword of the set of codewords, receiving, from the UE, a feedback message including an indicator that the decoding procedure was unsuccessful for at least one of the first set of code blocks or the second set of code blocks, and transmitting, to the UE in a second TTI and based on the received feedback message, a retransmission of the CBG including both the first set of code blocks and the second set of code blocks.

A non-transitory computer-readable medium storing code for wireless communication at a base station is described. The code may include instructions executable by at least one processor to transmit, to a UE in a first TTI, a CBG including a set of code blocks associated with a set of codewords, where each codeword of the set of codewords is associated with one of a set of decoding levels of a decoding procedure for the CBG, a first set of code blocks of the set of code blocks are associated with a first codeword of the set of codewords, and a second set of code blocks of the set of code blocks are associated with a second codeword of the set of codewords, receive, from the UE, a feedback message including an indicator that the decoding procedure was unsuccessful for at least one of the first set of code blocks or the second set of code blocks, and transmit, to the UE in a second TTI and based on the received feedback message, a retransmission of the CBG including both the first set of code blocks and the second set of code blocks.

Some examples of the method, apparatuses, and non-transitory computer-readable medium described herein may further include operations, features, means, or instructions for transmitting, to the UE, a control message responsive to the feedback message, the control message including a retransmission indicator for the CBG.

Some examples of the method, apparatuses, and non-transitory computer-readable medium described herein may further include operations, features, means, or instructions for including a HARQ process identifier and a redundancy version associated with the first codeword and the second codeword in the retransmission indicator, where transmitting the retransmission of the CBG includes transmitting a retransmission of the first set of code blocks associated with the first codeword and a retransmission of the second set of code blocks associated with the second codeword.

In some examples of the method, apparatuses, and non-transitory computer-readable medium described herein, the control message includes a DCI message.

Some examples of the method, apparatuses, and non-transitory computer-readable medium described herein may further include operations, features, means, or instructions for determining that a data type associated with the CBG corresponds to a latency-sensitive data type, where transmitting the retransmission of the CBG including both the first set of code blocks and the second set of code blocks may be based on the data type being the latency-sensitive data type.

In some examples of the method, apparatuses, and non-transitory computer-readable medium described herein, receiving the feedback message may include operations, features, means, or instructions for receiving the feedback message including the indicator that the decoding procedure was unsuccessful for the CBG and an indication of a lowest failing decoding level for the CBG, where the indication may be of a first decoding level associated with the first codeword if the decoding procedure was unsuccessful for the first set of code blocks or of a second decoding level associated with the second codeword if the decoding procedure was unsuccessful for the second set of code blocks.

Some examples of the method, apparatuses, and non-transitory computer-readable medium described herein may further include operations, features, means, or instructions for receiving, from the UE, an indication of a capability of the UE to support hierarchical acknowledgment feedback, a number of HARQ processes across the set of decoding levels, and a corresponding number of samples buffers of the UE, where transmitting the retransmission of the CBG including the first set of code blocks associated with the first codeword and the second set of code blocks associated with the second codeword using a same redundancy version for both the first set of code blocks and the second set of code blocks may be based on the capability of the UE.

In some examples of the method, apparatuses, and non-transitory computer-readable medium described herein, the first codeword may be associated with a first and lower decoding level and the second codeword may be associated with a second and higher decoding level.

In some examples of the method, apparatuses, and non-transitory computer-readable medium described herein, the base station may be configured to support multi-level coding.

In some examples of the method, apparatuses, and non-transitory computer-readable medium described herein, the first TTI includes a first subframe or a first slot, and the second TTI includes a second subframe or a second slot.

DETAILED DESCRIPTION

Figure 1:
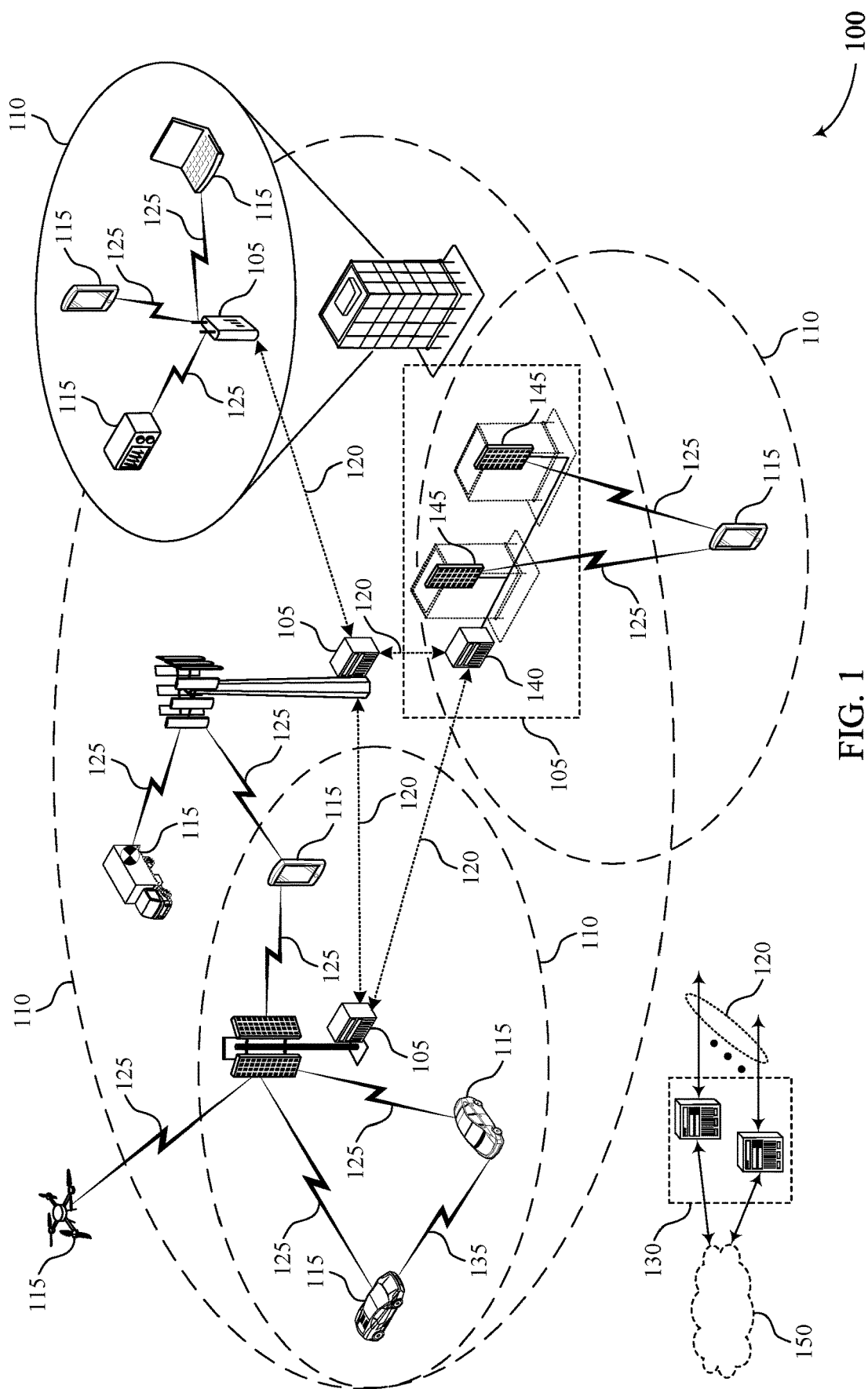
FIGS. 1 and 2 illustrate examples of wireless communications systems that support latency minimization for retransmissions in communications systems with multi-level coding and multi-level sequential demodulation and decoding and code block grouping from different component codes in accordance with aspects of the present disclosure.

Some wireless communications systems may include communication devices, such as user equipment (UEs) and base stations, for example, eNodeBs (eNBs), next-generation NodeBs or giga-NodeBs (either of which may be referred to as a gNB) that may support multiple radio access technologies. In some wireless communications systems, a network node (e.g., a UE, a base station, or another wireless device) may employ encoding of source information (e.g., data packets) to improve the reliability with which a destination node may recover the original source information. Some wireless communications systems may use multi-level coding with multi-level sequential demodulation and decoding to improve spectral efficiency. In some cases of multi-level coding, a receiving device may decode each codeword (and corresponding code blocks) of a decoding level based on code-protected set partitioning information originating from one or more corresponding codewords (and code blocks) associated with lower decoding levels. For example, the successful decoding of one decoding level may be dependent on the successful decoding of a previous decoding level. For instance, if a device, such as a UE, fails to accurately decode a first codeword (or corresponding code blocks) associated with a first (e.g., lower) decoding level (e.g., fails a cyclic redundancy check (CRC)), the UE may likewise fail to decode a second codeword (or corresponding code blocks) associated with a second (e.g., higher) decoding level. In some cases, such a decoding level dependency may lead to error propagation.

In some cases, a code block group (CBG) may include code blocks of codewords associated with different decoding levels. In such cases, the error propagation generated from decoding level dependency may lead to inefficiencies in hybrid automatic repeat request (HARQ) procedures. In some cases, it may be beneficial to introduce a hierarchical HARQ procedure that allows for a gradual retransmission of different decoding levels based on a decoding result of a lowest decoding level (e.g., a lowest decoding level that fails a CRC). For example, a base station, upon receiving a feedback message from a UE including an indication that a CBG failed a decoding procedure at the UE and an indication of the lowest failing decoding level associated with at least one codeword of the CBG that fails to pass CRC, the base station may retransmit the set of code blocks associated with the codeword that is mapped to the lowest failing decoding level and may transmit a new set of code blocks (e.g., new one or more codewords including new data) associated with decoding levels for which decoding was either successful or not attempted, while for levels that were not attempted for decoding the UE may store signal samples to be addressed later once the corresponding lower decoding level is decoded after retransmissions and the code protected partitioning information is available to attempt decoding of the next decoding level based on the stored samples. As such, the base station and the UE may efficiently use resources for communicating new data while the UE re-attempts to decode code blocks associated with the lowest failing decoding level.

In some cases, however, such retransmission of new data prior to achieving a successful CRC for all code blocks of the CBG may result in increased latency. For example, if a first set of code blocks within a CBG associated with a first (and lower) decoding level pass CRC while a second set of code blocks within the CBG associated with a second (and higher) decoding level fail CRC, the base station may transmit new data using a new set of code blocks associated with the first decoding level and may retransmit the second set of code blocks associated with the second decoding level. In some cases, however, the UE may fail to decode the new set of code blocks associated with the first decoding level and, as such, may be unable to successfully decode (or attempt to decode) the second set of code blocks associated with the second decoding level (e.g., because the successful decoding of higher decoding levels may still be dependent on the successful decoding of corresponding lower decoding levels). Accordingly, in such cases in which the UE unsuccessfully decodes the newly transmitted code blocks, the UE may again fail to decode the second set of code blocks associated with the second decoding level (or refrain from attempting to decode the second set of code blocks), which may result in additional buffering of samples and added latency for communications between the base station and the UE. As such, a latency mitigation procedure may be desirable for some data types, such as latency-sensitive data types (e.g., once a hierarchical HARQ procedure has been established, it may be bypassed for latency-sensitive data types).

In some implementations of the present disclosure, the base station may support retransmission of all code blocks of a CBG regardless of which decoding levels the code blocks are associated with and at which decoding level the decoding procedure at the UE failed. For example, the base station may transmit, to the UE, a CBG including a first set of code blocks associated with a first codeword that is mapped to a first (and lower) decoding level and a second set of code blocks associated with a second codeword that is mapped to a second (and higher) decoding level. In some examples, the UE may transmit a feedback message to the base station indicating that the decoding procedure associated with the CBG failed if at least one of the first set of code blocks or the second set of code blocks failed the decoding procedure and, based on implementing the described techniques, the UE may expect a retransmission of all code blocks of the CBG (e.g., both the first set of code blocks and the second set of code blocks) based on transmitting the feedback message.

In such examples in which the base station retransmits both the first set of code blocks and the second set of code blocks, the base station may provide the UE with a greater likelihood for successfully decoding the CBG in a next transmission time interval (TTI) compared to techniques in which the base station only retransmits the code blocks associated with the lowest failing decoding level. For instance, in examples in which the UE successfully decodes the first set of code blocks and unsuccessfully decodes the second set of code blocks, the base station may retransmit the first set of code blocks that were previously successfully decoded and retransmit the second set of code blocks that were previously unsuccessfully decoded. As such, the UE may have a greater likelihood of successfully decoding the second set of code blocks for at least the reason that the UE may have a greater likelihood of attempting to decode the second set of code blocks (e.g., because the UE may refrain from attempting to decode second decoding level code blocks associated with new data codewords at the first decoding level, which may be associated with some likelihood of failing).

Particular aspects of the subject matter described herein may be implemented to realize one or more potential advantages. The described techniques may be implemented to provide for a latency mitigation procedure after establishing a hierarchical HARQ procedure for multi-level sequential demodulation and decoding. For example, based on providing a retransmission of all code blocks associated with a failed CBG, the base station may increase the likelihood of successful decoding of the CBG in a next TTI. Such an increase in the likelihood of successful decoding of the CBG in the next TTI may result in successful communication of the data associated with the CBG in the next TTI, which may enable the base station and the UE to communicate data under stricter latency conditions (e.g., the base station and the UE may be able to satisfy stricter latency constraints or requirements due to maximum latency minimization). Further, in some aspects, the base station and the UE may select, configure, or otherwise determine to implement such latency mitigation techniques based on determining that the type of data to be communicated is a latency-sensitive data type, which, in combination with the use of a hierarchical HARQ procedure, may enable the base station and the UE to achieve a desired balance between spectral efficiency and low-latency.

Aspects of the disclosure are initially described in the context of wireless communications systems. Aspects of the disclosure are additionally described in the context of a coding scheme and processing timelines. Aspects of the disclosure are further illustrated by and described with reference to apparatus diagrams, system diagrams, and flowcharts that relate to latency minimization for retransmissions in communications systems with multi-level coding and multi-level sequential demodulation and decoding and code block grouping from different component codes.

FIG. 1 illustrates an example of a wireless communications system 100 that supports latency minimization for retransmissions in communications systems with multi-level coding and multi-level sequential demodulation and decoding and code block grouping from different component codes in accordance with aspects of the present disclosure. The wireless communications system 100 may include one or more base stations 105, one or more UEs 115, and a core network 130. In some examples, the wireless communications system 100 may be a Long Term Evolution (LTE) network, an LTE-Advanced (LTE-A) network, an LTE-A Pro network, or a New Radio (NR) network. In some examples, the wireless communications system 100 may support enhanced broadband communications, ultra-reliable (e.g., mission critical) communications, low latency communications, communications with low-cost and low-complexity devices, or any combination thereof. Components within a wireless communication system may be coupled (for example, operatively, communicatively, functionally, electronically, and/or electrically) to each other.

The base stations 105 may be dispersed throughout a geographic area to form the wireless communications system 100 and may be devices in different forms or having different capabilities. The base stations 105 and the UEs 115 may wirelessly communicate via one or more communication links 125. Each base station 105 may provide a geographic coverage area 110 over which the UEs 115 and the base station 105 may establish one or more communication links 125. The geographic coverage area 110 may be an example of a geographic area over which a base station 105 and a UE 115 may support the communication of signals according to one or more radio access technologies.

The UEs 115 may be dispersed throughout a geographic coverage area 110 of the wireless communications system 100, and each UE 115 may be stationary, or mobile, or both at different times. The UEs 115 may be devices in different forms or having different capabilities. Some example UEs 115 are illustrated in FIG. 1. The UEs 115 described herein may be able to communicate with various types of devices, such as other UEs 115, the base stations 105, or network equipment (e.g., core network nodes, relay devices, integrated access and backhaul (IAB) nodes, or other network equipment), as shown in FIG. 1.

The base stations 105 may communicate with the core network 130, or with one another, or both. For example, the base stations 105 may interface with the core network 130 through one or more backhaul links 120 (e.g., via an S1, N2, N3, or other interface). The base stations 105 may communicate with one another over the backhaul links 120 (e.g., via an X2, Xn, or other interface) either directly (e.g., directly between base stations 105), or indirectly (e.g., via core network 130), or both. In some examples, the backhaul links 120 may be or include one or more wireless links.

One or more of the base stations 105 described herein may include or may be referred to by a person having ordinary skill in the art as a base transceiver station, a radio base station, an access point, a radio transceiver, a NodeB, an eNodeB (eNB), a next-generation NodeB or a giga-NodeB (either of which may be referred to as a gNB), a Home NodeB, a Home eNodeB, or other suitable terminology.

A UE 115 may include or may be referred to as a mobile device, a wireless device, a remote device, a handheld device, or a subscriber device, or some other suitable terminology, where the "device" may also be referred to as a unit, a station, a terminal, or a client, among other examples. A UE 115 may also include or may be referred to as a personal electronic device such as a cellular phone, a personal digital assistant (PDA), a tablet computer, a laptop computer, or a personal computer. In some examples, a UE 115 may include or be referred to as a wireless local loop (WLL) station, an Internet of Things (IoT) device, an Internet of Everything (IoE) device, or a machine type communications (MTC) device, among other examples, which may be implemented in various objects such as appliances, or vehicles, meters, among other examples. A UE 115 may be a device such as a cellular phone, a smart phone, a personal digital assistant (PDA), a multimedia/entertainment device (e.g., a radio, a MP3 player, or a video device), a camera, a gaming device, a navigation/positioning device (e.g., GNSS (global navigation satellite system) devices based on, for example, GPS (global positioning system), Beidou, GLONASS, or Galileo, or a terrestrial-based device), a tablet computer, a laptop computer, a netbook, a smartbook, a personal computer, a smart device, a wearable device (e.g., a smart watch, smart clothing, smart glasses, virtual reality goggles, a smart wristband, smart jewelry (e.g., a smart ring, a smart bracelet)), a drone, a robot/robotic device, a vehicle, a vehicular device, a meter (e.g., parking meter, electric meter, gas meter, water meter), a monitor, a gas pump, an appliance (e.g., kitchen appliance, washing machine, dryer), a location tag, a medical/healthcare device, an implant, a sensor/actuator, a display, or any other suitable device configured to communicate via a wireless or wired medium.

The UEs 115 described herein may be able to communicate with various types of devices, such as other UEs 115 that may sometimes act as relays as well as the base stations 105 and the network equipment including macro eNBs or gNBs, small cell eNBs or gNBs, or relay base stations, among other examples, as shown in FIG. 1.

The UEs 115 and the base stations 105 may wirelessly communicate with one another via one or more communication links 125 over one or more carriers. The term "carrier" may refer to a set of radio frequency spectrum resources having a defined physical layer structure for supporting the communication links 125. For example, a carrier used for a communication link 125 may include a portion of a radio frequency spectrum band (e.g., a bandwidth part (BWP)) that is operated according to one or more physical layer channels for a given radio access technology (e.g., LTE, LTE-A, LTE-A Pro, NR). Each physical layer channel may carry acquisition signaling (e.g., synchronization signals, system information), control signaling that coordinates operation for the carrier, user data, or other signaling. The wireless communications system 100 may support communication with a UE 115 using carrier aggregation or multi-carrier operation. A UE 115 may be configured with multiple downlink component carriers and one or more uplink component carriers according to a carrier aggregation configuration. Carrier aggregation may be used with both frequency division duplexing (FDD) and time division duplexing (TDD) component carriers.

In some examples (e.g., in a carrier aggregation configuration), a carrier may also have acquisition signaling or control signaling that coordinates operations for other carriers. A carrier may be associated with a frequency channel (e.g., an evolved universal mobile telecommunication system terrestrial radio access (E-UTRA) absolute radio frequency channel number (EARFCN)) and may be positioned according to a channel raster for discovery by the UEs 115. A carrier may be operated in a standalone mode where initial acquisition and connection may be conducted by the UEs 115 via the carrier, or the carrier may be operated in a non-standalone mode where a connection is anchored using a different carrier (e.g., of the same or a different radio access technology).

The communication links 125 shown in the wireless communications system 100 may include uplink transmissions from a UE 115 to a base station 105, or downlink transmissions from a base station 105 to a UE 115. Carriers may carry downlink or uplink communications (e.g., in an FDD mode) or may be configured to carry downlink and uplink communications (e.g., in a TDD mode).

A carrier may be associated with a particular bandwidth of the radio frequency spectrum, and in some examples the carrier bandwidth may be referred to as a "system bandwidth" of the carrier or the wireless communications system 100. For example, the carrier bandwidth may be one of a number of determined bandwidths for carriers of a particular radio access technology (e.g., 1.4, 3, 5, 10, 15, 20, 40, or 80 megahertz (MHz)). Devices of the wireless communications system 100 (e.g., the base stations 105, the UEs 115, or both) may have hardware configurations that support communications over a particular carrier bandwidth or may be configurable to support communications over one of a set of carrier bandwidths. In some examples, the wireless communications system 100 may include base stations 105 or UEs 115 that support simultaneous communications via carriers associated with multiple carrier bandwidths. In some examples, each served UE 115 may be configured for operating over portions (e.g., a sub-band, a BWP) or all of a carrier bandwidth.

Signal waveforms transmitted over a carrier may be made up of multiple subcarriers (e.g., using multi-carrier modulation (MCM) techniques such as orthogonal frequency division multiplexing (OFDM) or discrete Fourier transform spread OFDM (DFT-S-OFDM)). In a system employing MCM techniques, a resource element (RE) may include one symbol period (e.g., a duration of one modulation symbol) and one subcarrier, where the symbol period and subcarrier spacing are inversely related. The number of bits carried by each RE may depend on the modulation scheme (e.g., the order of the modulation scheme, the coding rate of the modulation scheme, or both). Thus, the more REs that a UE 115 receives and the higher the order of the modulation scheme, the higher the data rate may be for the UE 115. A wireless communications resource may refer to a combination of a radio frequency spectrum resource, a time resource, and a spatial resource (e.g., spatial layers or beams), and the use of multiple spatial layers may further increase the data rate or data integrity for communications with a UE 115.

One or more numerologies for a carrier may be supported, where a numerology may include a subcarrier spacing ($\Delta f$) and a cyclic prefix. A carrier may be divided into one or more BWPs having the same or different numerologies. In some examples, a UE 115 may be configured with multiple BWPs. In some examples, a single BWP for a carrier may be active at a given time and communications for the UE 115 may be restricted to one or more active BWPs.

The time intervals for the base stations 105 or the UEs 115 may be expressed in multiples of a basic time unit which may, for example, refer to a sampling period of $T_s=1/(\Delta f_{max} \cdot N_f)$ seconds, where $\Delta f_{max}$ may represent the maximum supported subcarrier spacing, and $N_f$ may represent the maximum supported discrete Fourier transform (DFT) size. Time intervals of a communications resource may be organized according to radio frames each having a specified duration (e.g., 10 milliseconds (ms)). Each radio frame may be identified by a system frame number (SFN) (e.g., ranging from 0 to 1023).

Each frame may include multiple consecutively numbered subframes or slots, and each subframe or slot may have the same duration. In some examples, a frame may be divided (e.g., in the time domain) into subframes, and each subframe may be further divided into a number of slots. Alternatively, each frame may include a variable number of slots, and the number of slots may depend on subcarrier spacing. Each slot may include a number of symbol periods (e.g., depending on the length of the cyclic prefix prepended to each symbol period). In some wireless communications systems 100, a slot may further be divided into multiple mini-slots containing one or more symbols. Excluding the cyclic prefix, each symbol period may contain one or more (e.g., $N_f$) sampling periods. The duration of a symbol period may depend on the subcarrier spacing or frequency band of operation.

A subframe, a slot, a mini-slot, or a symbol may be the smallest scheduling unit (e.g., in the time domain) of the wireless communications system 100 and may be referred to as a TTI. In some examples, the TTI duration (e.g., the number of symbol periods in a TTI) may be variable. Additionally or alternatively, the smallest scheduling unit of the wireless communications system 100 may be dynamically selected (e.g., in bursts of shortened TTIs (sTTIs)).

Physical channels may be multiplexed on a carrier according to various techniques. A physical control channel and a physical data channel may be multiplexed on a downlink carrier, for example, using one or more of time division multiplexing (TDM) techniques, frequency division multiplexing (FDM) techniques, or hybrid TDM-FDM techniques. A control region (e.g., a control resource set (CORESET)) for a physical control channel may be defined by a number of symbol periods and may extend across the system bandwidth or a subset of the system bandwidth of the carrier. One or more control regions (e.g., CORESETs) may be configured for a set of the UEs 115. For example, one or more of the UEs 115 may monitor or search control regions for control information according to one or more search space sets, and each search space set may include one or multiple control channel candidates in one or more aggregation levels arranged in a cascaded manner. An aggregation level for a control channel candidate may refer to a number of control channel resources (e.g., control channel elements (CCEs)) associated with encoded information for a control information format having a given payload size. Search space sets may include common search space sets configured for sending control information to multiple UEs 115 and UE-specific search space sets for sending control information to a specific UE 115.

Each base station 105 may provide communication coverage via one or more cells, for example a macro cell, a small cell, a hot spot, or other types of cells, or any combination thereof. The term "cell" may refer to a logical communication entity used for communication with a base station 105 (e.g., over a carrier) and may be associated with an identifier for distinguishing neighboring cells (e.g., a physical cell identifier (PCID), a virtual cell identifier (VCID), or others). In some examples, a cell may also refer to a geographic coverage area 110 or a portion of a geographic coverage area 110 (e.g., a sector) over which the logical communication entity operates. Such cells may range from smaller areas (e.g., a structure, a subset of structure) to larger areas depending on various factors such as the capabilities of the base station 105. For example, a cell may be or include a building, a subset of a building, or exterior spaces between or overlapping with geographic coverage areas 110, among other examples.

A macro cell generally covers a relatively large geographic area (e.g., several kilometers in radius) and may allow unrestricted access by the UEs 115 with service subscriptions with the network provider supporting the macro cell. A small cell may be associated with a lower-powered base station 105, as compared with a macro cell, and a small cell may operate in the same or different (e.g., licensed, unlicensed) frequency bands as macro cells. Small cells may provide unrestricted access to the UEs 115 with service subscriptions with the network provider or may provide restricted access to the UEs 115 having an association with the small cell (e.g., the UEs 115 in a closed subscriber group (CSG), the UEs 115 associated with users in a home or office). A base station 105 may support one or multiple cells and may also support communications over the one or more cells using one or multiple component carriers.

In some examples, a carrier may support multiple cells, and different cells may be configured according to different protocol types (e.g., MTC, narrowband IoT (NB-IoT), enhanced mobile broadband (eMBB)) that may provide access for different types of devices.

In some examples, a base station 105 may be movable and therefore provide communication coverage for a moving geographic coverage area 110. In some examples, different geographic coverage areas 110 associated with different technologies may overlap, but the different geographic coverage areas 110 may be supported by the same base station 105. In other examples, the overlapping geographic coverage areas 110 associated with different technologies may be supported by different base stations 105. The wireless communications system 100 may include, for example, a heterogeneous network in which different types of the base stations 105 provide coverage for various geographic coverage areas 110 using the same or different radio access technologies.

The wireless communications system 100 may support synchronous or asynchronous operation. For synchronous operation, the base stations 105 may have similar frame timings, and transmissions from different base stations 105 may be approximately aligned in time. For asynchronous operation, the base stations 105 may have different frame timings, and transmissions from different base stations 105 may, in some examples, not be aligned in time. The techniques described herein may be used for either synchronous or asynchronous operations.

Some UEs 115, such as MTC or IoT devices, may be low cost or low complexity devices and may provide for automated communication between machines (e.g., via Machine-to-Machine (M2M) communication). M2M communication or MTC may refer to data communication technologies that allow devices to communicate with one another or a base station 105 without human intervention. In some examples, M2M communication or MTC may include communications from devices that integrate sensors or meters to measure or capture information and relay such information to a central server or application program that makes use of the information or presents the information to humans interacting with the application program. Some UEs 115 may be designed to collect information or enable automated behavior of machines or other devices. Examples of applications for MTC devices include smart metering, inventory monitoring, water level monitoring, equipment monitoring, healthcare monitoring, wildlife monitoring, weather and geological event monitoring, fleet management and tracking, remote security sensing, physical access control, and transaction-based business charging. In an aspect, techniques disclosed herein may be applicable to MTC or IoT UEs. MTC or IoT UEs may include MTC/enhanced MTC (eMTC, also referred to as CAT-M, Cat M1) UEs, NB-IoT (also referred to as CAT NB1) UEs, as well as other types of UEs. eMTC and NB-IoT may refer to future technologies that may evolve from or may be based on these technologies. For example, eMTC may include FeMTC (further eMTC), eFeMTC (enhanced further eMTC), or mMTC (massive MTC), and NB-IoT may include eNB-IoT (enhanced NB-IoT), or FeNB-IoT (further enhanced NB-IoT).

Some UEs 115 may be configured to employ operating modes that reduce power consumption, such as half-duplex communications (e.g., a mode that supports one-way communication via transmission or reception, but not transmission and reception simultaneously). In some examples, half-duplex communications may be performed at a reduced peak rate. Other power conservation techniques for the UEs 115 include entering a power saving deep sleep mode when not engaging in active communications, operating over a limited bandwidth (e.g., according to narrowband communications), or a combination of these techniques. For example, some UEs 115 may be configured for operation using a narrowband protocol type that is associated with a defined portion or range (e.g., set of subcarriers or resource blocks (RBs)) within a carrier, within a guard-band of a carrier, or outside of a carrier.

The wireless communications system 100 may be configured to support ultra-reliable communications or low-latency communications, or various combinations thereof. For example, the wireless communications system 100 may be configured to support ultra-reliable low-latency communications (URLLC) or mission critical communications. The UEs 115 may be designed to support ultra-reliable, low-latency, or critical functions (e.g., mission critical functions). Ultra-reliable communications may include private communication or group communication and may be supported by one or more mission critical services such as mission critical push-to-talk (MCPTT), mission critical video (MCVideo), or mission critical data (MCData). Support for mission critical functions may include prioritization of services, and mission critical services may be used for public safety or general commercial applications. The terms ultra-reliable, low-latency, mission critical, and ultra-reliable low-latency may be used interchangeably herein.

In some examples, a UE 115 may also be able to communicate directly with other UEs 115 over a device-to-device (D2D) communication link 135 (e.g., using a peer-to-peer (P2P) or D2D protocol). One or more UEs 115 utilizing D2D communications may be within the geographic coverage area 110 of a base station 105. Other UEs 115 in such a group may be outside the geographic coverage area 110 of a base station 105 or be otherwise unable to receive transmissions from a base station 105. In some examples, groups of the UEs 115 communicating via D2D communications may utilize a one-to-many (1:M) system in which each UE 115 transmits to every other UE 115 in the group. In some examples, a base station 105 facilitates the scheduling of resources for D2D communications. In other cases, D2D communications are carried out between the UEs 115 without the involvement of a base station 105.

In some systems, the D2D communication link 135 may be an example of a communication channel, such as a sidelink communication channel, between vehicles (e.g., UEs 115). In some examples, vehicles may communicate using vehicle-to-everything (V2X) communications, vehicle-to-vehicle (V2V) communications, or some combination of these. A vehicle may signal information related to traffic conditions, signal scheduling, weather, safety, emergencies, or any other information relevant to a V2X system. In some examples, vehicles in a V2X system may communicate with roadside infrastructure, such as roadside units, or with the network via one or more network nodes (e.g., base stations 105) using vehicle-to-network (V2N) communications, or with both.

The core network 130 may provide user authentication, access authorization, tracking, Internet Protocol (IP) connectivity, and other access, routing, or mobility functions. The core network 130 may be an evolved packet core (EPC) or 5G core (5GC), which may include at least one control plane entity that manages access and mobility (e.g., a mobility management entity (MME), an access and mobility management function (AMF)) and at least one user plane entity that routes packets or interconnects to external networks (e.g., a serving gateway (S-GW), a Packet Data Network (PDN) gateway (P-GW), or a user plane function (UPF)). The control plane entity may manage non-access stratum (NAS) functions such as mobility, authentication, and bearer management for the UEs 115 served by the base stations 105 associated with the core network 130. User IP packets may be transferred through the user plane entity, which may provide IP address allocation as well as other functions. The user plane entity may be connected to the network operators IP services 150. The network operators IP services 150 may include access to the Internet, Intranet(s), an IP Multimedia Subsystem (IMS), or a Packet-Switched Streaming Service.

Some of the network devices, such as a base station 105, may include subcomponents such as an access network entity 140, which may be an example of an access node controller (ANC). Each access network entity 140 may communicate with the UEs 115 through one or more other access network transmission entities 145, which may be referred to as radio heads, smart radio heads, or transmission/reception points (TRPs). Each access network transmission entity 145 may include one or more antenna panels. In some configurations, various functions of each access network entity 140 or base station 105 may be distributed across various network devices (e.g., radio heads and ANCs) or consolidated into a single network device (e.g., a base station 105).

The wireless communications system 100 may operate using one or more frequency bands, sometimes in the range of 300 megahertz (MHz) to 300 gigahertz (GHz). Generally, the region from 300 MHz to 3 GHz is known as the ultra-high frequency (UHF) region or decimeter band because the wavelengths range from approximately one decimeter to one meter in length. The UHF waves may be blocked or redirected by buildings and environmental features, but the waves may penetrate structures sufficiently for a macro cell to provide service to the UEs 115 located indoors. The transmission of UHF waves may be associated with smaller antennas and shorter ranges (e.g., less than 100 kilometers) compared to transmission using the smaller frequencies and longer waves of the high frequency (HF) or very high frequency (VHF) portion of the spectrum below 300 MHz.

The wireless communications system 100 may also operate in a super high frequency (SHF) region using frequency bands from 3 GHz to 30 GHz, also known as the centimeter band, or in an extremely high frequency (EHF) region of the spectrum (e.g., from 30 GHz to 300 GHz), also known as the millimeter band. In some examples, the wireless communications system 100 may support millimeter wave (mmW) communications between the UEs 115 and the base stations 105, and EHF antennas of the respective devices may be smaller and more closely spaced than UHF antennas. In some examples, this may facilitate use of antenna arrays within a device. The propagation of EHF transmissions, however, may be subject to even greater atmospheric attenuation and shorter range than SHF or UHF transmissions. The techniques disclosed herein may be employed across transmissions that use one or more different frequency regions, and designated use of bands across these frequency regions may differ by country or regulating body.

The wireless communications system 100 may utilize both licensed and unlicensed radio frequency spectrum bands. For example, the wireless communications system 100 may employ License Assisted Access (LAA), LTE-Unlicensed (LTE-U) radio access technology, or NR technology in an unlicensed band such as the 5 GHz industrial, scientific, and medical (ISM) band. When operating in unlicensed radio frequency spectrum bands, devices such as the base stations 105 and the UEs 115 may employ carrier sensing for collision detection and avoidance. In some examples, operations in unlicensed bands may be based on a carrier aggregation configuration in conjunction with component carriers operating in a licensed band (e.g., LAA). Operations in unlicensed spectrum may include downlink transmissions, uplink transmissions, P2P transmissions, or D2D transmissions, among other examples.

A base station 105 or a UE 115 may be equipped with multiple antennas, which may be used to employ techniques such as transmit diversity, receive diversity, multiple-input multiple-output (MIMO) communications, or beamforming. The antennas of a base station 105 or a UE 115 may be located within one or more antenna arrays or antenna panels, which may support MIMO operations or transmit or receive beamforming. For example, one or more base station antennas or antenna arrays may be co-located at an antenna assembly, such as an antenna tower. In some examples, antennas or antenna arrays associated with a base station 105 may be located in diverse geographic locations. A base station 105 may have an antenna array with a number of rows and columns of antenna ports that the base station 105 may use to support beamforming of communications with a UE 115. Likewise, a UE 115 may have one or more antenna arrays that may support various MIMO or beamforming operations. Additionally or alternatively, an antenna panel may support radio frequency beamforming for a signal transmitted via an antenna port.

The base stations 105 or the UEs 115 may use MIMO communications to exploit multipath signal propagation and increase the spectral efficiency by transmitting or receiving multiple signals via different spatial layers. Such techniques may be referred to as spatial multiplexing. The multiple signals may, for example, be transmitted by the transmitting device via different antennas or different combinations of antennas. Likewise, the multiple signals may be received by the receiving device via different antennas or different combinations of antennas. Each of the multiple signals may be referred to as a separate spatial stream and may carry bits associated with the same data stream (e.g., the same codeword) or different data streams (e.g., different codewords). Different spatial layers may be associated with different antenna ports used for channel measurement and reporting. MIMO techniques include single-user MIMO (SU-MIMO), where multiple spatial layers are transmitted to the same receiving device, and multiple-user MIMO (MU-MIMO), where multiple spatial layers are transmitted to multiple devices.

Beamforming, which may also be referred to as spatial filtering, directional transmission, or directional reception, is a signal processing technique that may be used at a transmitting device or a receiving device (e.g., a base station 105, a UE 115) to shape or steer an antenna beam (e.g., a transmit beam, a receive beam) along a spatial path between the transmitting device and the receiving device. Beamforming may be achieved by combining the signals communicated via antenna elements of an antenna array such that some signals propagating at particular orientations with respect to an antenna array experience constructive interference while others experience destructive interference. The adjustment of signals communicated via the antenna elements may include a transmitting device or a receiving device applying amplitude offsets, phase offsets, or both to signals carried via the antenna elements associated with the device. The adjustments associated with each of the antenna elements may be defined by a beamforming weight set associated with a particular orientation (e.g., with respect to the antenna array of the transmitting device or receiving device, or with respect to some other orientation).

A base station 105 or a UE 115 may use beam sweeping techniques as part of beam forming operations. For example, a base station 105 may use multiple antennas or antenna arrays (e.g., antenna panels) to conduct beamforming operations for directional communications with a UE 115. Some signals (e.g., synchronization signals, reference signals, beam selection signals, or other control signals) may be transmitted by a base station 105 multiple times in different directions. For example, the base station 105 may transmit a signal according to different beamforming weight sets associated with different directions of transmission. Transmissions in different beam directions may be used to identify (e.g., by a transmitting device, such as a base station 105, or by a receiving device, such as a UE 115) a beam direction for later transmission or reception by the base station 105.

Some signals, such as data signals associated with a particular receiving device, may be transmitted by a base station 105 in a single beam direction (e.g., a direction associated with the receiving device, such as a UE 115). In some examples, the beam direction associated with transmissions along a single beam direction may be determined based on a signal that was transmitted in one or more beam directions. For example, a UE 115 may receive one or more of the signals transmitted by the base station 105 in different directions and may report to the base station 105 an indication of the signal that the UE 115 received with a highest signal quality or an otherwise acceptable signal quality.

In some examples, transmissions by a device (e.g., by a base station 105 or a UE 115) may be performed using multiple beam directions, and the device may use a combination of digital precoding or radio frequency beamforming to generate a combined beam for transmission (e.g., from a base station 105 to a UE 115). The UE 115 may report feedback that indicates precoding weights for one or more beam directions, and the feedback may correspond to a configured number of beams across a system bandwidth or one or more sub-bands. The base station 105 may transmit a reference signal (e.g., a cell-specific reference signal (CRS), a channel state information reference signal (CSI-RS)), which may be precoded or unprecoded. The UE 115 may provide feedback for beam selection, which may be a precoding matrix indicator (PMI) or codebook-based feedback (e.g., a multi-panel type codebook, a linear combination type codebook, a port selection type codebook). Although these techniques are described with reference to signals transmitted in one or more directions by a base station 105, a UE 115 may employ similar techniques for transmitting signals multiple times in different directions (e.g., for identifying a beam direction for subsequent transmission or reception by the UE 115) or for transmitting a signal in a single direction (e.g., for transmitting data to a receiving device).

A receiving device (e.g., a UE 115) may try multiple receive configurations (e.g., directional listening) when receiving various signals from the base station 105, such as synchronization signals, reference signals, beam selection signals, or other control signals. For example, a receiving device may try multiple receive directions by receiving via different antenna subarrays, by processing received signals according to different antenna subarrays, by receiving according to different receive beamforming weight sets (e.g., different directional listening weight sets) applied to signals received at multiple antenna elements of an antenna array, or by processing received signals according to different receive beamforming weight sets applied to signals received at multiple antenna elements of an antenna array, any of which may be referred to as "listening" according to different receive configurations or receive directions. In some examples, a receiving device may use a single receive configuration to receive along a single beam direction (e.g., when receiving a data signal). The single receive configuration may be aligned in a beam direction determined based on listening according to different receive configuration directions (e.g., a beam direction determined to have a highest signal strength, highest signal-to-noise ratio (SNR), or otherwise acceptable signal quality based on listening according to multiple beam directions).

The wireless communications system 100 may be a packet-based network that operates according to a layered protocol stack. In the user plane, communications at the bearer or Packet Data Convergence Protocol (PDCP) layer may be IP-based. A Radio Link Control (RLC) layer may perform packet segmentation and reassembly to communicate over logical channels. A Medium Access Control (MAC) layer may perform priority handling and multiplexing of logical channels into transport channels. The MAC layer may also use error detection techniques, error correction techniques, or both to support retransmissions at the MAC layer to improve link efficiency. In the control plane, the Radio Resource Control (RRC) protocol layer may provide establishment, configuration, and maintenance of an RRC connection between a UE 115 and a base station 105 or a core network 130 supporting radio bearers for user plane data. At the physical layer, transport channels may be mapped to physical channels.

The UEs 115 and the base stations 105 may support retransmissions of data to increase the likelihood that data is received successfully. HARQ feedback is one technique for increasing the likelihood that data is received correctly over a communication link 125. HARQ may include a combination of error detection (e.g., using a CRC), forward error correction (FEC), and retransmission (e.g., automatic repeat request (ARQ)). HARQ may improve throughput at the MAC layer in poor radio conditions (e.g., low signal-to-noise conditions). In some examples, a device may support same-slot HARQ feedback, where the device may provide HARQ feedback in a specific slot for data received in a previous symbol in the slot. In other cases, the device may provide HARQ feedback in a subsequent slot, or according to some other time interval.

In some aspects, a network node (e.g., a UE 115, a base station 105, or another wireless device) may employ encoding of source information (e.g., data packets) to improve the reliability with which a destination node may recover the original source information from a transmitting node. In some cases, the wireless communications system 100 may support the use of multi-level coding with multi-level sequential demodulation and decoding schemes to improve spectral efficiency. In some cases of multi-level coding, a receiving device may decode one or more code blocks of each codeword of a decoding level using code-protected partitioning information conveyed by the corresponding one or more code blocks of one or more codewords associated with the lower decoding levels.

In such cases, the successful decoding of a decoding level may be dependent on a successful decoding of one or more previous (e.g., lower) decoding levels. For example, if a device (e.g., a UE 115) fails to accurately decode one or more code blocks of a codeword associated with a first (e.g., lower) decoding level (e.g., fails a CRC), the UE 115 may likewise fail to decode one or more code blocks of a codeword associated with a second (e.g., higher) decoding level. Such decoding level dependency may lead to error propagation. Further, in cases in which a hierarchical HARQ procedure is implemented to reconcile such error propagation, the hierarchical HARQ procedure may insufficiently satisfy latency conditions (e.g., constraints or requirements) associated with some data types.

In some implementations of the present disclosure, the base station 105 and the UE 115 may support a latency mitigation procedure upon establishing a hierarchical HARQ procedure that may be employed upon determination by the base station 105 that data to be communicated between the base station 105 and the UE 115 is a latency-sensitive data type. For example, the base station 105 may determine that the data has a low-latency requirement or a data type that is otherwise sensitive to latency, such as data associated with a strict latency condition (e.g., a strict latency requirement), and may bypass the hierarchical HARQ procedure. In some examples, the latency mitigation procedure may include the retransmission, by the base station 105, of all code blocks of a CBG upon reception, from the UE 115, of a feedback message indicating that at least one codeword (or corresponding set of code blocks) failed a decoding procedure at the UE 115.

For example, a base station 105 may transmit a CBG to a UE 115, the CBG including a first set of code blocks associated with a first codeword and a second set of code blocks associated with a second codeword. In some aspects, the first codeword and the second codeword may be associated with (e.g., mapped to) different decoding levels of a multi-level sequential demodulation and decoding scheme at the UE 115 and the UE 115 may decode the first set of code blocks and the second set of code blocks accordingly. In some examples, the UE 115 may determine that at least one code block of the first set of code blocks or the second set of code blocks failed a decoding procedure at the UE 115 and the UE 115 may transmit a feedback message to the base station 105 including an indication that the CBG failed. In some aspects, the UE 115 may also include an indication of a lowest failing decoding level (e.g., either a first decoding level associated with the first codeword or a second decoding level associated with the second codeword) in the feedback message.

In response to the feedback message, the base station 105 may transmit a retransmission of the CBG including both the first set of code blocks and the second set of code blocks to the UE 115 (e.g., the base station 105 may retransmit both the first set of code blocks associated with the first codeword and the second set of code blocks associated with the second codeword regardless of which of the first codeword or the second codeword failed the decoding procedure at the UE 115). As such, the base station 105 may provide the UE 115 with a retransmission of both the first set of code blocks and the second set of code blocks that are coupled through the same occupied channel resources until all decoding levels related code blocks successfully pass decoding (e.g., CRC check). In some cases, this may allow to have a guaranteed a priory known partitioning information for the second decoding level related code blocks in the case that the first (e.g., lower) decoding level related code blocks successfully passed CRC after the previous retransmission. In some other cases, this may allow to have multiple retransmissions of the second decoding level related code blocks available for immediate HARQ combining once the first decoding level related code blocks are successfully decoded after some number of retransmissions. This may increase the likelihood of the UE 115 to progress through the multi-level sequential demodulation and decoding scheme with minimum latency related to retransmissions (due to a minimum number of retransmissions per given reception scenario that will be required to pass decoding on all of the decoding levels involved in this CBG and correspondingly related to the addressed TB).

Figure 2:
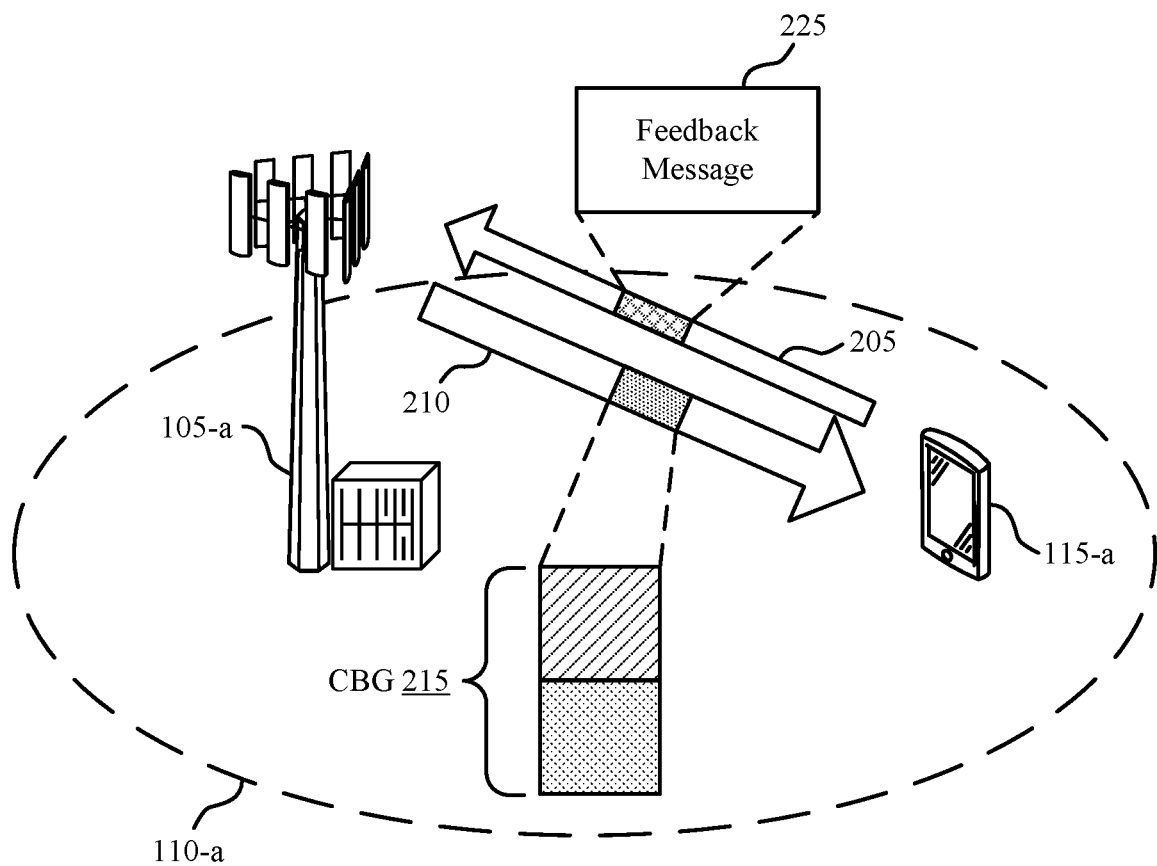
Figure 2:
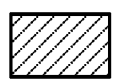
Figure 2:
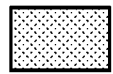

FIG. 2 illustrates an example of a wireless communications system 200 that supports latency minimization for retransmissions in communications systems with multi-level coding and multi-level sequential demodulation and decoding and code block grouping from different component codes in accordance with aspects of the present disclosure. In some examples, the wireless communications system 200 may implement aspects of the wireless communications system 100. The wireless communications system 200 may illustrate communication between a base station 105-a and a UE 115-a, which may be examples of corresponding devices described herein. The base station 105-a may be associated with a cell that provides wireless communications service within a geographic coverage area 110-a. The base station 105-a may transmit information to one or more UEs 115, such as the UE 115-a, on a downlink channel 210, and the UE 115-a may transmit messages to the base station 105-a on an uplink channel 205.

The wireless communications system 200 may support a multi-level coding scheme with multi-level sequential demodulation and decoding, which may improve spectral efficiency as compared to other decoding techniques. At the receiver side, such as at the UE 115-a, multi-level coding with multi-level sequential demodulation and decoding may assume strong dependencies of demodulation and decoding of the higher decoding levels on the previous, lower decoding level result (based on whether the previous, lower decoding level passed or failed). For example, the dependence of higher decoding (or partitioning) levels on the previous decoding (or partitioning) level may be high. As described herein, the multi-level coding scheme may use an Ungerboeck set partitioning to partition a modulation constellation into different constellation subsets while partitioning at different levels is protected by different component codes/decoding levels having different code rates to provide a different code protection for different partitioning levels correspondingly. In some examples, Ungerboeck set partitioning may gradually increase a minimum Euclidian distance between constellation points progressively with partitioning steps (and coding levels correspondingly). For instance, the Ungerboeck set partitioning is intended to gradually increase a minimum Euclidian distance between constellation subsets while moving from a low partitioning level to a high partitioning level. Accordingly, the minimum Euclidian distance, and a corresponding code rate, may increase from a lowest coding level (component code) to a highest coding level. A coding level may be decoded using a component code that corresponds to the code rate aligned with the minimum Euclidian distance for the coding level. In some cases, a coding level may be referred to as a decoding level at a UE 115-a.

As described herein, a UE 115-a may be unable to successfully decode higher decoding level(s) if a previous decoding level fails. In particular, in cases of multi-level coding with Underback set partitioning, decoding of a decoding level may be dependent on a successful decoding of a previous level. For example, if a device fails to accurately decode one or more code blocks of a codeword 220 associated with a first and lower decoding level, the device may likewise fail to decode one or more corresponding code blocks of a codeword 220 associated with a second and higher decoding level. In some cases, failing to accurately decode one or more code blocks of a codeword 220 may include the codeword 220 or corresponding code blocks failing a CRC. In other words, the UE 115-*a* may determine whether one or more code blocks of a codeword 220 are successful based on determining whether the codeword 220 or the code blocks of the codeword 220 pass a CRC. In some cases, such a decoding level dependency may lead to error propagation of multi-level sequential decoding in receivers.

In some examples, for any type of multi-level sequential demodulation and decoding (e.g., for coherent modulation or non-coherent modulation), because of the existing dependencies between different decoding levels, a hierarchical HARQ procedure may be utilized to increase efficiency of a wireless communications system. Additionally, in some implementations of the present disclosure, the base station 105-*a* and the UE 115-*a* may employ a latency mitigation procedure by supporting retransmission for all codewords 220 related to different decoding levels of a CBG 215 at the same time (e.g., in a same TTI) upon determination that at least one (e.g., a set) of code blocks related to a decoding level fail. One or more aspects of the present disclosure provides for such complete retransmission of a CBG 215 (e.g., all code blocks of the CBG 215) to enable retransmissions-related latency minimization between the base station 105-*a* and the UE 115-*a*. For example, by employing the latency mitigation procedures described herein, the base station 105-*a* and the UE 115-*a* may experience a greater likelihood for successful communication in shorter timespans for at least the reason that the UE 115-*a* may have more decoding opportunities for all decoding levels of a CBG by bypassing the hierarchical HARQ procedure for latency-sensitive data.

In some cases of multi-level coding, a CBG 215 may be defined to include one or more code blocks of codewords 220 associated with different decoding levels, such that one or more code blocks of codewords 220 associated with different decoding levels span a same portion of transmitted REs. Because all decoding levels may be affected equally by channel conditions, including one or more code blocks of codewords 220 of different decoding levels in a CBG 215 may be beneficial. For example, common acknowledgment (ACK) signaling for all decoding levels may provide an increased efficiency over using multiple ACK messages for different decoding levels separately. Additionally or alternatively, localizing a CBG 215 on a set of channel resources instead of spreading it out on a wide range of REs may decrease a failing rate and a retransmission rate associated with the CBG 215 (as may be the case if CBGs 215 are associated with one or more codewords 220 of single decoding level). Further, defining multiple decoding levels in a CBG 215 may allow for smaller resource allocations than may be achievable if using a CBG 215 associated with a single decoding level, thus increasing efficiency in the communications system. Accordingly, the base station 105-*a* may transmit a CBG 215 including a set of code blocks of codewords 220 associated with different decoding levels to the UE 115-*a*.

In response to receiving the CBG 215, the UE 115-*a* may attempt to decode code blocks associated with a first (e.g., a lowest) decoding level. For example, the CBG 215 may include a first set of code blocks of a codeword 220-*a* associated with the first decoding level and, upon reception of the CBG 215, the UE 115-*a* may attempt to decode the first set of code blocks of the codeword 220-*a*. If the UE 115-*a* successfully decodes all of the code blocks included in the addressed CBG 215 and associated with the codeword 220-*a* associated with the first decoding level, such that all the corresponding code blocks of the codeword 220-*a* pass a CRC, the UE 115-*a* may attempt to decode the corresponding code blocks of a codeword 220-*b* of the CBG 215 associated with a second (e.g., a higher) decoding level. For example, the CBG 215 may also include a second set of code blocks of the codeword 220-*b* associated with the second decoding level. If the UE 115-*a* successfully decodes all of the code blocks of the codeword 220 included in the CBG 215 (e.g., if the UE 115-*a* successfully decodes the first set of code blocks associated with the codeword 220-*a* and the second set of code blocks associated with the codeword 220-*b*), the UE 115-*a* may transmit a feedback message 225 to the base station 105-*a* including an ACK for the CBG 215.

Alternatively, if the UE 115-*a* fails to decode at least one code block corresponding to the addressed CBG 215 (e.g., at least one of the first set of code blocks associated with the codeword 220-*a* or one of the second set of code blocks associated with the codeword 220-*b*), the UE 115-*a* may transmit a feedback message 225 to the base station 105-*a* including a negative ACK (NACK) for the CBG 215. In some aspects, the UE 115-*a* may also include a lowest failing decoding level indicator in the feedback message 225 that may indicate the lowest decoding level that failed the decoding procedure at the UE 115-*a*. For example, if one or more code blocks from the first set of code blocks associated with the first decoding level fail the decoding procedure at the UE 115-*a*, the lowest failing decoding level indicator may indicate the first decoding level. Alternatively, if the first set of code blocks of the CBG 215 pass the decoding procedure at the UE 115-*a* and one or more code blocks of the second set of code blocks associated with the second decoding level fail the decoding procedure at the UE 115-*a*, the lowest decoding level indicator may indicate the second decoding level. In response to receiving the feedback message 225 including the NACK for the CBG 215, the base station 105-*a* may transmit a retransmission of all code blocks (e.g., or corresponding codewords 220) of the CBG 215.

For example, the base station 105-*a* may retransmit the CBG 215 including both the first set of code blocks associated with the codeword 220-*a* and the second set of code blocks associated with the codeword 220-*b*. In some examples, retransmitting the CBG 215 may include transmitting a second redundancy version of the retransmitted codewords 220 different than a first redundancy version of the previously transmitted codewords 220. For example, the base station 105-*a* may retransmit the first set of code blocks associated with the codeword 220-*a* with a second redundancy version of the codeword 220-*a* and may retransmit the second set of code blocks associated with the codeword 220-*b* with a second redundancy version of the codeword 220-*b*. In some implementations, the base station 105-*a* may transmit a retransmission indicator to the UE 115-*a* that informs the UE 115-*a* that the CBG 215 (e.g., including both the codeword 220-*a* and the codeword 220-*b*, and corresponding sets of code blocks) is being retransmitted. In some aspects, the base station 105-*a* may transmit the retransmission indicator to the UE 115-*a* via control signaling, such as in downlink control information (DCI) (e.g., in a DCI message). In some cases, the base station 105-*a* may refrain from including a new data indicator within the control signaling to the UE 115-*a* based on retransmitting the CBG 215 including all code blocks and corresponding codewords 220. Additional details relating to the retransmission of the CBG 215 including multiple sets of code blocks, where each set of code blocks is associated with a different codeword 220, are described herein, including with reference to FIGS. 4 and 5.

In examples in which the UE 115-a fails to successfully decode the CBG 215 (e.g., both the first set of code blocks and the second set of code blocks or when the first set of code blocks fails decoding and the second set of code blocks is not transmitted for decoding because of a lack of the code protected partitioning information), the UE 115-a may store (e.g., buffer) information relating to the HARQ procedure (e.g., log likelihood ratio buffer for the lowest failing decoding level) or the resources over which the CBG 215 is transmitted (e.g., samples or post-processing samples buffer for the second and not attempted decoding level), or both. In such examples, the ability of the UE 115-a to perform the latency mitigation HARQ procedure may be based on a capability of the UE 115-a. For example, performing a hierarchical HARQ procedure may be based on a capability of the UE 115-a to store frequency domain REs (or the corresponding post-processing samples) associated with code blocks that the UE 115-a deferred decoding of (e.g., did not attempt to decode). Further, in some aspects, the capability of the UE 115-a may include the capability to send an additional flag in control signaling (e.g., in an uplink control information message) to the base station 105-a, indicating a lowest failing decoding level. For example, the UE 115-a may transmit, to the base station, a feedback message including an indicator that a decoding procedure was unsuccessful for the CBG 215 and a second indicator of a lowest decoding level of one or more code blocks for which the decoding procedure was unsuccessful.

In some examples, the UE 115-a may transmit a capability indicator to the base station 105-a indicating the capability of the UE 115-a to perform a HARQ procedure (e.g., a hierarchical HARQ procedure). For example, the UE 115-a may transmit, to the base station 105-a, an indication of the capability of the UE 115-a to support a maximum number of hierarchical HARQ buffers or samples buffers associated with the number of HARQ processes. In some cases, a processing capability may be defined indicating a maximum number of frequency domain samples buffers supported by the UE 115-a. In examples in which a samples buffers limit is reached, the base station 105-a may begin retransmitting the first redundancy version (e.g., a redundancy version 0) of code blocks of codewords 220 corresponding to all the decoding levels above the lowest failing decoding level indicated by the UE 115-a.

In cases in which the UE 115-a does not have enough processing resources to address (e.g., immediately address) all the active hierarchical HARQ IDs and attempt decoding of all the higher decoding levels based on the stored post-processing samples and the reliable partitioning information from the lower decoding levels available after their successful decoding (after one or more retransmissions), the UE 115-a may report a NACK for the CBG 215 that did not finish being processed and transmit an indication that the first decoding level codewords 220 decoded successfully. The UE 115-a may preserve all data stored as part of the hierarchical HARQ procedure and proceed (e.g., immediately) to decode the unprocessed codewords 220 once the UE 115-a has released the processing resources.

As described herein, UEs 115-a may signal that they support the hierarchical HARQ procedure via the corresponding capability information. In some cases, having a capability to support the hierarchical HARQ procedure may impact an ability of the UE 115-a to store frequency domain post-processing samples. Additionally, ACK/NACK transmission related logic including new flag(s) coupled to each NACK in uplink control information may be defined for UEs 115-a supporting the hierarchical HARQ procedure. In some examples, the corresponding UE capability to support some number of hierarchical HARQ processes may impact an ability of the UE 115-a to perform additional (e.g., extra) processing once hierarchical HARQ processes are collapsed. In some examples, a maximum number of hierarchical HARQ processes may be limited through the corresponding capability of the UE 115-a in order to keep a predictable maximum buffering (e.g., of frequency domain samples/REs buffer) constraint or requirement and a peak processing envelope at the UE 115-a.

In some examples, the base station 105-a and the UE 115-a, based on implementing various aspects of the present disclosure, may allow the base station 105-a and the UE 115-a to give a priority in a flexible way to spectral efficiency (use of a hierarchical HARQ approach) and higher data rates or to latency minimization (use of retransmissions of all the decoding levels coupled to the same channel resources are all done together until the last failing decoding level out of all the levels successfully passes decoding), among other benefits.

Figure 3:
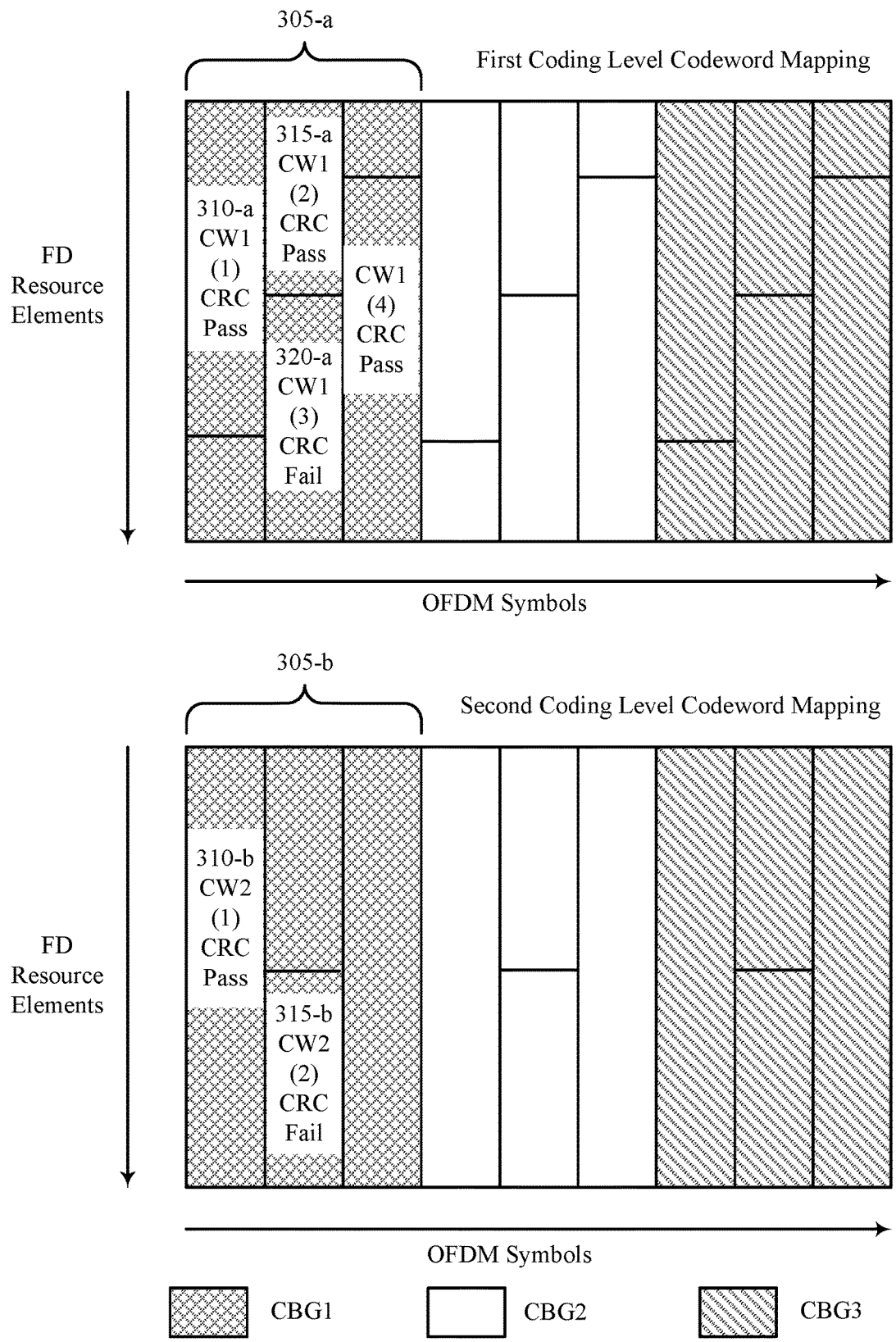
FIG. 3 illustrates an example of a multi-level coding scheme that supports latency minimization for retransmissions in communications systems with multi-level coding and multi-level sequential demodulation and decoding and code block grouping from different component codes in accordance with aspects of the present disclosure.

FIG. 3 illustrates an example of a multi-level coding scheme 300 that supports latency minimization for retransmissions in communications systems with multi-level coding and multi-level sequential demodulation and decoding and code block grouping from different component codes in accordance with aspects of the present disclosure. In some examples, the multi-level coding scheme 300 may be implemented to realize aspects of the wireless communications system 100 or the wireless communications system 200. For example, the multi-level coding scheme 300 may be implemented by a UE 115, a base station 105, or any combination thereof. Further, although shown as including two decoding levels, the multi-level coding scheme 300 may include any number of decoding levels without exceeding the scope of the present disclosure.

As described herein, a CBG may include code blocks of codewords associated with two decoding levels. In some examples, a CBG may include a set of code blocks 305-a associated with a first decoding level and a set of code blocks 305-b associated with a second decoding level. Accordingly, code blocks associated with a first decoding level and code blocks associated with a second decoding level may span a same number of REs. In some aspects, a number of code blocks equal to quantity of a first set of code blocks 305-a associated with the first decoding level plus a quantity of a second set of code blocks 305-b associated with the second decoding level may be coupled together for HARQ procedures. For example, a UE 115 may transmit a feedback message (e.g., an ACK or a NACK) on a per-CBG basis. In other words, the granularity at which a UE 115 may provide HARQ feedback to a base station may be per-CBG. In some cases, code blocks/codewords associated with the first decoding level may be shorter (in length) than code blocks/codewords associated with the second decoding level. In some examples, the difference in code block length may reduce latency when a UE performs multi-level sequential demodulation and decoding.

In some cases, a code block 310-a may be a first code block of a first codeword associated with a first decoding level and a code block 310-b may be a first code block of a second codeword associated with a second decoding level. Similarly, a code block 315-a may be a second code block of the first codeword associated with the first decoding level, and a code block 320-a may be a third code block of the first codeword associated with the first decoding level. In one example, a receiving device (e.g., a UE 115) may fail to decode the code block 320-a during a slot N. If the receiving device fails to decode the code blocks 320-*a*, the receiving device may likewise fail to decode a corresponding code block 315-*b* of the second codeword associated with the second decoding level or the receiving device may not be attempt to decode the code block 315-*b*. Accordingly, the receiving device may report a NACK for the CBG and, in some aspects, may provide an indication of the lowest failing decoding level. In some examples, the indication of the lowest failing decoding level may be set to 1 if at least one code block associated with the first decoding level failed to decode and set to 0 otherwise. In some cases, the indication of the lowest failing decoding level may be a "lowest_code_level_NACK" parameter sent with the feedback message (e.g., the NACK message). In response to receiving a NACK (e.g., and regardless of the value of the "lowest_code_level_NACK" parameter), a transmitting device may retransmit the set of code blocks 305-*a* and the set of code blocks 305-*b* during a slot N+K.

In some cases, the receiving device may decode all the code blocks of the first decoding level that are included in the set of code blocks 305-*a* successfully during slot N+K. If all code blocks of 305-*a* are decoded successfully, the receiving device may attempt to decode the set of code blocks 305-*b* of the second decoding level that are also retransmitted on slot N+K. In some examples, the receiving device may attempt to decode the retransmitted set of code blocks 305-*b* using known partitioning information (e.g., set partitioning information) based on decoding the first decoding level. In some cases, the receiving device may store a portion of samples associated with the set of code blocks 305-*b* from slot N to allow for HARQ combining with the retransmitted set of code blocks 305-*b* on slot N+K. If the receiving device successfully decodes all of the set of code blocks 305-*b*, the receiving device may transmit an ACK message for the CBG to the transmitting device. In some aspects, performing such a latency mitigation procedure upon establishing a hierarchical HARQ procedure may reduce latency (minimize latency of retransmissions) and buffering at the receiving device. Various aspects of such latency minimization procedures are further described with reference to FIGS. 4-6.

Figure 4:
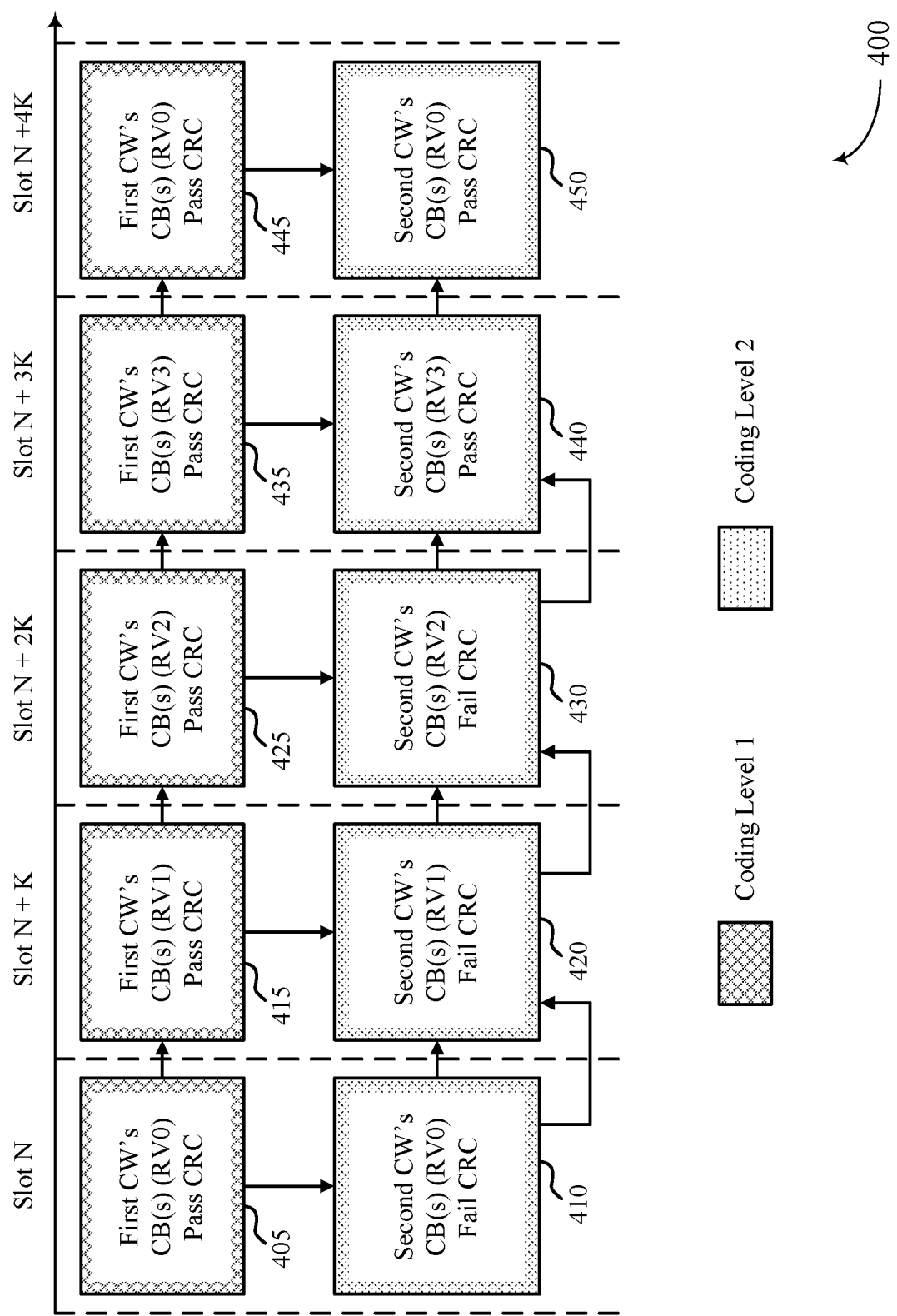
FIGS. 4 and 5 illustrate examples of processing timelines that support latency minimization for retransmissions in communications systems with multi-level coding and multi-level sequential demodulation and decoding and code block grouping from different component codes in accordance with aspects of the present disclosure.

FIG. 4 illustrates an example of a processing timeline 400 that supports latency minimization for retransmissions in communications systems with multi-level coding and multi-level sequential demodulation and decoding and code block grouping from different component codes in accordance with aspects of the present disclosure. In some examples, the processing timeline 400 may be implemented to realize aspects of the wireless communications system 100 or the wireless communications system 200. For example, the processing timeline 400 may be implemented by a UE 115 (e.g., a receiving device), a base station 105 (e.g., a transmitting device), or any combination thereof.

During a slot N, a transmitting device may transmit a codeword 405 associated with a first decoding level (and may likewise be referred to as a first codeword 405) and a codeword 410 associated with a second decoding level (and may likewise be referred to as a second codeword 410). In some cases, transmitting the codeword 405 and the codeword 410 may include transmitting a first set of code blocks associated with the codeword 405 and transmitting a second set of code blocks associated with the codeword 410. In some aspects, the first set of code blocks of the codeword 405 and the second set of code blocks of the codeword 410 may be addressed to the same CBG. A receiving device may attempt to decode the first set of code blocks of the codeword 405 and the second set of code blocks of the codeword 410 sequentially based on implementing a sequential demodulation and decoding procedure. For example, the receiving device may first attempt to decode the first set of code blocks of the codeword 405 associated with the first decoding level and attempt to decode the second set of code blocks of the codeword 410 associated with the second decoding level after successful decoding of the codeword 405.

In some examples, the receiving device may decode the first set of code blocks successfully (e.g., the first set of code blocks corresponding to the first decoding level codeword 405 that are included in the addressed CBG may pass a CRC at the receiving device). Additionally, the receiving device may determine that a decoding procedure for the second set of code blocks associated with the second decoding level codeword 410 (and that are also included in the addressed CBG) is unsuccessful. For example, the decoding procedure for the second set of code blocks may fail at the receiving device. In such examples, the receiving device may transmit a feedback message (e.g., a NACK message) and, in some aspects, an indication that the second decoding level is the lowest failing decoding level. For instance, the receiving device may transmit a feedback message including a first indicator (e.g., a NACK message) that the decoding procedure was unsuccessful for the CBG and a second indicator of a lowest decoding level of one or more code blocks for which the decoding procedure was unsuccessful, the lowest decoding level being one of a set of decoding levels supported by the receiving device.

In some cases, the receiving device may set one or more bits associated with the second indicator of the decoding level, where a value of the one or more bits identifies the lowest decoding level associated with the code blocks for which the decoding procedure was unsuccessful. In some examples, the one or more bits may include one bit that is set to indicate the lowest decoding level of the set of decoding levels supported by the receiving device, where the set of decoding levels include two decoding levels. Alternatively, the one or more bits may include two or more bits that are set to indicate the lowest decoding level of the set of decoding levels supported by the receiving device, where the set of decoding levels include three or more decoding levels. For example, the receiving device may include an extra bit with the NACK reported for the CBG (e.g., the CBG associated with the set of code blocks of the codeword 405 associated with the first decoding level and the second set of code blocks of the codeword 410 associated with the second decoding level). This extra bit may be set to 1 in case that there is any failing code blocks from the first decoding level and 0 otherwise. As described herein, the receiving device may transmit a NACK for the CBG and may set the bit lowest_code_level_NACK to 0. In some instances, the receiving device may store a log likelihood ratio associated with the code blocks of the lowest decoding level (e.g., the second set of code blocks of the codeword 410 associated with the second decoding level) and a HARQ process identifier, and an indication associated with the coding level for which the decoding procedure was unsuccessful.

In some examples, the receiving device may store a decoded payload associated with the first set of code blocks of the codeword 405 based on successfully decoding the first set of code blocks of the codeword 405. In some aspects, the decoded payload may include information usable by the receiving device for re-modulating or re-encoding next redundancy versions of the codeword 405 that define the set partitioning information that the receiving device may use to attempt to decode the corresponding code blocks of the second decoding level. In some cases, the receiving device may store the decoded payload in a buffer at the receiving device.

In some implementations, the transmitting device may determine that the data that is being transmitted is latency-sensitive and, accordingly, may retransmit the first set of code blocks of the codeword 405 and the second set of code blocks of the codeword 410 during slot N+K. In some examples, the transmitting device may additionally transmit a control message (e.g., a downlink control message, such as a DCI message) responsive to the feedback message. In examples in which a hierarchical HARQ procedure is employed and the data is determined to be latency-sensitive (or in examples in which the transmitting otherwise determines to implement a latency minimization scheme), the control message may include a retransmission indicator (e.g., a retransmission flag) and may refrain from including a new data indicator for any of the coding levels or codewords. The retransmission indicator may indicate, to the receiving device, that the transmitting device is retransmitting the first set of code blocks of the codeword 405 associated with the first decoding level and the second set of code blocks of the codeword 410 associated with the second decoding level. In some aspects, the retransmission indicator will indicate that all decoding levels of the CBG are being retransmitted.

In some cases, retransmitting the first set of code blocks of the codeword 405 and the second set of code blocks of the codeword 410 may include transmitting a first redundancy version (RV1) of the codeword 405 and the codeword 410, respectively. For example, the transmitting device may transmit a first redundancy version (RV1) 415 of the codeword 405 and may transmit a first redundancy version (RV1) 420 of the codeword 410 during the slot N+K. In some examples, the receiving device may re-modulate the first redundancy version (RV1) 415 of the first set of code blocks of the codeword 405 during the slot N+K based on the stored decoded payload associated with the first set of code blocks of the codeword 405. In some aspects, the receiving device may determine set partitioning information for demodulation of the second set of code blocks of the codeword 410 (e.g., the retransmitted second set of code blocks of the codeword 410) during the slot N+K based on the stored decoded payload associated with the first set of code blocks of the codeword 405 and re-encoding for obtaining the corresponding redundancy version that defines the set partitioning information.

In some implementations, the receiving device may refrain from decoding the retransmission of the first set of code blocks of the codeword 405 (e.g., the first redundancy version (RV1) 415) during the slot N+K and instead perform data re-modulating and the re-encoding to generate partitioning information for demodulation of the corresponding code blocks of the second decoding level. For example, the receiving device may have already successfully decoded the payload associated with the first set of code blocks of the codeword 405 in slot N and may determine the set partitioning information for decoding the retransmission of the second set of code blocks of the codeword 410 based on the re-modulating and re-encoding and, therefore, may refrain from decoding the retransmission of the first set of code blocks of the codeword 405.

Upon determining the set partitioning information (e.g., based on the re-modulating and re-encoding to determine the first redundancy version (RV1) 415), the receiving device may attempt to decode the first redundancy version (RV1) 420 of the second set of code blocks of the codeword 410 using the stored log likelihood ratio associated with the codeword 410. In some aspects, decoding the first redundancy version (RV1) 420 of the second set of code blocks of the codeword 410 may include decoding the second set of code blocks after HARQ combining of the transmission (e.g., the retransmission) of the second set of code blocks during slot N+K and the transmission (e.g., the initial transmission) of the second set of code blocks during slot N. In some examples, the receiving device may fail to decode the first redundancy version (RV1) 420 of the second set of code blocks of the codeword 410 during the slot N+K and may transmit a NACK for the CBG for slot N+K including the codeword 410. The receiving device may store a log likelihood ratio associated with one or more code blocks after log likelihood ratio combining of the initial redundancy version (RV0) and the first redundancy version (RV1) 420 of the second set of code blocks of the codeword 410 in a corresponding log likelihood ratio buffer.

The transmitting device, based on receiving the NACK, may transmit a second redundancy version (RV2) 425 of the first set of code blocks of the codeword 405 and a second redundancy version (RV2) 430 of the second set of code blocks of the codeword 410 during a slot N+2K. In some examples, the receiving device may perform re-modulating and re-encoding to obtain the second redundancy version (RV2) 425 of the first set of code blocks of the codeword 405 based on successfully decoding the first set of code blocks of the codeword 405 during slot N and based on decoded payload buffering. As such, the receiving device may determine set partitioning information for decoding the second redundancy version (RV2) 430 of the second set of code blocks of the codeword 410 and may refrain from attempting to decode the second redundancy version (RV2) 425 of the first set of code blocks of the codeword 405 during the slot N+2K. In some aspects, the receiving device may attempt to decode the second redundancy version (RV2) 430 of the second set of code blocks of the codeword 410 after performing HARQ combining with previously received redundancy versions of the second set of code blocks of the codeword 410. In some examples, the receiving device may fail to decode the second redundancy version (RV2) 430 of the second set of code blocks of the codeword 410 during the slot N+2K. Accordingly, the receiving device may transmit a NACK for the CBG for slot N+2K and may store a log likelihood ratio associated with one or more code blocks of the second set of code blocks of the codeword 410 that failed decoding during the slot N+2K.

The transmitting device may retransmit a third redundancy version (RV3) 435 of the first set of code blocks of the codeword 405 and a third redundancy version (RV3) 440 of the second set of code blocks of the codeword 410 during the slot N+3K based on receiving the NACK. In some examples, the receiving device may perform re-modulating and re-encoding to obtain the third redundancy version (RV3) 435 of the first set of code blocks of the codeword 405 based on successfully decoding the first set of code blocks of the codeword 405 during slot N. As such, the receiving device may determine set partitioning information for decoding the third redundancy version (RV3) 440 of the second set of code blocks of the codeword 410 and may refrain from attempting to decode the third redundancy version (RV3) 435 of the first set of code blocks of the codeword 405 during the slot N+3K. In some aspects, the receiving device may attempt to decode the third redundancy version (RV3) 440 of the second set of code blocks of the codeword 410 after performing HARQ combining with previously received redundancy versions of the second set of code blocks of the codeword 410. In some examples, the receiving device may successfully decode the third redundancy version (RV3) 440 of the second set of code blocks of the codeword 410 during the slot N+3K and may transmit a feedback message (e.g., an ACK message) for the transmission received during slot N, slot N+K, slot N+2K, and slot N+3K. Additionally, the receiving device may release a log likelihood buffer upon successful decoding of the second set of code blocks of the codeword 410.

In response to receiving the feedback message (e.g., the ACK) and during a slot N+4K, the transmitting device may transmit an initial redundancy version (RV0) of a new first set of code blocks of a new codeword 445 associated with the first decoding level (which may likewise be referred to as a first codeword 445) and an initial redundancy version (RV0) of a new second set of code blocks of a new codeword 450 associated with the second decoding level (which may likewise be referred to as a second codeword 450). In some aspects, the new first set of code blocks of the new codeword 445 and the new second set of code blocks of the new codeword 450 may be included within (e.g., addressed to) the same CBG (e.g., a mixed codeword CBG). The receiving device may attempt to decode the new first set of code blocks of the new codeword 445 and the new second set of code blocks of the new codeword 450 according to the techniques described herein. In some aspects, and as illustrated in the processing timeline 400, the receiving device may successfully decode both the new first set of code blocks of the new codeword 445 and the new second set of code blocks of the new codeword 450 during the slot N+4K and, accordingly, may transmit a feedback message (e.g., an ACK message) to the transmitting device for the CBG for the slot N+4K.

Figure 5:
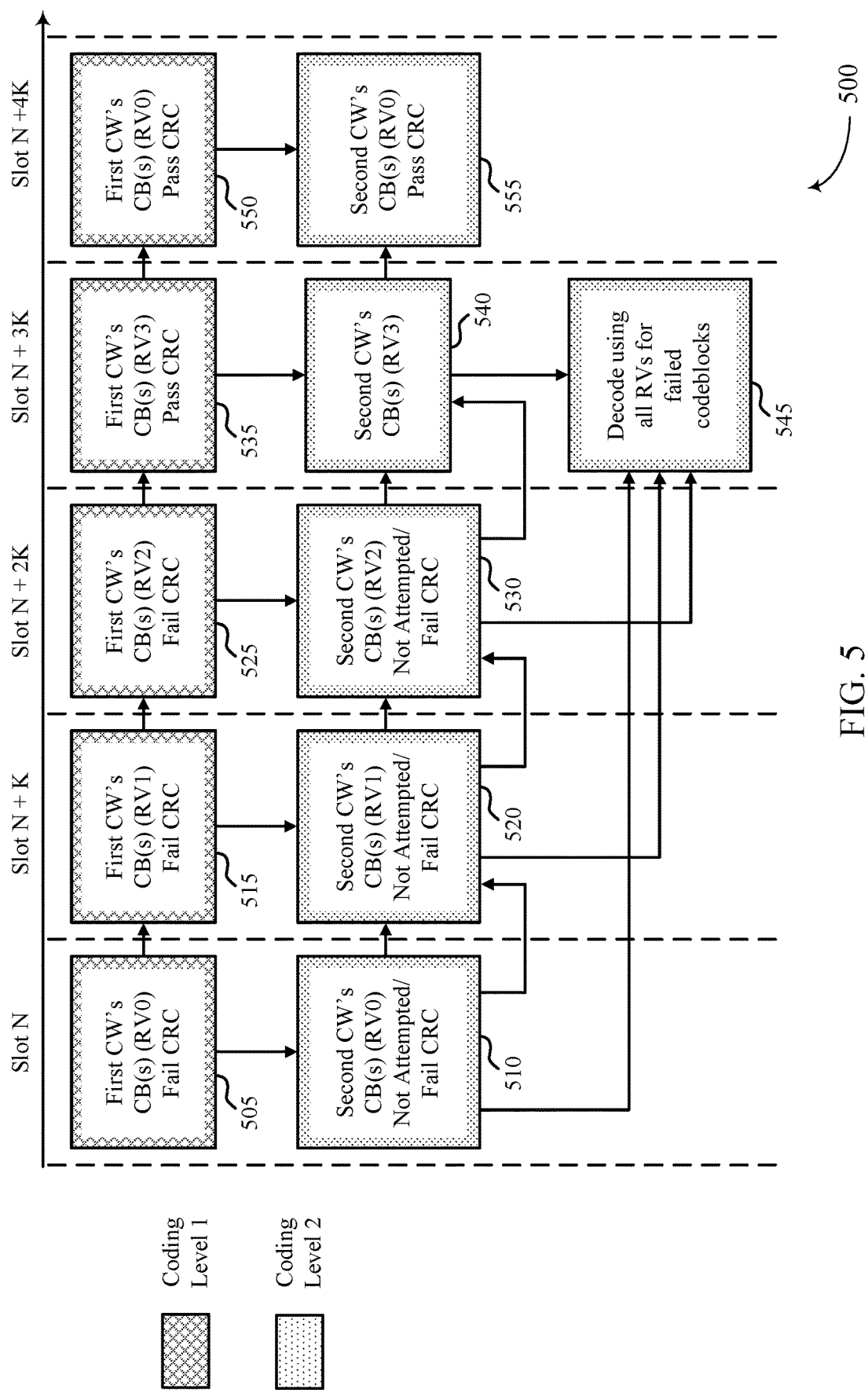

FIG. 5 illustrates an example of a processing timeline 500 that supports latency minimization for retransmissions in communications systems with multi-level coding and multi-level sequential demodulation and decoding and code block grouping from different component codes in accordance with aspects of the present disclosure. In some examples, the processing timeline 500 may be implemented to realize aspects of the wireless communications system 100 or the wireless communications system 200. For example, the processing timeline 500 may be implemented by a UE 115 (e.g., a receiving device), a base station 105 (e.g., a transmitting device), or any combination thereof.

During a slot N, a transmitting device may transmit a codeword 505 associated with a first decoding level (and may likewise be referred to as a first codeword 505) and a codeword 510 associated with a second decoding level (and may likewise be referred to as a second codeword 510). In some cases, transmitting the codeword 505 and the codeword 510 may include transmitting a first set of code blocks associated with the codeword 505 and transmitting a second set of code blocks associated with the codeword 510. In some aspects, the first set of code blocks of the codeword 505 and the second set of code blocks of the codeword 510 may be addressed to the same CBG. A receiving device may attempt to decode the first set of code blocks of the codeword 505 and the second set of code blocks of the codeword 510 sequentially based on implementing a sequential demodulation and decoding procedure. For example, the receiving device may first attempt to decode the first set of code blocks of the codeword 505 associated with the first decoding level and attempt to decode the second set of code blocks of the codeword 510 associated with the second decoding level after successful decoding of the codeword 505. In some examples, the receiving device may not attempt to decode the second set of code blocks of the codeword 510 if the receiving device fails to successfully decode the first set of code blocks of the codeword 505.

For example, the receiving device may fail to successfully decode the first set of code blocks of the codeword 505 during a slot N and, accordingly, may not attempt to decode the second set of code blocks of the codeword 510 during the slot N. In such examples, the receiving device may transmit a feedback message (e.g., a NACK message) to the transmitting device indicating that the decoding procedure for the CBG was unsuccessful at the receiving device during the slot N. In some aspects, the receiving device may also include an indication of the lowest failing decoding level (e.g., the first decoding level) in the feedback message. For example, the receiving device may include a first indicator indicating that the decoding procedure was unsuccessful (e.g., the first indicator may be a NACK) and a second indicator indicating that the first decoding level associated with the first set of code blocks of the codeword 505 was the lowest decoding level that was unsuccessfully decoded at the receiving device. Accordingly, the receiving device may transmit a NACK message for the slot N and set the bit lowest_code_level_NACK to 1 indicating that the lowest decoding level to fail is the first decoding level.

In such examples, the receiving device may store a log likelihood ratio associated with one or more code blocks of the first set of code blocks of the codeword 505 and store post-processing samples corresponding to the resources occupied by the second set of code blocks of the codeword 510. For example, the receiving device may store a set of post-processing samples corresponding to REs spanned by the second set of code blocks of the codeword 510. In some aspects, the receiving device may store the post-processing samples at a corresponding buffer at the receiving device.

The transmitting device, based on receiving the feedback message and determining that the data is latency sensitive, may transmit a first redundancy version (RV1) 515 of the first set of code blocks of the codeword 505 and a first redundancy version (RV1) 520 of the second set of code blocks of the codeword 510 during a slot N+K. In some examples, the transmitting device may additionally transmit a control message (e.g., a downlink control message, such as a DCI message) responsive to the feedback message. In examples in which a hierarchical HARQ procedure is employed and the data is determined to be latency sensitive (or in examples in which the transmitting otherwise determines to implement a latency mitigation scheme), the control message may include a retransmission indicator (e.g., a retransmission flag) and may refrain from including a new data indicator for any of the codewords associated with any of the decoding levels. The retransmission indicator may indicate, to the receiving device, that the transmitting device is retransmitting the first set of code blocks of the codeword 505 associated with the first decoding level and the second set of code blocks of the codeword 510 associated with the second decoding level. In some aspects, the retransmission indicator will indicate that all decoding levels of the CBG are being retransmitted.

The receiving device may attempt to decode the first set of code blocks of the codeword 505 using HARQ combining with the first redundancy version (RV1) 515 of the first set of code blocks of the codeword 505. If the receiving device still fails to decode the first set of code blocks of the codeword 505, the receiving device may again refrain from attempting to decode the first redundancy version (RV1) of the second set of code blocks of the codeword 510. Additionally or alternatively, the receiving device may store a log likelihood ratio associated with one or more failing code blocks of the first set of code blocks of the codeword 505 and store post-processing samples corresponding to the resources spanned by the second set of code blocks of the codeword 510 in the slot N+K. The receiving device may transmit a feedback message (e.g., a NACK message) for the addressed CBG for the slot N+K and, in some aspects, an indication that the lowest decoding level to fail for this CBG is the first decoding level.

The transmitting device, based on receiving the feedback message, may transmit a second redundancy version (RV2) 525 of the first set of code blocks of the codeword 505 and a second redundancy version (RV2) 530 of the second set of code blocks of the codeword 510 during a slot N+2K. The receiving device may re-attempt to decode the first set of code blocks of the codeword 505 using HARQ combining with the initial transmission and the first redundancy version (RV1) 515 of the first set of code blocks of the codeword 505. In some examples, the receiving device may still fail to successfully decode the first set of code blocks of the codeword 505 and may transmit a feedback message (e.g., a NACK message) for the slot N+2K indicating that the decoding procedure for the CBG failed at the receiving device. Additionally, in some implementations, the receiving device may again include an indication of the lowest failing decoding level of the CBG (e.g., the first decoding level) within the feedback message and receive a control message from the transmitting device including a retransmission flag for all decoding levels of the CBG. In some aspects, the receiving device may store a log likelihood ratio associated with one or more failing code blocks of the first set of code blocks of the codeword 505 and store post-processing samples corresponding to the resources spanned by the second set of code blocks of the codeword 510 in the slot N+2K.

The transmitting device, based on receiving the feedback message, may transmit a third redundancy version (RV3) 535 of the first set of code blocks of the codeword 505 and a third redundancy version (RV3) 540 of the second set of code blocks of the codeword 510 during a slot N+3K. The receiving device may re-attempt to decode the first set of code blocks of the codeword 505 using HARQ combining (e.g., the log likelihood ratio or HARQ buffer may include cumulative log likelihood ratio combining result and, as such, include all of the previous redundancy versions) with the initial redundancy version (RV0), the first redundancy version (RV1) 515, the second redundancy version (RV2) 525, and the third redundancy version (RV3) 535 of the first set of code blocks of the codeword 505. In some examples, the receiving device may successfully decode the first set of code blocks of the codeword 505 and may attempt to decode the second set of code blocks of the codeword 510. In some examples, the receiving device may regenerate all redundancy versions 545 of the codeword 505, including the first redundancy version (RV1) 515, the second redundancy version (RV2) 525, and the third redundancy version (RV3) 535. As such, the receiving device may determine the code-protected set partitioning information for the second decoding level demodulation and decoding on slots N, N+K, N+2K, and N+3K.

The receiving device may attempt to decode the second set of code blocks of the second codeword 510 using all the redundancy versions 545 of the second set of code blocks of the codeword 505 based on the set partitioning information and based on a decumulation of the second set of code blocks using the known set partitioning data using the stored post-processing samples. Such decumulation may allow the receiving device to get to log likelihood ratios corresponding to each redundancy version (of the second level code blocks), and HARQ combining can be performed for all of the obtained log likelihood ratios. For example, the receiving device may attempt to decode the second set of code blocks of the codeword 510 using HARQ combining with the initial redundancy version (RV0), the first redundancy version (RV1) 520, the second redundancy version (RV2) 530, and the third redundancy version (RV3) 540 of the second set of code blocks of the codeword 510, which may be stored in a log likelihood ratio buffer at the receiving device. In some examples, such HARQ combining of the retransmissions of the second set of code blocks may include determining a log likelihood ratio (or a set of log likelihood ratios) of the initial transmission (or of a previous transmission) of the second set of code blocks based on the determined set partitioning information and combining the determined log likelihood ratio (or the set of log likelihood ratios) of the initial transmission (or of the previous transmission) with a corresponding log likelihood ratio (or a corresponding set of log likelihood ratios) of the other redundancy versions of the second set of code blocks.

In some aspects, the receiving device may support a number of samples buffers based on a capability of the receiving device. For example, the receiving device may support an upper limit of samples buffers, which may define a corresponding upper limit of a number of hierarchical HARQ processes (or equivalently latency minimization oriented HARQ processes as suggested in the present disclosure) the receiving device may support in parallel. In other words, the number of samples buffers that the receiving device is capable of may define the overall number of retransmissions across all CBGs in parallel that can be handled by the receiving device.

In some examples, the receiving device may successfully decode the second set of code blocks of the codeword 510 based on using all redundancy versions 545 of the first set of code blocks of the codeword 505 to determine the set partitioning information. Accordingly, the receiving device may transmit a feedback message (e.g., an ACK message) to the transmitting device for the CBG indicating that the CBG was successfully received during slot N, slot N+K, slot N+2K, and slot N+3K. Additionally, the receiving device may release a log likelihood buffer upon successful decoding of the first set of code blocks of the codeword 505 and may discard the stored post-processing samples (release the corresponding samples buffers) associated with the second set of code blocks of the codeword 510 from the samples buffers at the receiving device.

In response to receiving the feedback message (e.g., the ACK) and during a slot N+4K, the receiving device may transmit an initial redundancy version (RV0) of a new first set of code blocks of a new codeword 550 associated with the first decoding level (which may likewise be referred to as a first codeword 550) and an initial redundancy version (RV0) of a new second set of code blocks of a new codeword 555 associated with the second decoding level (which may likewise be referred to as a second codeword 555). In some aspects, the new first set of code blocks of the codeword 550 and the new second set of code blocks of the codeword 555 may be included within (e.g., addressed to) the same CBG (e.g., a mixed codeword CBG). The receiving device may attempt to decode the new first set of code blocks of the new codeword 550 and the new second set of code blocks of the new codeword 555 according to the techniques described herein. In some aspects, and as illustrated in the processing timeline 500, the receiving device may successfully decode both the new first set of code blocks of the new codeword 550 and the new second set of code blocks of the new codeword 555 during the slot N+4K and, accordingly, may transmit a feedback message (e.g., an ACK message) to the transmitting device for the CBG for the slot N+4K.

Figure 6:
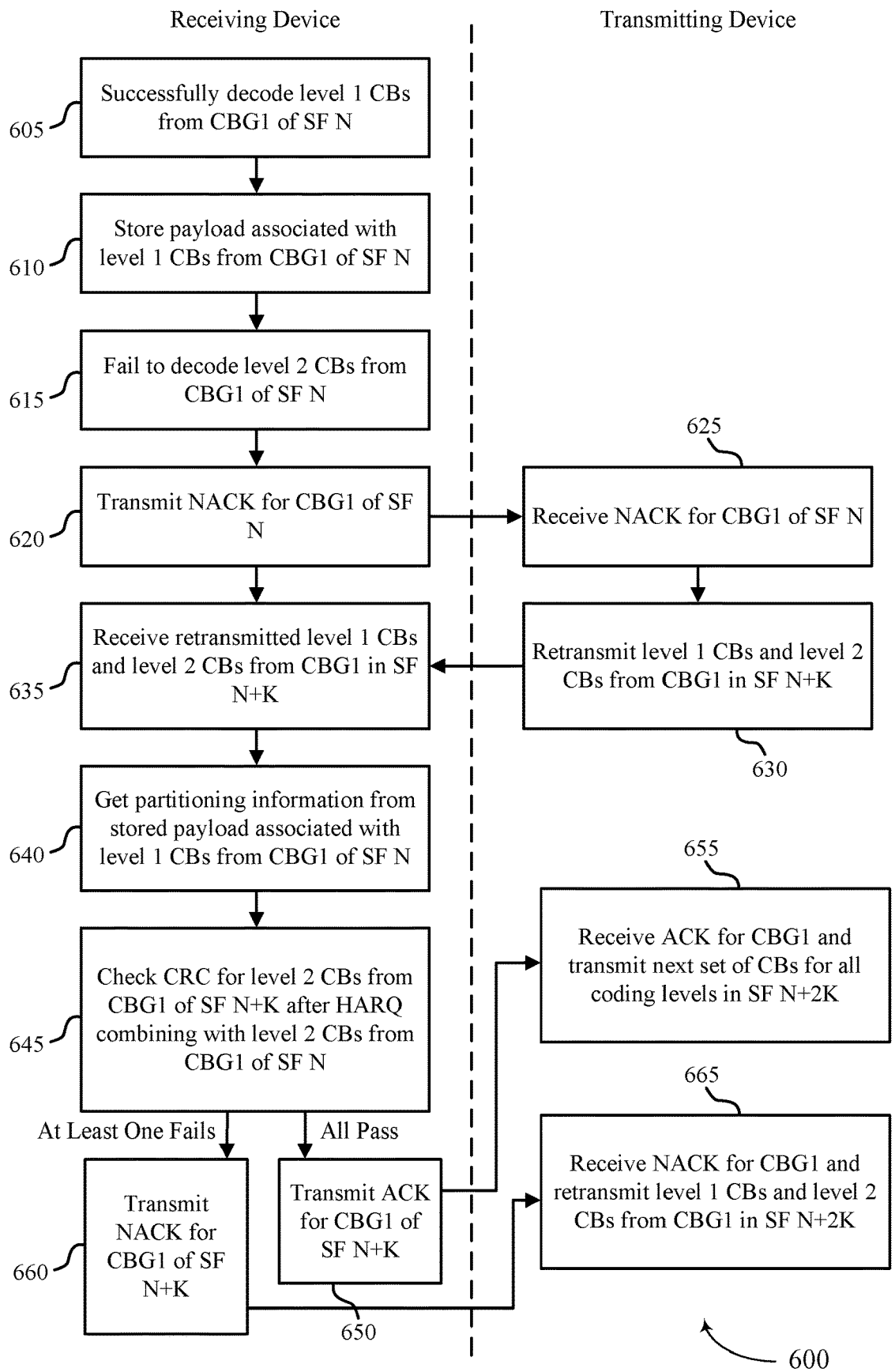
FIG. 6 illustrates an example of a process flow that supports latency minimization for retransmissions in communications systems with multi-level coding and multi-level sequential demodulation and decoding and code block grouping from different component codes in accordance with aspects of the present disclosure.

FIG. 6 illustrates an example of a process flow 600 that supports latency minimization for retransmissions in communications systems with multi-level coding and multi-level sequential demodulation and decoding and code block grouping from different component codes in accordance with aspects of the present disclosure. In some examples, the process flow 600 may implement aspects of the wireless communications system 100 or the wireless communications system 200. For example, the process flow 600 may be implemented by a UE 115 (e.g., a receiving device), a base station 105 (e.g., a transmitting device), or any combination thereof. In some cases, a receiving device and a transmitting device may perform the process flow 600 in examples in which one or more code blocks of a first (and relatively lower) decoding level are successfully decoded and one or more code blocks of a second (and relatively higher) decoding level are unsuccessfully decoded. Further, although described in the context of a first decoding level and a second decoding level, the described techniques may be applied to any number of decoding levels (e.g., more than two) without exceeding the scope of the present disclosure.

For example, a transmitting device may initially transmit a CBG (e.g., a CBG1) including a first set of code blocks associated with a first codeword and a second set of code blocks associated with a second codeword, where each of the first codeword and the second codeword may be associated with different decoding levels in a sequential demodulation and decoding procedure at the receiving device. In some aspects, the first codeword may be associated with the first (and relatively lower) decoding level and the second codeword may be associated with the second (and relatively higher) decoding level. At 605, the receiving device may successfully decode the first set of code blocks of the first codeword (e.g., level 1 code blocks) during a subframe N (e.g., SF N). In some examples, the first set of code blocks of the first codeword may be provided to the receiving device by the transmitting device with an initial redundancy version (RV0) or the first set of code blocks of the first codeword may be provided to the receiving device by the transmitting device as a retransmission with a non-initial redundancy version (e.g., an RV1, an RV2, or an RV3). In examples in which the first set of code blocks are provided to the receiving device from the transmitting device as a retransmission, the receiving device may decode the first set of code blocks using HARQ combining with previous redundancy versions of the first codeword.

At 610, the receiving device may store a payload associated with the first set of code blocks from the CBG of subframe N based on successfully decoding the first set of code blocks during subframe N. At 615, the receiving device may fail to successfully decode the second set of code blocks of the second codeword of the subframe N associated with the second decoding level (e.g., level 2 code blocks). In some aspects, the receiving device may store a log likelihood ratio associated with the one or more failing code blocks of the second set of code blocks in a buffer at the receiving device based on the unsuccessful decoding.

At 620, the receiving device may transmit a feedback message (e.g., a NACK) for the CBG of subframe N to the transmitting device. In some aspects, the feedback message may also include an indication of the lowest failing decoding level (e.g., the second decoding level). At 625, the transmitting device may likewise receive the feedback message (e.g., the NACK) for the CBG of subframe N. In some implementations, the transmitting device may also receive the indication of the lowest failing decoding level, but may determine to retransmit the entire CBG (e.g., all decoding levels of the CBG, including the first set of code blocks associated with the first codeword and the second set of code blocks associated with the second codeword). Accordingly, at 630, the transmitting device may retransmit the CBG including the first set of code blocks associated with the first codeword and the second set of code blocks associated with the second codeword. The transmitting device may retransmit the CBG in a subframe N+K.

Likewise, at 635, the receiving device may receive the retransmission of the CBG including the first set of code blocks associated with the first codeword and the second set of code blocks associated with the second codeword in subframe N+K. At 640, the receiving device may get, take, or otherwise obtain the set partitioning information from the stored payload associated with the first set of code blocks associated with the first codeword of subframe N. The receiving device may use the set partitioning information in decoding the second set of code blocks associated with the second codeword. For example, based on the payload buffer for code blocks of the first decoding level, the receiving device may re-generate all of the further redundancy versions on the first level code blocks and directly take or otherwise identify the redundancy versions from the payload buffer. The receiving device, upon checking the decoded payload for set partitioning information, may re-attempt to decode the second set of code blocks associated with the second codeword using the set partitioning information after HARQ combing with the first transmission of the second set of code blocks during subframe N. Accordingly, at 645, the receiving device may check CRC for the second set of code blocks from the CBG of subframe N+K after HARQ combining with the second set of code blocks received during subframe N.

At 660, the receiving device may determine that at least one code block of the second set of code blocks associated with the second codeword fails the CRC at 645. In such examples, the receiving device may transmit a feedback message (e.g., a NACK) for the CBG of subframe N+K to the transmitting device. Likewise, at 665, the transmitting device may receive the feedback message (e.g., the NACK) from the receiving device and, upon determining that the data to be transmitted to the receiving device is latency-sensitive, may retransmit the first set of code blocks (e.g., all level 1 code blocks) and the second set of code blocks (e.g., all level 2 code blocks) addressed to the CBG in a subframe N+2K.

Alternatively, at 650, the receiving device may determine that all code blocks of the second set of code blocks associated with the second codeword pass the CRC at 645. In such examples, the receiving device may transmit a feedback message (e.g., an ACK) for the CBG of subframe N+K (and of subframe N) to the transmitting device. Likewise, at 655, the transmitting device may receive the feedback message (e.g., the ACK) from the receiving device and may transmit a next set of code blocks for all decoding levels in the subframe N+2K. For example, the transmitting device may transmit new data using a new first set of code blocks associated with a new first codeword associated with the first decoding level and using a new second set of code blocks associated with a new second codeword associated with the second decoding level.

Figure 7:
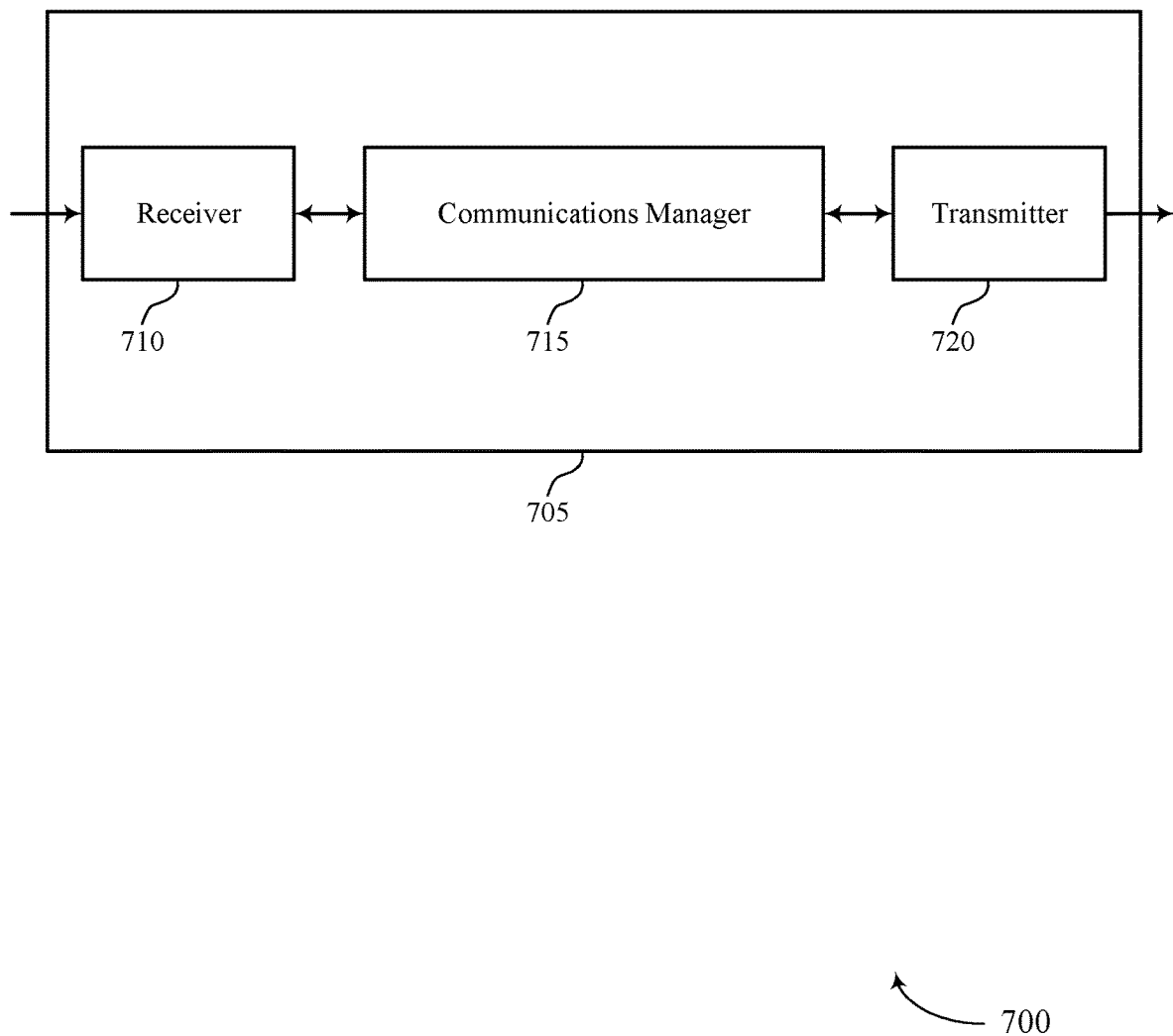
FIGS. 7 and 8 show block diagrams of devices that support latency minimization for retransmissions in communications systems with multi-level coding and multi-level sequential demodulation and decoding and code block grouping from different component codes in accordance with aspects of the present disclosure.

FIG. 7 shows a block diagram 700 of a device 705 that supports latency minimization for retransmissions in communications systems with multi-level coding and multi-level sequential demodulation and decoding and code block grouping from different component codes in accordance with aspects of the present disclosure. The device 705 may be an example of aspects of a UE 115 as described herein. The device 705 may include a receiver 710, a communications manager 715, and a transmitter 720. The device 705 may also include at least one processor. Each of these components may be in communication with one another (e.g., via one or more buses).

The receiver 710 may receive information such as packets, user data, or control information associated with various information channels (e.g., control channels, data channels, and information related to latency minimization for retransmissions in communications systems with multi-level coding and multi-level sequential demodulation and decoding and code block grouping from different component codes). Information may be passed on to other components of the device 705. The receiver 710 may be an example of aspects of the transceiver 1020 described with reference to FIG. 10. The receiver 710 may utilize a single antenna or a set of antennas.

The communications manager 715 may receive, from a base station in a first TTI, a CBG including a set of code blocks associated with a set of codewords, each codeword of the set of codewords associated with one of a set of decoding levels of a decoding procedure for the CBG, receive, from the base station in a second TTI and based on the transmitted feedback message, a retransmission of the CBG including both the first set of code blocks and the second set of code blocks, determine that the decoding procedure associated with at least one of a first set of code blocks of the set of code blocks or a second set of code blocks of the set of code blocks is unsuccessful, where the first set of code blocks are associated with a first codeword, and the second set of code blocks are associated with a second codeword, and transmit, to the base station, a feedback message including an indicator that the decoding procedure was unsuccessful for the CBG based on the determining that the decoding procedure associated with at least one of the first set of code blocks or the second set of code blocks is unsuccessful. The communications manager 715 may be an example of aspects of the communications manager 1010 described herein.

The communications manager 715, or its sub-components, may be implemented in hardware, software (e.g., executed by at least one processor), or any combination thereof. If implemented in code executed by at least one processor, the functions of the communications manager 715, or its sub-components may be executed by a general-purpose processor, a digital signal processor (DSP), an application-specific integrated circuit (ASIC), a field-programmable gate array (FPGA) or other programmable logic device, discrete gate or transistor logic, discrete hardware components, or any combination thereof designed to perform the functions described in the present disclosure.

The communications manager 715, or its sub-components, may be physically located at various positions, including being distributed such that portions of functions are implemented at different physical locations by one or more physical components. In some examples, the communications manager 715, or its sub-components, may be a separate and distinct component in accordance with various aspects of the present disclosure. In some examples, the communications manager 715, or its sub-components, may be combined with one or more other hardware components, including but not limited to an input/output (I/O) component, a transceiver, a network server, another computing device, one or more other components described in the present disclosure, or a combination thereof in accordance with various aspects of the present disclosure.

The transmitter 720 may transmit signals generated by other components of the device 705. In some examples, the transmitter 720 may be collocated with a receiver 710 in a transceiver module. For example, the transmitter 720 may be an example of aspects of the transceiver 1020 described with reference to FIG. 10. The transmitter 720 may utilize a single antenna or a set of antennas.

In some examples, the communications manager 715 may be implemented as an integrated circuit or chipset for a mobile device modem, and the receiver 710 and the transmitter 720 may be implemented as analog components (e.g., amplifiers, filters, antennas) coupled with the mobile device modem to enable wireless transmission and reception over one or more bands.

The communications manager 715 as described herein may be implemented to realize one or more potential advantages. In some implementations, the communications manager 715 may sequentially attempt to codewords addressed to a single CBG associated with multiple decoding levels, which may improve spectral efficiency. Further, based on implementing the described techniques, the communications manager 715 may decode data (e.g., source information) under stricter latency conditions, which may increase the likelihood of successful communication for URLLC, such as mission critical data. Further, based on implementing the described techniques to reduce latency, the communications manager may spend longer durations in or more frequency enter a sleep mode, which may improve power savings and increase battery life of the device 705.

Figure 8:
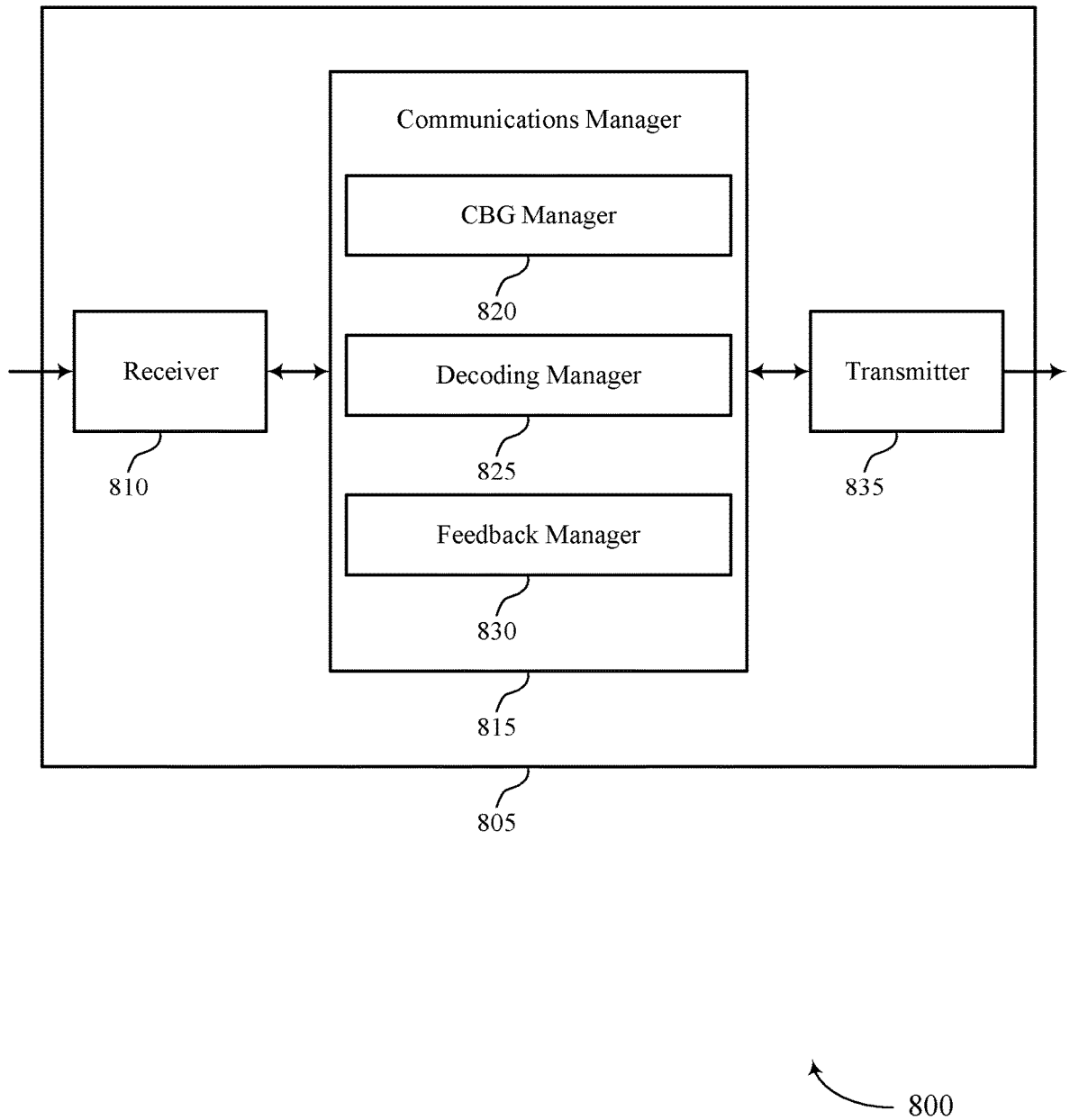

FIG. 8 shows a block diagram 800 of a device 805 that supports latency minimization for retransmissions in communications systems with multi-level coding and multi-level sequential demodulation and decoding and code block grouping from different component codes in accordance with aspects of the present disclosure. The device 805 may be an example of aspects of a device 705, or a UE 115 as described herein. The device 805 may include a receiver 810, a communications manager 815, and a transmitter 835. The device 805 may also include at least one processor. Each of these components may be in communication with one another (e.g., via one or more buses).

The receiver 810 may receive information such as packets, user data, or control information associated with various information channels (e.g., control channels, data channels, and information related to latency minimization for retransmissions in communications systems with multi-level coding and multi-level sequential demodulation and decoding and code block grouping from different component codes). Information may be passed on to other components of the device 805. The receiver 810 may be an example of aspects of the transceiver 1020 described with reference to FIG. 10. The receiver 810 may utilize a single antenna or a set of antennas.

The communications manager 815 may be an example of aspects of the communications manager 715 as described herein. The communications manager 815 may include a CBG manager 820, a decoding manager 825, and a feedback manager 830. The communications manager 815 may be an example of aspects of the communications manager 1010 described herein.

The CBG manager 820 may receive, from a base station in a first TTI, a CBG including a set of code blocks associated with a set of codewords, each codeword of the set of codewords associated with one of a set of decoding levels of a decoding procedure for the CBG and receive, from the base station in a second TTI and based on the transmitted feedback message, a retransmission of the CBG including both the first set of code blocks and the second set of code blocks.

The decoding manager 825 may determine that the decoding procedure associated with at least one of a first set of code blocks of the set of code blocks or a second set of code blocks of the set of code blocks is unsuccessful, where the first set of code blocks are associated with a first codeword, and the second set of code blocks are associated with a second codeword. The feedback manager 830 may transmit, to the base station, a feedback message including an indicator that the decoding procedure was unsuccessful for the CBG based on the determining that the decoding procedure associated with at least one of the first set of code blocks or the second set of code blocks is unsuccessful. The transmitter 835 may transmit signals generated by other components of the device 805. In some examples, the transmitter 835 may be collocated with a receiver 810 in a transceiver module. For example, the transmitter 835 may be an example of aspects of the transceiver 1020 described with reference to FIG. 10. The transmitter 835 may utilize a single antenna or a set of antennas.

Figure 9:
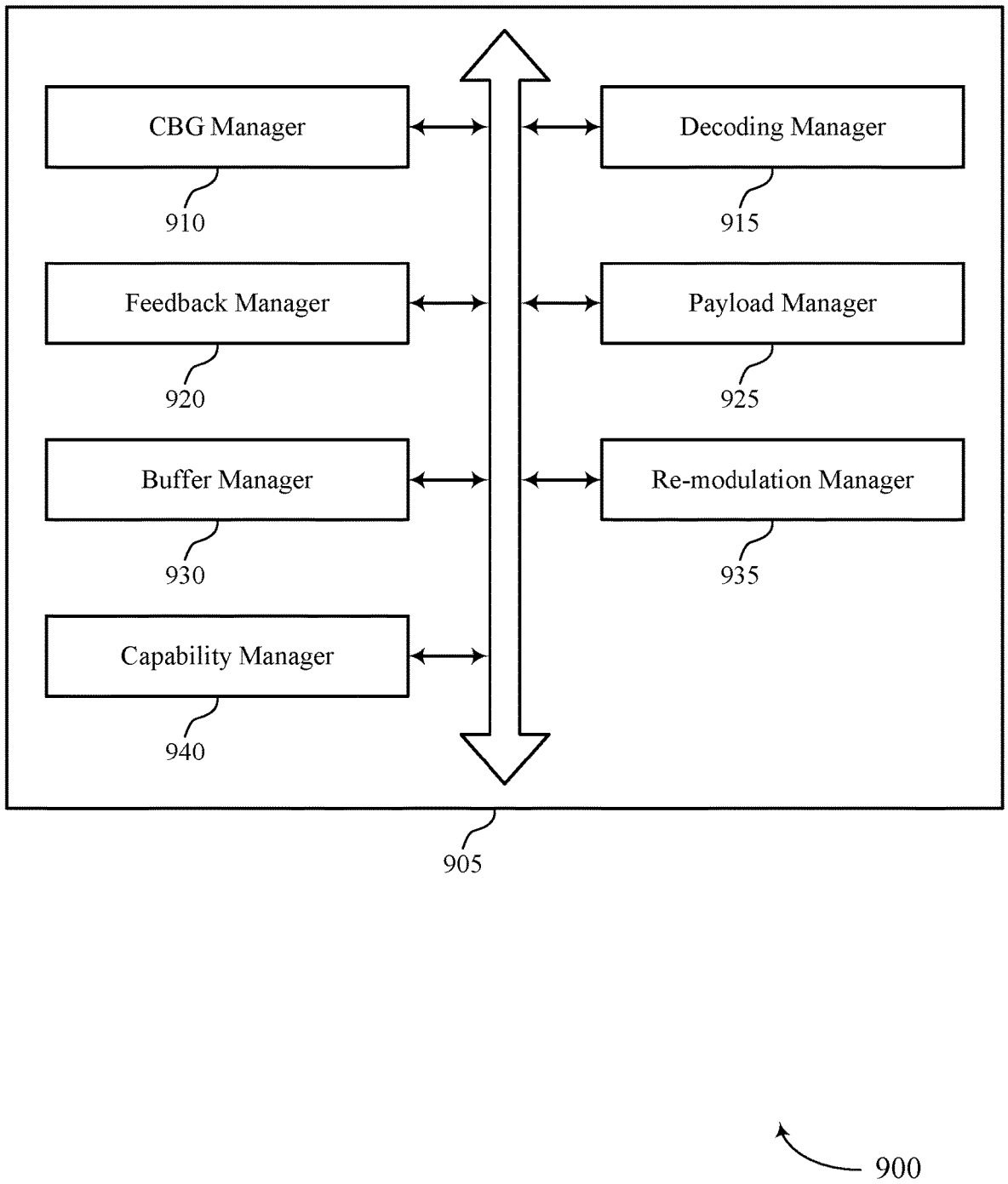
FIG. 9 shows a block diagram of a communications manager that supports latency minimization for retransmissions in communications systems with multi-level coding and multi-level sequential demodulation and decoding and code block grouping from different component codes in accordance with aspects of the present disclosure.

FIG. 9 shows a block diagram 900 of a communications manager 905 that supports latency minimization for retransmissions in communications systems with multi-level coding and multi-level sequential demodulation and decoding and code block grouping from different component codes in accordance with aspects of the present disclosure. The communications manager 905 may be an example of aspects of a communications manager 715, a communications manager 815, or a communications manager 1010 described herein. The communications manager 905 may include a CBG manager 910, a decoding manager 915, a feedback manager 920, a payload manager 925, a buffer manager 930, a re-modulation manager 935, and a capability manager 940. Each of these modules may communicate, directly or indirectly, with one another (e.g., via one or more buses).

The CBG manager 910 may receive, from a base station in a first TTI, a CBG including a set of code blocks associated with a set of codewords, each codeword of the set of codewords associated with one of a set of decoding levels of a decoding procedure for the CBG. In some examples, the CBG manager 910 may receive, from the base station in a second TTI and based on the transmitted feedback message, a retransmission of the CBG including both the first set of code blocks and the second set of code blocks.

In some examples, the CBG manager 910 may receive, from the base station, a control message responsive to the feedback message, the control message including a retransmission indicator for the CBG. In some examples, the CBG manager 910 may determine that the retransmission indicator includes a HARQ process identifier and a redundancy version associated with the first codeword and the second codeword, where receiving the retransmission of the CBG including both the first set of code blocks and the second set of code blocks includes receiving a retransmission of first codeword and the second codeword associated with the first set of code blocks and the second set of code blocks, respectively.

In some cases, the control message includes a DCI message. In some cases, the first codeword is associated with a first and lower decoding level and the second codeword is associated with a second and higher decoding level.

The decoding manager 915 may determine that the decoding procedure associated with at least one of a first set of code blocks of the set of code blocks or a second set of code blocks of the set of code blocks is unsuccessful, where the first set of code blocks are associated with a first codeword, and the second set of code blocks are associated with a second codeword. In some examples, the decoding manager 915 may determine that the decoding procedure associated with the first set of code blocks is successful.

In some examples, the decoding manager 915 may determine that the decoding procedure associated with the second set of code blocks is unsuccessful. In some examples, the decoding manager 915 may decode, in the second TTI and based on receiving the retransmission of the CBG, the second set of code blocks associated with the second codeword using the stored log likelihood ratio. In some examples, the decoding manager 915 may determine that the decoding procedure associated with the retransmission of the second set of code blocks is successful based on the decoding.

In some examples, the decoding manager 915 may decode the second set of code blocks of the retransmission of the CBG received during the second TTI after HARQ combining with the second set of code blocks of the CBG received during the first TTI. In some examples, the decoding manager 915 may refrain from decoding the first set of code blocks of the retransmission of the CBG during the second TTI based on the determining that the decoding procedure associated with the first set of code blocks is successful during the first TTI. In some examples, the decoding manager 915 may determine that the decoding procedure associated with the first set of code blocks is unsuccessful.

In some examples, the decoding manager 915 may defer the decoding procedure associated with the second set of code blocks based on the determining that the decoding procedure associated with the first set of code blocks is unsuccessful. In some examples, the decoding manager 915 may successfully decode the first set of code blocks associated with the first codeword during the second TTI based on receiving the retransmission of the CBG and using the stored log likelihood ratio for HARQ combining with the retransmission of the CBG. In some examples, the decoding manager 915 may determine set partitioning information for demodulation of the second set of code blocks of the retransmission of the CBG during the second TTI based on successfully decoding the first set of code blocks during the second TTI.

In some examples, the decoding manager 915 may decode the second set of code blocks of the retransmission of the CBG during the second TTI based on the set partitioning information for the demodulation of the second set of code blocks. In some examples, the decoding manager 915 may decode the first set of code blocks of the retransmission of the CBG received during the second TTI after the HARQ combining with the first set of code blocks of the CBG received during the first TTI. In some examples, the decoding manager 915 may decode the second set of code blocks of the retransmission of the CBG received during the second TTI after the HARQ combining with the second set of code blocks of the CBG received during the first TTI, where the HARQ combining is based on the stored post-processing samples.

In some examples, the decoding manager 915 may determine a first log likelihood ratio associated with the second set of code blocks associated with the second codeword received during the first TTI based on the set partitioning information and the stored post-processing samples. In some examples, the decoding manager 915 may combine the first log likelihood ratio with a corresponding second log likelihood ratio associated with the second set of code blocks associated with the second codeword received during the second TTI. In some cases, the UE is configured to support multi-level coding with a multi-level sequential demodulation and decoding scheme. In some cases, the first TTI includes a first subframe or a first slot, and the second TTI includes a second subframe or a second slot.

The feedback manager 920 may transmit, to the base station, a feedback message including an indicator that the decoding procedure was unsuccessful for the CBG based on the determining that the decoding procedure associated with at least one of the first set of code blocks or the second set of code blocks is unsuccessful. In some examples, the feedback manager 920 may transmit, to the base station, a second feedback message indicating that the decoding procedure associated with the retransmission of the CBG is successful.

In some examples, the feedback manager 920 may transmit the feedback message including the indicator that the decoding procedure was unsuccessful for the CBG and an indication of a lowest failing decoding level for the CBG, where the indication is of a first decoding level associated with the first codeword if the decoding procedure was unsuccessful for the first set of code blocks or of a second decoding level associated with the second codeword if the decoding procedure was unsuccessful for the second set of code blocks.

The payload manager 925 may store a decoded payload associated with the first set of code blocks in a buffer at the UE.

The buffer manager 930 may store a log likelihood ratio associated with the second set of code blocks associated with the second codeword and a HARQ process identifier. In some examples, the buffer manager 930 may store a log likelihood ratio associated with the first set of code blocks associated with the first codeword and a HARQ process identifier. In some examples, the buffer manager 930 may store post-processing samples corresponding to resources occupied by the second set of code blocks associated with the second codeword, the second set of code blocks corresponding to the first set of code blocks, where the post-processing samples are stored in a corresponding buffer.

The Re-modulation manager 935 may re-modulate a redundancy version of the first set of code blocks of the retransmission of the CBG during the second TTI based on the stored decoded payload associated with the first set of code blocks. In some examples, the Re-modulation manager 935 may determine set partitioning information for demodulation of the second set of code blocks of the retransmission of the CBG during the second TTI based on the stored decoded payload associated with the first set of code blocks and re-encoding for obtaining a corresponding redundancy version that defines the set partitioning information.

The capability manager 940 may transmit, to the base station, an indication of a capability of the UE to support hierarchical acknowledgment feedback, a number of HARQ processes across the set of decoding levels, and a corresponding number of samples buffers of the UE, where receiving the retransmission of the CBG including the first set of code blocks associated with the first codeword and the second set of code blocks associated with the second codeword using a same redundancy version for both the first set of code blocks and the second set of code blocks is based on the capability of the UE.

Figure 10:
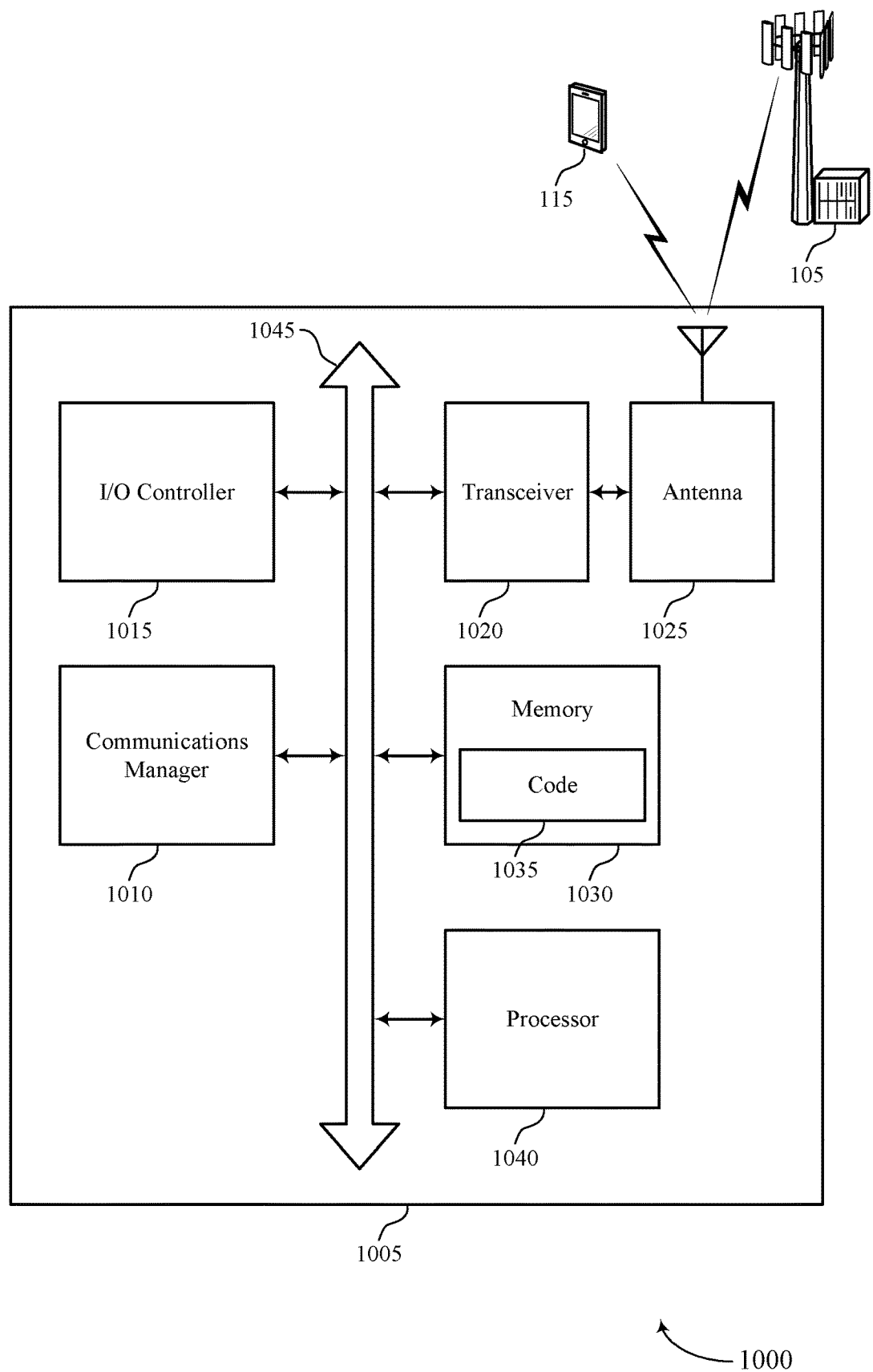
FIG. 10 shows a diagram of a system including a device that supports latency minimization for retransmissions in communications systems with multi-level coding and multi-level sequential demodulation and decoding and code block grouping from different component codes in accordance with aspects of the present disclosure.

FIG. 10 shows a diagram of a system 1000 including a device 1005 that supports latency minimization for retransmissions in communications systems with multi-level coding and multi-level sequential demodulation and decoding and code block grouping from different component codes in accordance with aspects of the present disclosure. The device 1005 may be an example of or include the components of device 705, device 805, or a UE 115 as described herein. The device 1005 may include components for bi-directional voice and data communications including components for transmitting and receiving communications, including a communications manager 1010, an I/O controller 1015, a transceiver 1020, an antenna 1025, memory 1030, and at least one processor 1040. These components may be in electronic communication via one or more buses (e.g., bus 1045).

The communications manager 1010 may receive, from a base station in a first TTI, a CBG including a set of code blocks associated with a set of codewords, each codeword of the set of codewords associated with one of a set of decoding levels of a decoding procedure for the CBG, receive, from the base station in a second TTI and based on the transmitted feedback message, a retransmission of the CBG including both the first set of code blocks and the second set of code blocks, determine that the decoding procedure associated with at least one of a first set of code blocks of the set of code blocks or a second set of code blocks of the set of code blocks is unsuccessful, where the first set of code blocks are associated with a first codeword, and the second set of code blocks are associated with a second codeword, and transmit, to the base station, a feedback message including an indicator that the decoding procedure was unsuccessful for the CBG based on the determining that the decoding procedure associated with at least one of the first set of code blocks or the second set of code blocks is unsuccessful.

The I/O controller 1015 may manage input and output signals for the device 1005. The I/O controller 1015 may also manage peripherals not integrated into the device 1005. In some cases, the I/O controller 1015 may represent a physical connection or port to an external peripheral. In some cases, the I/O controller 1015 may utilize an operating system such as iOS®, ANDROID®, MS-DOS®, MS-WINDOWS®, OS/2®, UNIX®, LINUX®, or another known operating system. In other cases, the I/O controller 1015 may represent or interact with a modem, a keyboard, a mouse, a touchscreen, or a similar device. In some cases, the I/O controller 1015 may be implemented as part of a processor. In some cases, a user may interact with the device 1005 via the I/O controller 1015 or via hardware components controlled by the I/O controller 1015.

The transceiver 1020 may communicate bi-directionally, via one or more antennas, wired, or wireless links as described herein. For example, the transceiver 1020 may represent a wireless transceiver and may communicate bi-directionally with another wireless transceiver. The transceiver 1020 may also include a modem to modulate the packets and provide the modulated packets to the antennas for transmission, and to demodulate packets received from the antennas.

In some cases, the wireless device may include a single antenna 1025. However, in some cases the device may have more than one antenna 1025, which may be capable of concurrently transmitting or receiving multiple wireless transmissions.

The memory 1030 may include random-access memory (RAM) and read-only memory (ROM). The memory 1030 may store computer-readable, computer-executable code 1035 including instructions that, when executed, cause the processor 1040 to perform various functions described herein. In some cases, the memory 1030 may contain, among other things, a basic I/O system (BIOS) which may control basic hardware or software operation such as the interaction with peripheral components or devices.

The processor 1040 may include an intelligent hardware device, (e.g., a general-purpose processor, a DSP, a central processing unit (CPU), a microcontroller, an ASIC, an FPGA, a programmable logic device, a discrete gate or transistor logic component, a discrete hardware component, or any combination thereof). In some cases, the processor 1040 may be configured to operate a memory array using a memory controller. In other cases, a memory controller may be integrated into the processor 1040. The processor 1040 may be configured to execute computer-readable instructions stored in a memory (e.g., the memory 1030) to cause the device 1005 to perform various functions (e.g., functions or tasks supporting latency minimization for retransmissions in communications systems with multi-level coding and multi-level sequential demodulation and decoding and code block grouping from different component codes).

The code 1035 may include instructions to implement aspects of the present disclosure, including instructions to support wireless communications. The code 1035 may be stored in a non-transitory computer-readable medium such as system memory or other type of memory. In some cases, the code 1035 may not be directly executable by the processor 1040 but may cause a computer (e.g., when compiled and executed) to perform functions described herein.

Figure 11:
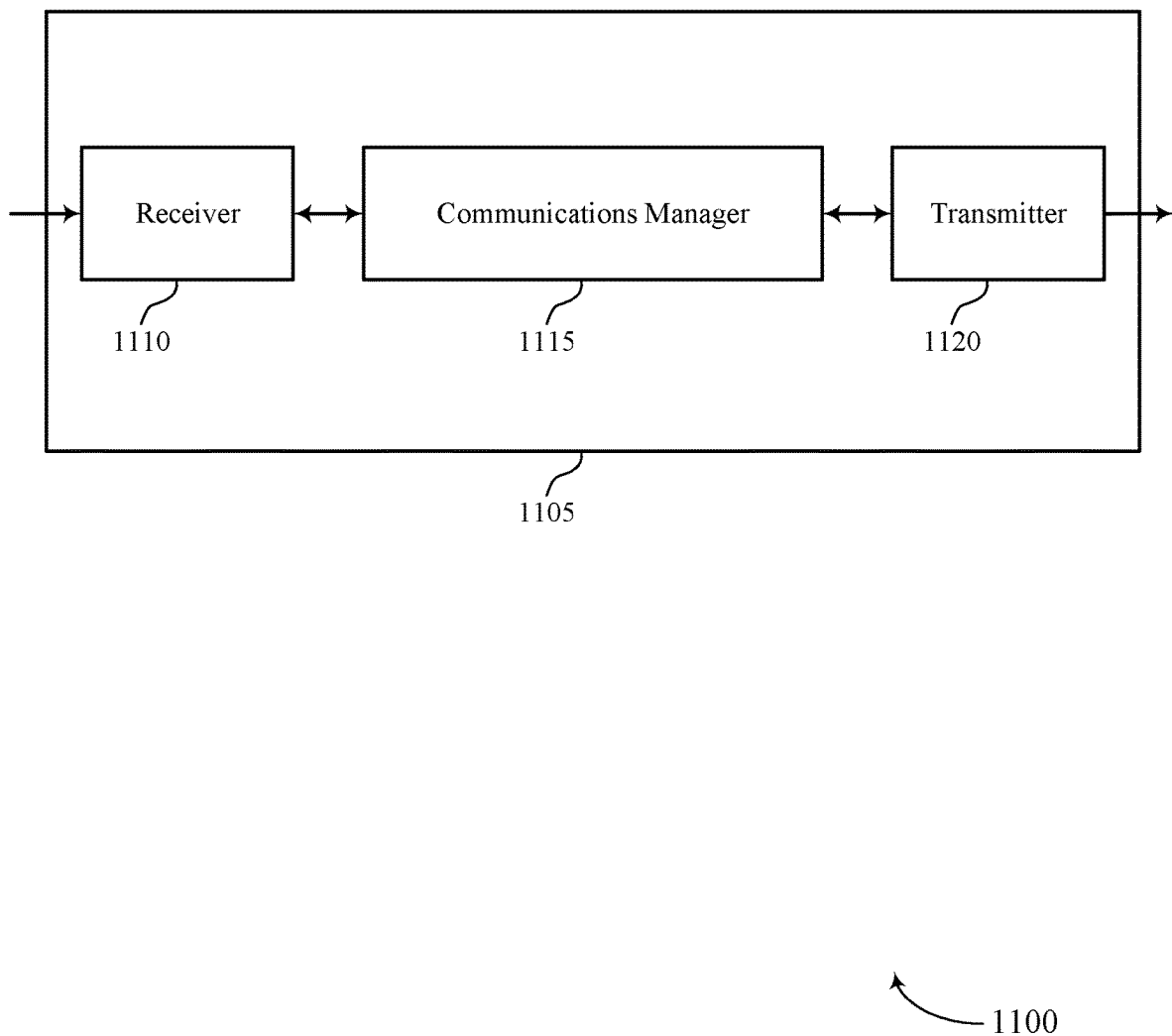
FIGS. 11 and 12 show block diagrams of devices that support latency minimization for retransmissions in communications systems with multi-level coding and multi-level sequential demodulation and decoding and code block grouping from different component codes in accordance with aspects of the present disclosure.

FIG. 11 shows a block diagram 1100 of a device 1105 that supports latency minimization for retransmissions in communications systems with multi-level coding and multi-level sequential demodulation and decoding and code block grouping from different component codes in accordance with aspects of the present disclosure. The device 1105 may be an example of aspects of a base station 105 as described herein. The device 1105 may include a receiver 1110, a communications manager 1115, and a transmitter 1120. The device 1105 may also include at least one processor. Each of these components may be in communication with one another (e.g., via one or more buses).

The receiver 1110 may receive information such as packets, user data, or control information associated with various information channels (e.g., control channels, data channels, and information related to latency minimization for retransmissions in communications systems with multi-level coding and multi-level sequential demodulation and decoding and code block grouping from different component codes). Information may be passed on to other components of the device 1105. The receiver 1110 may be an example of aspects of the transceiver 1420 described with reference to FIG. 14. The receiver 1110 may utilize a single antenna or a set of antennas.

The communications manager 1115 may transmit, to a UE in a first TTI, a CBG including a set of code blocks associated with a set of codewords, where each codeword of the set of codewords is associated with one of a set of decoding levels of a decoding procedure for the CBG, a first set of code blocks of the set of code blocks are associated with a first codeword of the set of codewords, and a second set of code blocks of the set of code blocks are associated with a second codeword of the set of codewords, transmit, to the UE in a second TTI and based on the received feedback message, a retransmission of the CBG including both the first set of code blocks and the second set of code blocks, and receive, from the UE, a feedback message including an indicator that the decoding procedure was unsuccessful for at least one of the first set of code blocks or the second set of code blocks. The communications manager 1115 may be an example of aspects of the communications manager 1410 described herein.

The communications manager 1115, or its sub-components, may be implemented in hardware, software (e.g., executed by at least one processor), or any combination thereof. If implemented in code executed by at least one processor, the functions of the communications manager 1115, or its sub-components may be executed by a general-purpose processor, a DSP, an ASIC, an FPGA or other programmable logic device, discrete gate or transistor logic, discrete hardware components, or any combination thereof designed to perform the functions described in the present disclosure.

The communications manager 1115, or its sub-components, may be physically located at various positions, including being distributed such that portions of functions are implemented at different physical locations by one or more physical components. In some examples, the communications manager 1115, or its sub-components, may be a separate and distinct component in accordance with various aspects of the present disclosure. In some examples, the communications manager 1115, or its sub-components, may be combined with one or more other hardware components, including but not limited to an I/O component, a transceiver, a network server, another computing device, one or more other components described in the present disclosure, or a combination thereof in accordance with various aspects of the present disclosure.

The transmitter 1120 may transmit signals generated by other components of the device 1105. In some examples, the transmitter 1120 may be collocated with a receiver 1110 in a transceiver module. For example, the transmitter 1120 may be an example of aspects of the transceiver 1420 described with reference to FIG. 14. The transmitter 1120 may utilize a single antenna or a set of antennas.

The communications manager 1115 described herein may be implemented to realize one or more potential advantages. In some implementations, the communications manager 1115 may adaptively or dynamically bypass an established hierarchical HARQ procedure based on determining that the data to be communicated to a UE is latency-sensitive data, such as data this is highly sensitive to latency or data that is associated with a strict latency constraint or requirement. In such implementations, the communications manager 1115 may employ a latency minimization procedure to reduce the latency associated with decoding the data at the UE, which may improve system performance. Further, based on bypassing the hierarchical HARQ procedure in a way that is transparent to the UE, the communications manager 1115 may refrain from transmitting control signaling to configure the latency minimization procedure, which may reduce latency while maintaining low signaling overhead.

Figure 12:
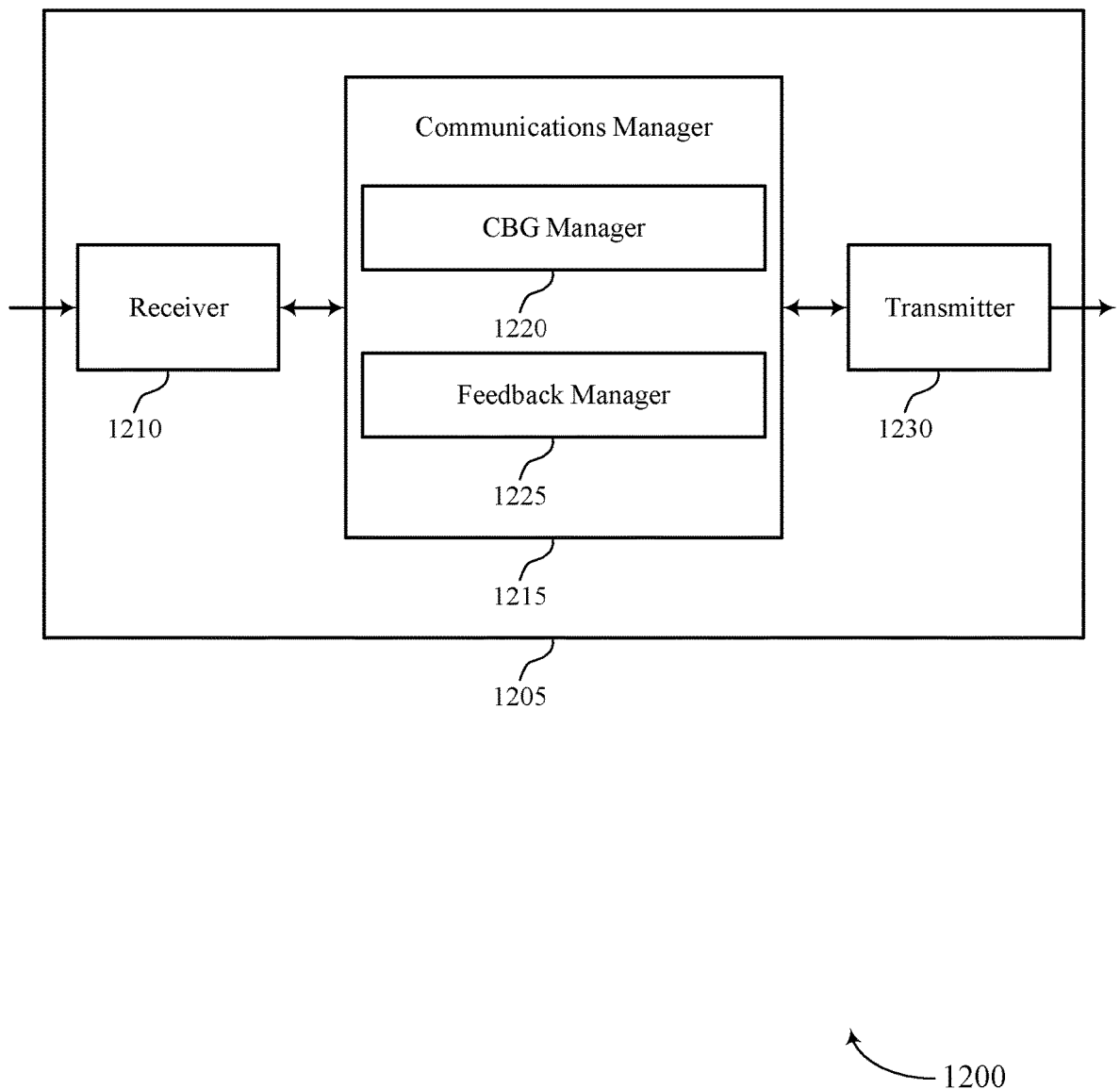

FIG. 12 shows a block diagram 1200 of a device 1205 that supports latency minimization for retransmissions in communications systems with multi-level coding and multi-level sequential demodulation and decoding and code block grouping from different component codes in accordance with aspects of the present disclosure. The device 1205 may be an example of aspects of a device 1105, or a base station 105 as described herein. The device 1205 may include a receiver 1210, a communications manager 1215, and a transmitter 1230. The device 1205 may also include at least one processor. Each of these components may be in communication with one another (e.g., via one or more buses).

The receiver 1210 may receive information such as packets, user data, or control information associated with various information channels (e.g., control channels, data channels, and information related to latency minimization for retransmissions in communications systems with multi-level coding and multi-level sequential demodulation and decoding and code block grouping from different component codes). Information may be passed on to other components of the device 1205. The receiver 1210 may be an example of aspects of the transceiver 1420 described with reference to FIG. 14. The receiver 1210 may utilize a single antenna or a set of antennas.

The communications manager 1215 may be an example of aspects of the communications manager 1115 as described herein. The communications manager 1215 may include a CBG manager 1220 and a feedback manager 1225. The communications manager 1215 may be an example of aspects of the communications manager 1410 described herein.

The CBG manager 1220 may transmit, to a UE in a first TTI, a CBG including a set of code blocks associated with a set of codewords, where each codeword of the set of codewords is associated with one of a set of decoding levels of a decoding procedure for the CBG, a first set of code blocks of the set of code blocks are associated with a first codeword of the set of codewords, and a second set of code blocks of the set of code blocks are associated with a second codeword of the set of codewords and transmit, to the UE in a second TTI and based on the received feedback message, a retransmission of the CBG including both the first set of code blocks and the second set of code blocks. The feedback manager 1225 may receive, from the UE, a feedback message including an indicator that the decoding procedure was unsuccessful for at least one of the first set of code blocks or the second set of code blocks.

The transmitter 1230 may transmit signals generated by other components of the device 1205. In some examples, the transmitter 1230 may be collocated with a receiver 1210 in a transceiver module. For example, the transmitter 1230 may be an example of aspects of the transceiver 1420 described with reference to FIG. 14. The transmitter 1230 may utilize a single antenna or a set of antennas.

Figure 13:
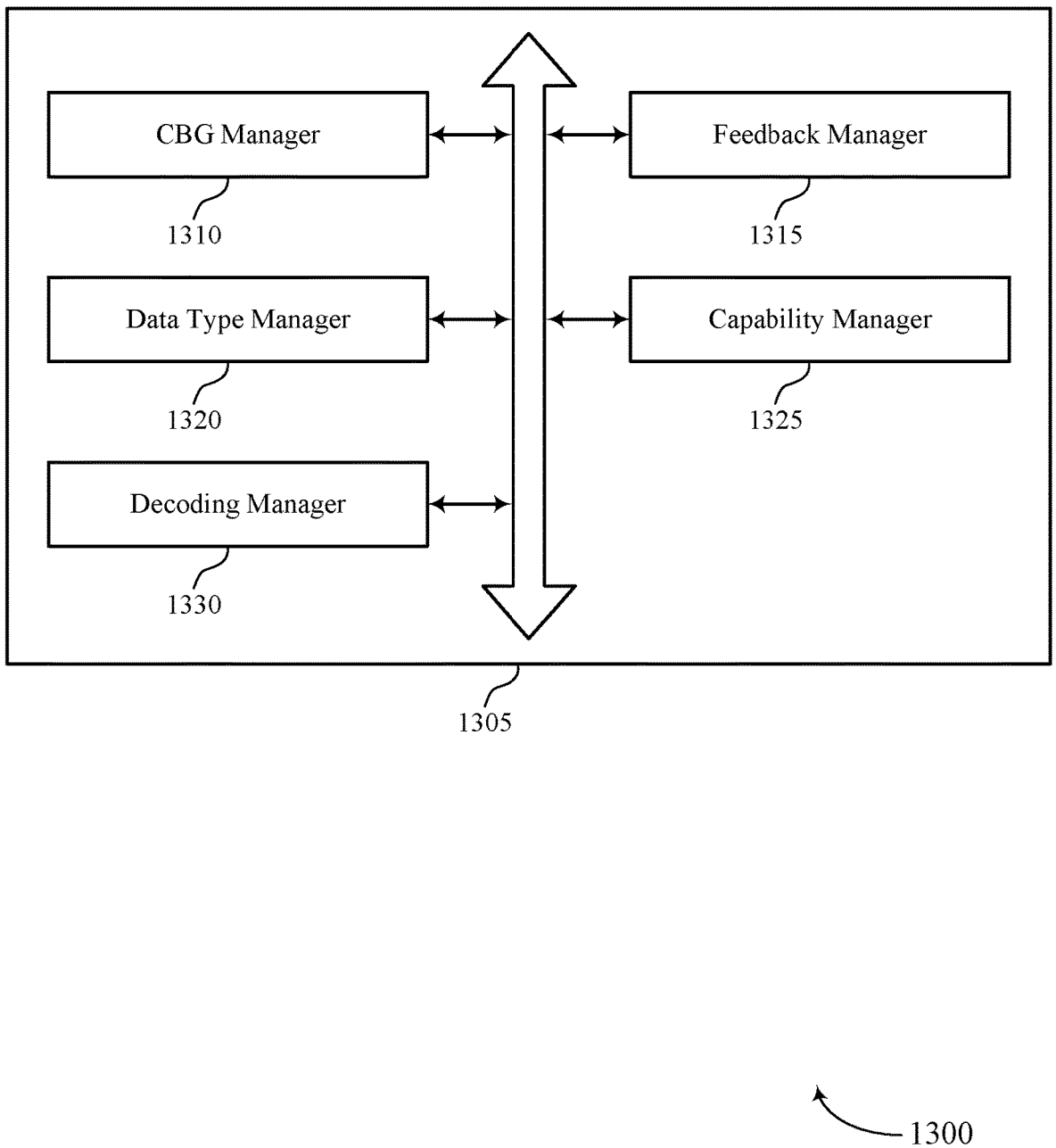
FIG. 13 shows a block diagram of a communications manager that supports latency minimization for retransmissions in communications systems with multi-level coding and multi-level sequential demodulation and decoding and code block grouping from different component codes in accordance with aspects of the present disclosure.

FIG. 13 shows a block diagram 1300 of a communications manager 1305 that supports latency minimization for retransmissions in communications systems with multi-level coding and multi-level sequential demodulation and decoding and code block grouping from different component codes in accordance with aspects of the present disclosure. The communications manager 1305 may be an example of aspects of a communications manager 1115, a communications manager 1215, or a communications manager 1410 described herein. The communications manager 1305 may include a CBG manager 1310, a feedback manager 1315, a data type manager 1320, a capability manager 1325, and a decoding manager 1330. Each of these modules may communicate, directly or indirectly, with one another (e.g., via one or more buses).

The CBG manager 1310 may transmit, to a UE in a first TTI, a CBG including a set of code blocks associated with a set of codewords, where each codeword of the set of codewords is associated with one of a set of decoding levels of a decoding procedure for the CBG, a first set of code blocks of the set of code blocks are associated with a first codeword of the set of codewords, and a second set of code blocks of the set of code blocks are associated with a second codeword of the set of codewords. In some examples, the CBG manager 1310 may transmit, to the UE in a second TTI and based on the received feedback message, a retransmission of the CBG including both the first set of code blocks and the second set of code blocks.

In some examples, the CBG manager 1310 may transmit, to the UE, a control message responsive to the feedback message, the control message including a retransmission indicator for the CBG. In some examples, the CBG manager 1310 may include a HARQ process identifier and a redundancy version associated with the first codeword and the second codeword in the retransmission indicator, where transmitting the retransmission of the CBG includes transmitting a retransmission of the first set of code blocks associated with the first codeword and a retransmission of the second set of code blocks associated with the second codeword. In some cases, the control message includes a DCI message. In some cases, the first codeword is associated with a first and lower decoding level and the second codeword is associated with a second and higher decoding level.

The feedback manager 1315 may receive, from the UE, a feedback message including an indicator that the decoding procedure was unsuccessful for at least one of the first set of code blocks or the second set of code blocks. In some examples, the feedback manager 1315 may receive the feedback message including the indicator that the decoding procedure was unsuccessful for the CBG and an indication of a lowest failing decoding level for the CBG, where the indication is of a first decoding level associated with the first codeword if the decoding procedure was unsuccessful for the first set of code blocks or of a second decoding level associated with the second codeword if the decoding procedure was unsuccessful for the second set of code blocks.

The data type manager 1320 may determine that a data type associated with the CBG corresponds to a latency-sensitive data type, where transmitting the retransmission of the CBG including both the first set of code blocks and the second set of code blocks is based on the data type being the latency-sensitive data type.

The capability manager 1325 may receive, from the UE, an indication of a capability of the UE to support hierarchical acknowledgment feedback, a number of HARQ processes across the set of decoding levels, and a corresponding number of samples buffers of the UE, where transmitting the retransmission of the CBG including the first set of code blocks associated with the first codeword and the second set of code blocks associated with the second codeword using a same redundancy version for both the first set of code blocks and the second set of code blocks is based on the capability of the UE.

The decoding manager 1330 may provide control information for decoding operations for the communications manager 1305 or for a UE, or both. In some cases, the base station is configured to support multi-level coding. In some cases, the first TTI includes a first subframe or a first slot, and the second TTI includes a second subframe or a second slot.

Figure 14:
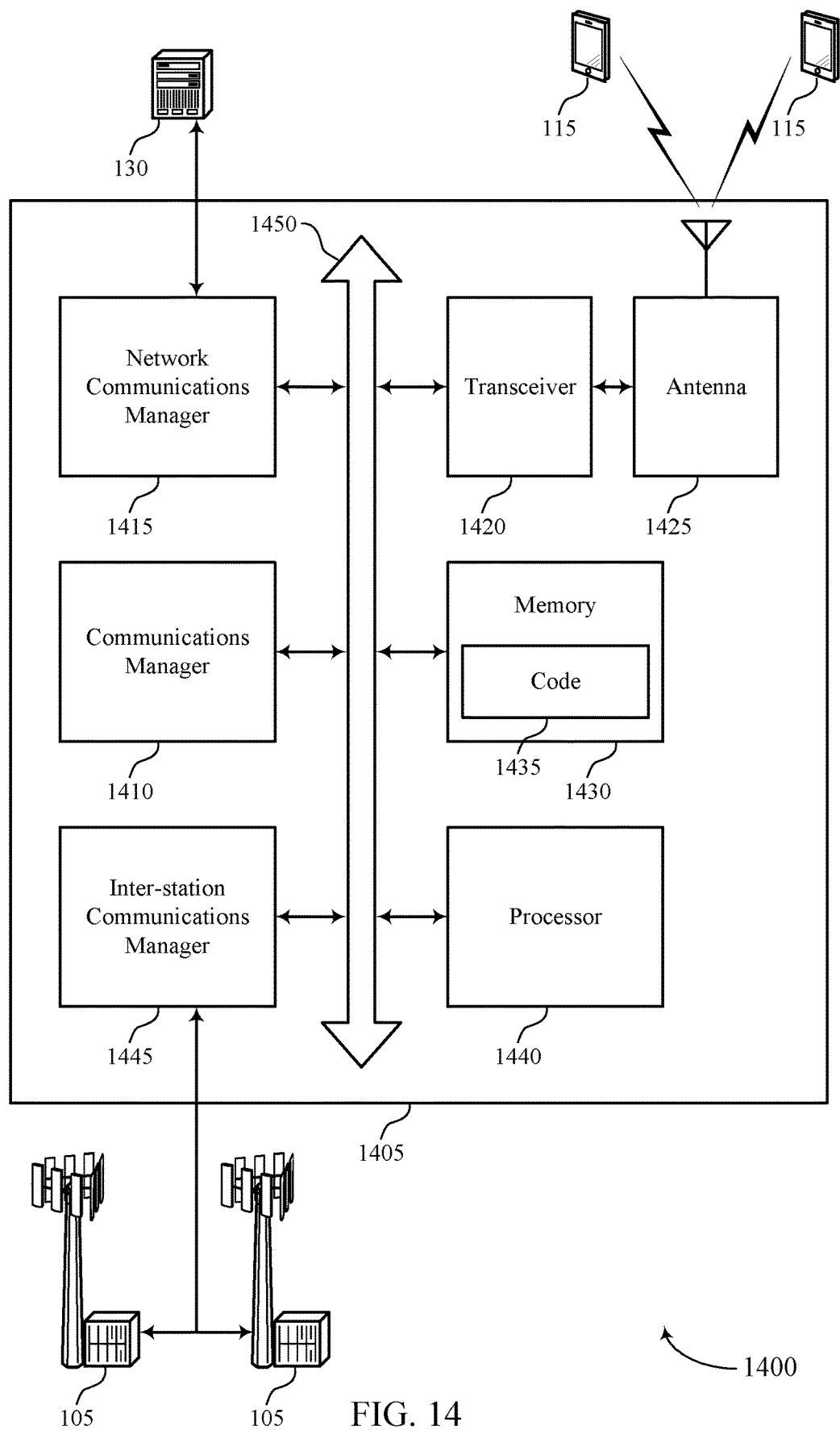
FIG. 14 shows a diagram of a system including a device that supports latency minimization for retransmissions in communications systems with multi-level coding and multi-level sequential demodulation and decoding and code block grouping from different component codes in accordance with aspects of the present disclosure.

FIG. 14 shows a diagram of a system 1400 including a device 1405 that supports latency minimization for retransmissions in communications systems with multi-level coding and multi-level sequential demodulation and decoding and code block grouping from different component codes in accordance with aspects of the present disclosure. The device 1405 may be an example of or include the components of device 1105, device 1205, or a base station 105 as described herein. The device 1405 may include components for bi-directional voice and data communications including components for transmitting and receiving communications, including a communications manager 1410, a network communications manager 1415, a transceiver 1420, an antenna 1425, memory 1430, at least one processor 1440, and an inter-station communications manager 1445. These components may be in electronic communication via one or more buses (e.g., bus 1450).

The communications manager 1410 may transmit, to a UE in a first TTI, a CBG including a set of code blocks associated with a set of codewords, where each codeword of the set of codewords is associated with one of a set of decoding levels of a decoding procedure for the CBG, a first set of code blocks of the set of code blocks are associated with a first codeword of the set of codewords, and a second set of code blocks of the set of code blocks are associated with a second codeword of the set of codewords, transmit, to the UE in a second TTI and based on the received feedback message, a retransmission of the CBG including both the first set of code blocks and the second set of code blocks, and receive, from the UE, a feedback message including an indicator that the decoding procedure was unsuccessful for at least one of the first set of code blocks or the second set of code blocks.

The network communications manager 1415 may manage communications with the core network (e.g., via one or more wired backhaul links). For example, the network communications manager 1415 may manage the transfer of data communications for client devices, such as one or more UEs 115.

The transceiver 1420 may communicate bi-directionally, via one or more antennas, wired, or wireless links as described herein. For example, the transceiver 1420 may represent a wireless transceiver and may communicate bi-directionally with another wireless transceiver. The transceiver 1420 may also include a modem to modulate the packets and provide the modulated packets to the antennas for transmission, and to demodulate packets received from the antennas.

In some cases, the wireless device may include a single antenna 1425. However, in some cases the device may have more than one antenna 1425, which may be capable of concurrently transmitting or receiving multiple wireless transmissions.

The memory 1430 may include RAM, ROM, or a combination thereof. The memory 1430 may store computer-readable code 1435 including instructions that, when executed by at least one processor (e.g., the processor 1440) cause the device to perform various functions described herein. In some cases, the memory 1430 may contain, among other things, a BIOS which may control basic hardware or software operation such as the interaction with peripheral components or devices.

The processor 1440 may include an intelligent hardware device, (e.g., a general-purpose processor, a DSP, a CPU, a microcontroller, an ASIC, an FPGA, a programmable logic device, a discrete gate or transistor logic component, a discrete hardware component, or any combination thereof). In some cases, the processor 1440 may be configured to operate a memory array using a memory controller. In some cases, a memory controller may be integrated into processor 1440. The processor 1440 may be configured to execute computer-readable instructions stored in a memory (e.g., the memory 1430) to cause the device 1405 to perform various functions (e.g., functions or tasks supporting latency minimization for retransmissions in communications systems with multi-level coding and multi-level sequential demodulation and decoding and code block grouping from different component codes).

The inter-station communications manager 1445 may manage communications with other base station 105, and may include a controller or scheduler for controlling communications with UEs 115 in cooperation with other base stations 105. For example, the inter-station communications manager 1445 may coordinate scheduling for transmissions to UEs 115 for various interference mitigation techniques such as beamforming or joint transmission. In some examples, the inter-station communications manager 1445 may provide an X2 interface within an LTE/LTE-A wireless communication network technology to provide communication between base stations 105.

The code 1435 may include instructions to implement aspects of the present disclosure, including instructions to support wireless communications. The code 1435 may be stored in a non-transitory computer-readable medium such as system memory or other type of memory. In some cases, the code 1435 may not be directly executable by the processor 1440 but may cause a computer (e.g., when compiled and executed) to perform functions described herein.

Figure 15:
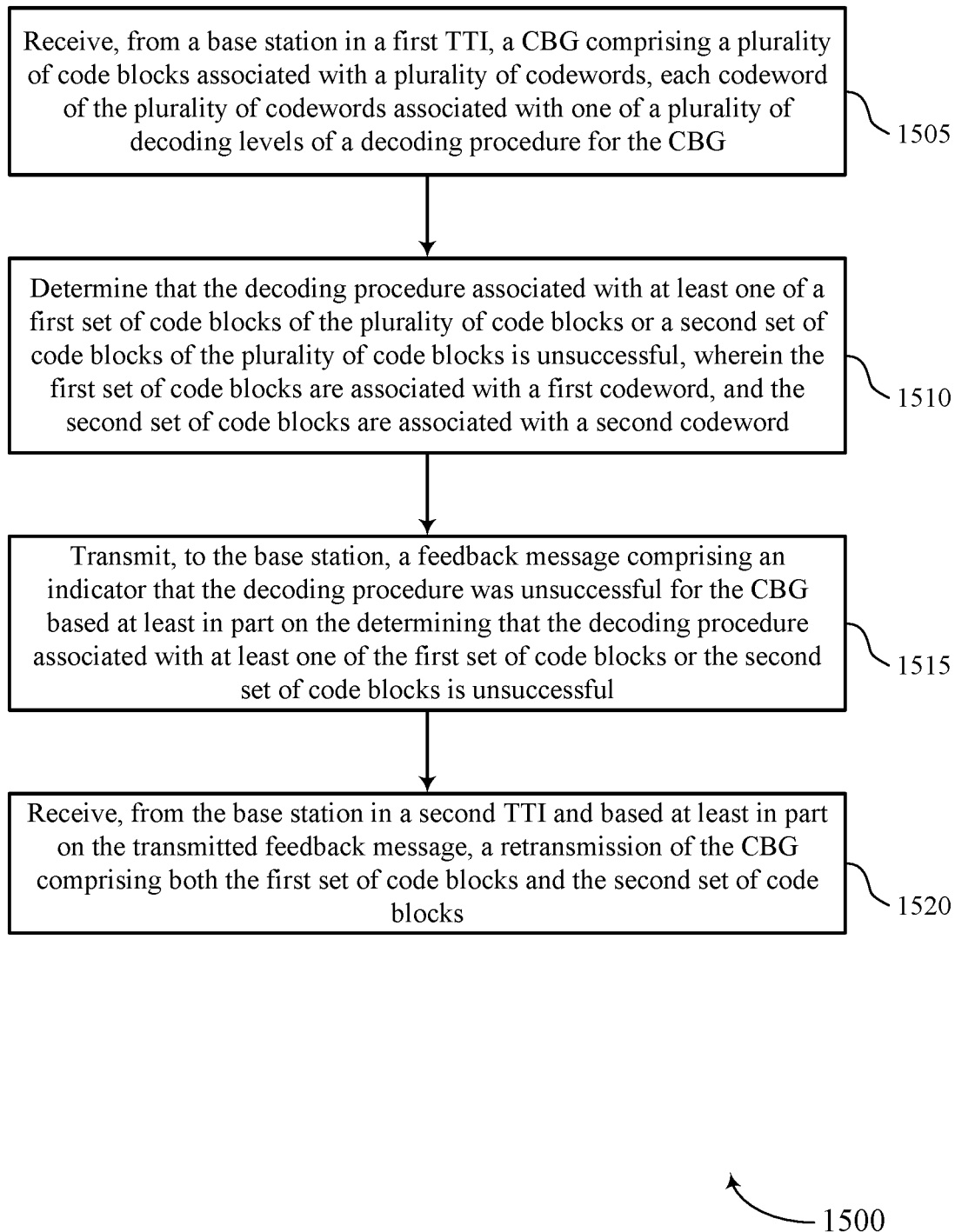
FIGS. 15 through 20 show flowcharts illustrating methods that support latency minimization for retransmissions in communications systems with multi-level coding and multi-level sequential demodulation and decoding and code block grouping from different component codes in accordance with aspects of the present disclosure.

FIG. 15 shows a flowchart illustrating a method 1500 that supports latency minimization for retransmissions in communications systems with multi-level coding and multi-level sequential demodulation and decoding and code block grouping from different component codes in accordance with aspects of the present disclosure. The operations of method 1500 may be implemented by a UE 115 or its components as described herein. For example, the operations of method 1500 may be performed by a communications manager as described with reference to FIGS. 7 through 10. In some examples, a UE may execute a set of instructions to control the functional elements of the UE to perform the functions described herein. Additionally or alternatively, a UE may perform aspects of the functions described herein using special-purpose hardware.

At 1505, the UE may receive, from a base station in a first TTI, a CBG comprising a plurality of code blocks associated with a plurality of codewords, each codeword of the plurality of codewords associated with one of a plurality of decoding levels of a decoding procedure for the CBG. The operations of 1505 may be performed according to the methods described herein. In some examples, aspects of the operations of 1505 may be performed by a CBG manager as described with reference to FIGS. 7 through 10.

At 1510, the UE may determine that the decoding procedure associated with at least one of a first set of code blocks of the plurality of code blocks or a second set of code blocks of the plurality of code blocks is unsuccessful, wherein the first set of code blocks are associated with a first codeword, and the second set of code blocks are associated with a second codeword. The operations of 1510 may be performed according to the methods described herein. In some examples, aspects of the operations of 1510 may be performed by a decoding manager as described with reference to FIGS. 7 through 10.

At 1515, the UE may transmit, to the base station, a feedback message comprising an indicator that the decoding procedure was unsuccessful for the CBG based at least in part on the determining that the decoding procedure associated with at least one of the first set of code blocks or the second set of code blocks is unsuccessful. The operations of 1515 may be performed according to the methods described herein. In some examples, aspects of the operations of 1515 may be performed by a feedback manager as described with reference to FIGS. 7 through 10.

At 1520, the UE may receive, from the base station in a second TTI and based at least in part on the transmitted feedback message, a retransmission of the CBG comprising both the first set of code blocks and the second set of code blocks. The operations of 1520 may be performed according to the methods described herein. In some examples, aspects of the operations of 1520 may be performed by a CBG manager as described with reference to FIGS. 7 through 10.

Figure 16:
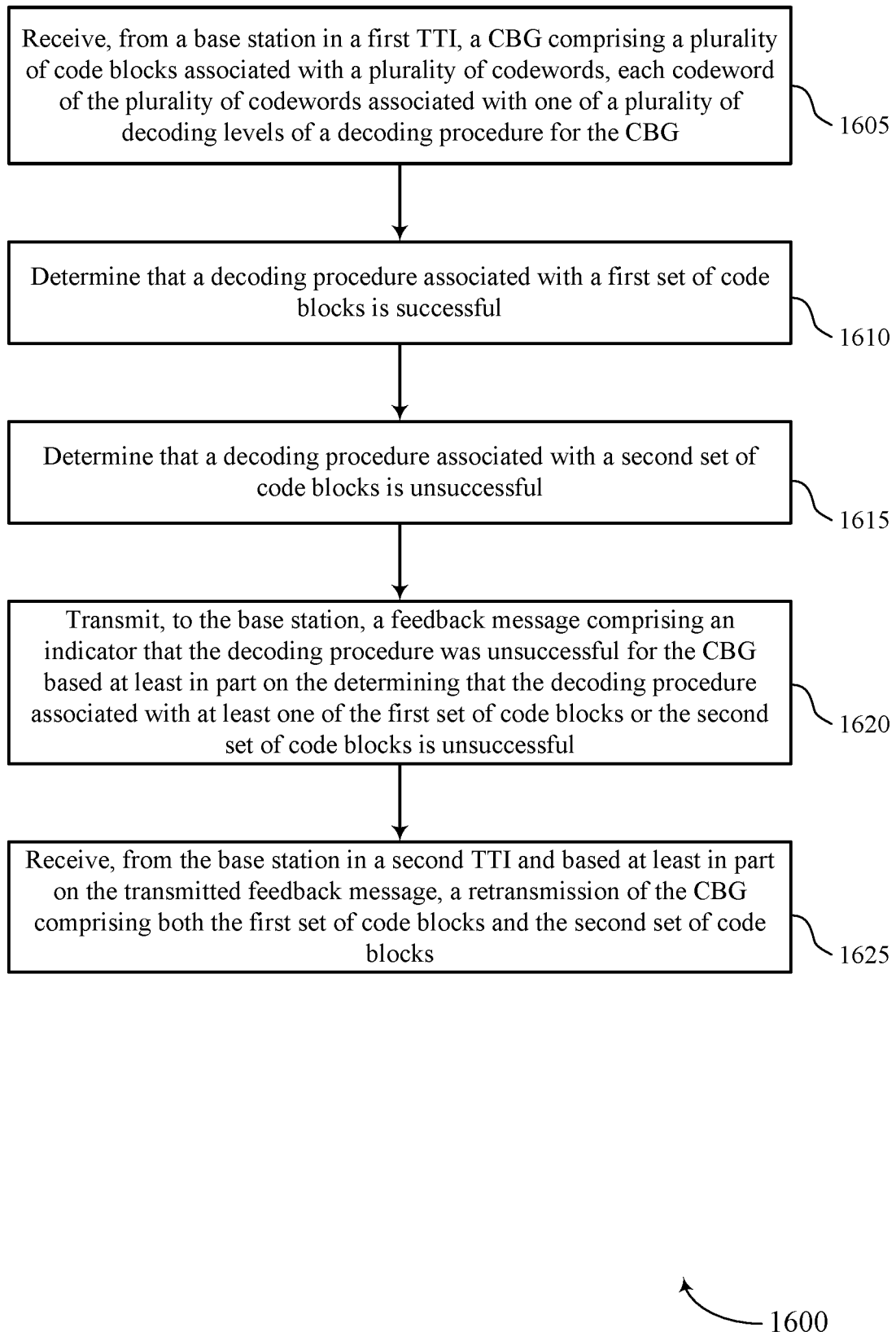

FIG. 16 shows a flowchart illustrating a method 1600 that supports latency minimization for retransmissions in communications systems with multi-level coding and multi-level sequential demodulation and decoding and code block grouping from different component codes in accordance with aspects of the present disclosure. The operations of method 1600 may be implemented by a UE 115 or its components as described herein. For example, the operations of method 1600 may be performed by a communications manager as described with reference to FIGS. 7 through 10. In some examples, a UE may execute a set of instructions to control the functional elements of the UE to perform the functions described herein. Additionally or alternatively, a UE may perform aspects of the functions described herein using special-purpose hardware.

At 1605, the UE may receive, from a base station in a first TTI, a CBG comprising a plurality of code blocks associated with a plurality of codewords, each codeword of the plurality of codewords associated with one of a plurality of decoding levels of a decoding procedure for the CBG. The operations of 1605 may be performed according to the methods described herein. In some examples, aspects of the operations of 1605 may be performed by a CBG manager as described with reference to FIGS. 7 through 10.

At 1610, the UE may determine that a decoding procedure associated with a first set of code blocks is successful. The operations of 1610 may be performed according to the methods described herein. In some examples, aspects of the operations of 1610 may be performed by a decoding manager as described with reference to FIGS. 7 through 10.

At 1615, the UE may determine that a decoding procedure associated with a second set of code blocks is unsuccessful. The operations of 1615 may be performed according to the methods described herein. In some examples, aspects of the operations of 1615 may be performed by a decoding manager as described with reference to FIGS. 7 through 10.

At 1620, the UE may transmit, to the base station, a feedback message comprising an indicator that the decoding procedure was unsuccessful for the CBG based at least in part on the determining that the decoding procedure associated with at least one of the first set of code blocks or the second set of code blocks is unsuccessful. The operations of 1620 may be performed according to the methods described herein. In some examples, aspects of the operations of 1620 may be performed by a feedback manager as described with reference to FIGS. 7 through 10.

At 1625, the UE may receive, from the base station in a second TTI and based at least in part on the transmitted feedback message, a retransmission of the CBG comprising both the first set of code blocks and the second set of code blocks. The operations of 1625 may be performed according to the methods described herein. In some examples, aspects of the operations of 1625 may be performed by a CBG manager as described with reference to FIGS. 7 through 10.

Figure 17:
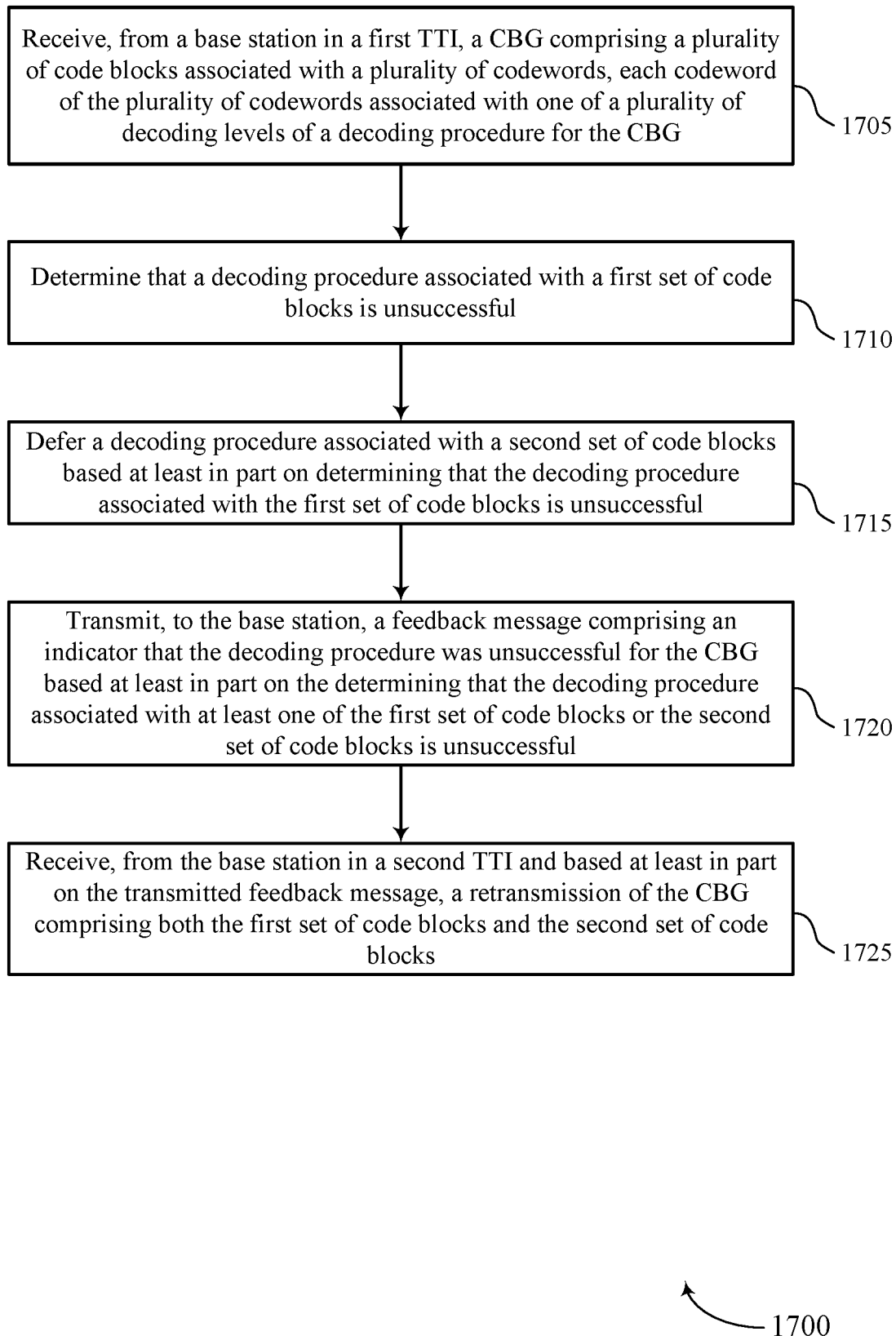

FIG. 17 shows a flowchart illustrating a method 1700 that supports latency minimization for retransmissions in communications systems with multi-level coding and multi-level sequential demodulation and decoding and code block grouping from different component codes in accordance with aspects of the present disclosure. The operations of method 1700 may be implemented by a UE 115 or its components as described herein. For example, the operations of method 1700 may be performed by a communications manager as described with reference to FIGS. 7 through 10. In some examples, a UE may execute a set of instructions to control the functional elements of the UE to perform the functions described herein. Additionally or alternatively, a UE may perform aspects of the functions described herein using special-purpose hardware.

At 1705, the UE may receive, from a base station in a first TTI, a CBG comprising a plurality of code blocks associated with a plurality of codewords, each codeword of the plurality of codewords associated with one of a plurality of decoding levels of a decoding procedure for the CBG. The operations of 1705 may be performed according to the methods described herein. In some examples, aspects of the operations of 1705 may be performed by a CBG manager as described with reference to FIGS. 7 through 10.

At 1710, the UE may determine that a decoding procedure associated with a first set of code blocks is unsuccessful. The operations of 1710 may be performed according to the methods described herein. In some examples, aspects of the operations of 1710 may be performed by a decoding manager as described with reference to FIGS. 7 through 10.

At 1715, the UE may defer a decoding procedure associated with a second set of code blocks based at least in part on determining that the decoding procedure associated with the first set of code blocks is unsuccessful. The operations of 1715 may be performed according to the methods described herein. In some examples, aspects of the operations of 1715 may be performed by a decoding manager as described with reference to FIGS. 7 through 10.

At 1720, the UE may transmit, to the base station, a feedback message comprising an indicator that the decoding procedure was unsuccessful for the CBG based at least in part on the determining that the decoding procedure associated with at least one of the first set of code blocks or the second set of code blocks is unsuccessful. The operations of 1720 may be performed according to the methods described herein. In some examples, aspects of the operations of 1720 may be performed by a feedback manager as described with reference to FIGS. 7 through 10.

At 1725, the UE may receive, from the base station in a second TTI and based at least in part on the transmitted feedback message, a retransmission of the CBG comprising both the first set of code blocks and the second set of code blocks. The operations of 1725 may be performed according to the methods described herein. In some examples, aspects of the operations of 1725 may be performed by a CBG manager as described with reference to FIGS. 7 through 10.

Figure 18:
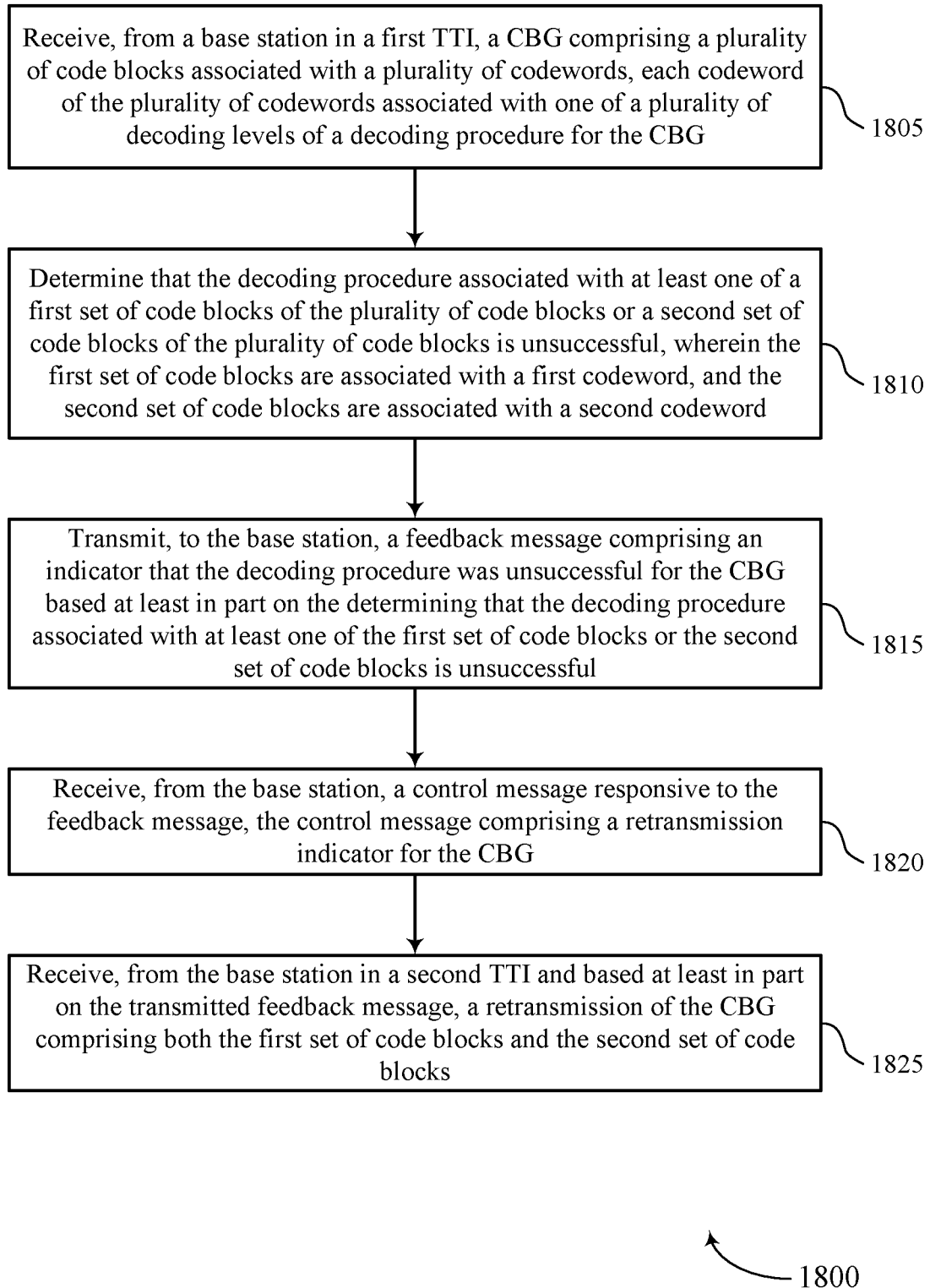

FIG. 18 shows a flowchart illustrating a method 1800 that supports latency minimization for retransmissions in communications systems with multi-level coding and multi-level sequential demodulation and decoding and code block grouping from different component codes in accordance with aspects of the present disclosure. The operations of method 1800 may be implemented by a UE 115 or its components as described herein. For example, the operations of method 1800 may be performed by a communications manager as described with reference to FIGS. 7 through 10. In some examples, a UE may execute a set of instructions to control the functional elements of the UE to perform the functions described herein. Additionally or alternatively, a UE may perform aspects of the functions described herein using special-purpose hardware.

At 1805, the UE may receive, from a base station in a first TTI, a CBG comprising a plurality of code blocks associated with a plurality of codewords, each codeword of the plurality of codewords associated with one of a plurality of decoding levels of a decoding procedure for the CBG. The operations of 1805 may be performed according to the methods described herein. In some examples, aspects of the operations of 1805 may be performed by a CBG manager as described with reference to FIGS. 7 through 10.

At 1810, the UE may determine that the decoding procedure associated with at least one of a first set of code blocks of the plurality of code blocks or a second set of code blocks of the plurality of code blocks is unsuccessful, wherein the first set of code blocks are associated with a first codeword, and the second set of code blocks are associated with a second codeword. The operations of 1810 may be performed according to the methods described herein. In some examples, aspects of the operations of 1810 may be performed by a decoding manager as described with reference to FIGS. 7 through 10.

At 1815, the UE may transmit, to the base station, a feedback message comprising an indicator that the decoding procedure was unsuccessful for the CBG based at least in part on the determining that the decoding procedure associated with at least one of the first set of code blocks or the second set of code blocks is unsuccessful. The operations of 1815 may be performed according to the methods described herein. In some examples, aspects of the operations of 1815 may be performed by a feedback manager as described with reference to FIGS. 7 through 10.

At 1820, the UE may receive, from the base station, a control message responsive to the feedback message, the control message comprising a retransmission indicator for the CBG. The operations of 1820 may be performed according to the methods described herein. In some examples, aspects of the operations of 1820 may be performed by a CBG manager as described with reference to FIGS. 7 through 10.

At 1825, the UE may receive, from the base station in a second TTI and based at least in part on the transmitted feedback message, a retransmission of the CBG comprising both the first set of code blocks and the second set of code blocks. The operations of 1825 may be performed according to the methods described herein. In some examples, aspects of the operations of 1825 may be performed by a CBG manager as described with reference to FIGS. 7 through 10.

Figure 19:
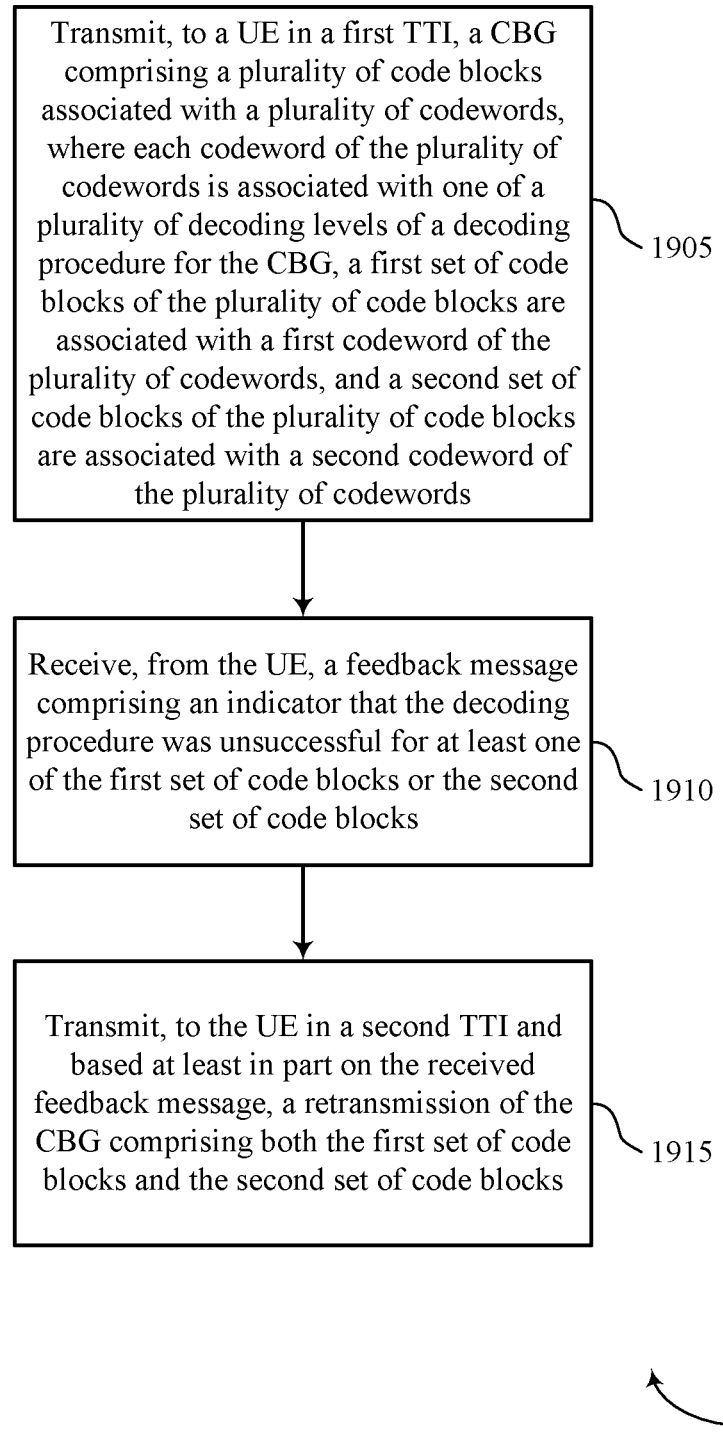

FIG. 19 shows a flowchart illustrating a method 1900 that supports latency minimization for retransmissions in communications systems with multi-level coding and multi-level sequential demodulation and decoding and code block grouping from different component codes in accordance with aspects of the present disclosure. The operations of method 1900 may be implemented by a base station 105 or its components as described herein. For example, the operations of method 1900 may be performed by a communications manager as described with reference to FIGS. 11 through 14. In some examples, a base station may execute a set of instructions to control the functional elements of the base station to perform the functions described herein. Additionally or alternatively, a base station may perform aspects of the functions described herein using special-purpose hardware.

At 1905, the base station may transmit, to a UE in a first TTI, a CBG comprising a plurality of code blocks associated with a plurality of codewords, wherein each codeword of the plurality of codewords is associated with one of a plurality of decoding levels of a decoding procedure for the CBG, a first set of code blocks of the plurality of code blocks are associated with a first codeword of the plurality of codewords, and a second set of code blocks of the plurality of code blocks are associated with a second codeword of the plurality of codewords. The operations of 1905 may be performed according to the methods described herein. In some examples, aspects of the operations of 1905 may be performed by a CBG manager as described with reference to FIGS. 11 through 14.

At 1910, the base station may receive, from the UE, a feedback message comprising an indicator that the decoding procedure was unsuccessful for at least one of the first set of code blocks or the second set of code blocks. The operations of 1910 may be performed according to the methods described herein. In some examples, aspects of the operations of 1910 may be performed by a feedback manager as described with reference to FIGS. 11 through 14.

At 1915, the base station may transmit, to the UE in a second TTI and based at least in part on the received feedback message, a retransmission of the CBG comprising both the first set of code blocks and the second set of code blocks. The operations of 1915 may be performed according to the methods described herein. In some examples, aspects of the operations of 1915 may be performed by a CBG manager as described with reference to FIGS. 11 through 14.

Figure 20:
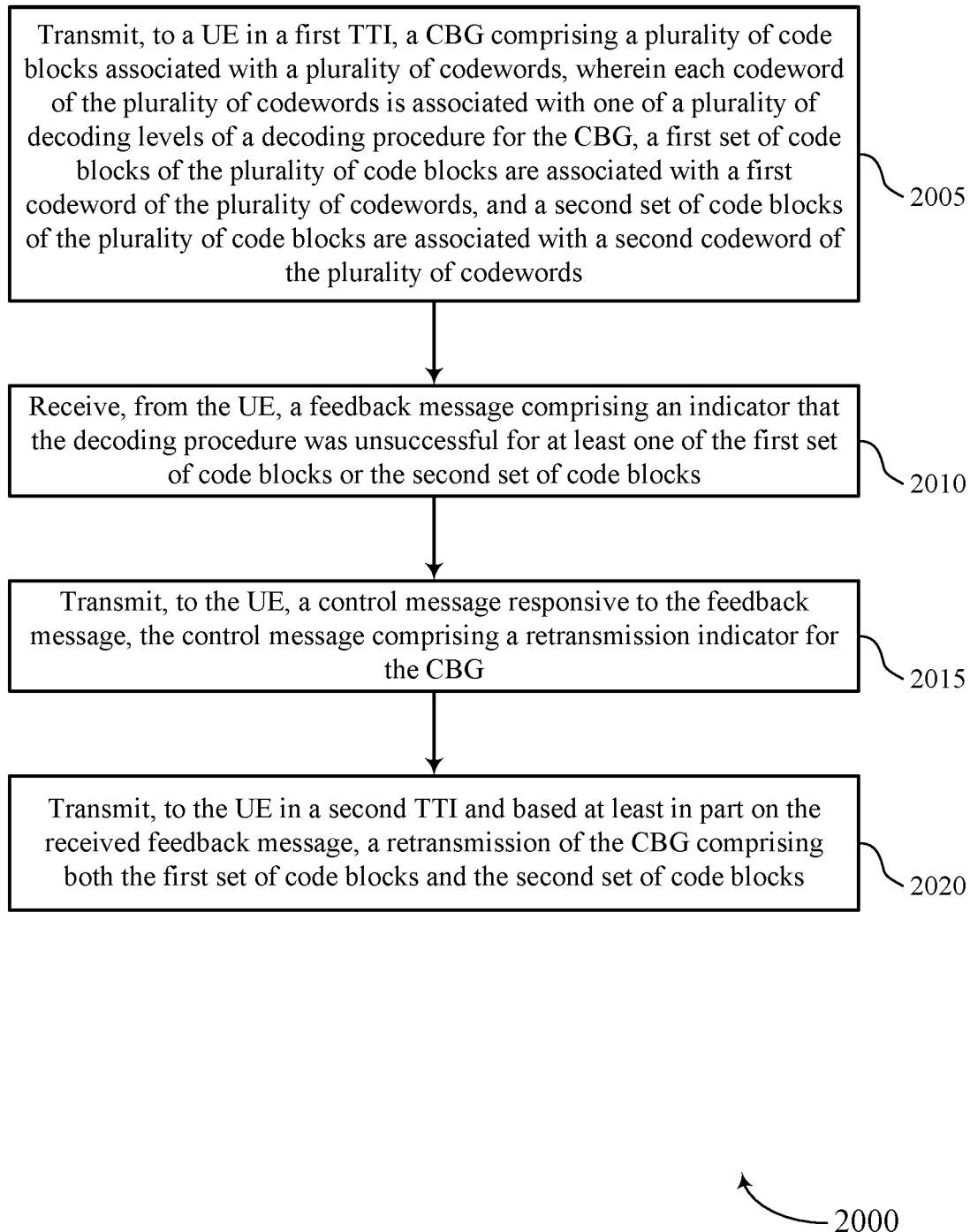

FIG. 20 shows a flowchart illustrating a method 2000 that supports latency minimization for retransmissions in communications systems with multi-level coding and multi-level sequential demodulation and decoding and code block grouping from different component codes in accordance with aspects of the present disclosure. The operations of method 2000 may be implemented by a base station 105 or its components as described herein. For example, the operations of method 2000 may be performed by a communications manager as described with reference to FIGS. 11 through 14. In some examples, a base station may execute a set of instructions to control the functional elements of the base station to perform the functions described herein. Additionally or alternatively, a base station may perform aspects of the functions described herein using special-purpose hardware.

At 2005, the base station may transmit, to a UE in a first TTI, a CBG comprising a plurality of code blocks associated with a plurality of codewords, wherein each codeword of the plurality of codewords is associated with one of a plurality of decoding levels of a decoding procedure for the CBG, a first set of code blocks of the plurality of code blocks are associated with a first codeword of the plurality of codewords, and a second set of code blocks of the plurality of code blocks are associated with a second codeword of the plurality of codewords. The operations of 2005 may be performed according to the methods described herein. In some examples, aspects of the operations of 2005 may be performed by a CBG manager as described with reference to FIGS. 11 through 14.

At 2010, the base station may receive, from the UE, a feedback message comprising an indicator that the decoding procedure was unsuccessful for at least one of the first set of code blocks or the second set of code blocks. The operations of 2010 may be performed according to the methods described herein. In some examples, aspects of the operations of 2010 may be performed by a feedback manager as described with reference to FIGS. 11 through 14.

At 2015, the base station may transmit, to the UE, a control message responsive to the feedback message, the control message comprising a retransmission indicator for the CBG. The operations of 2015 may be performed according to the methods described herein. In some examples, aspects of the operations of 2015 may be performed by a CBG manager as described with reference to FIGS. 11 through 14.

At 2020, the base station may transmit, to the UE in a second TTI and based at least in part on the received feedback message, a retransmission of the CBG comprising both the first set of code blocks and the second set of code blocks. The operations of 2020 may be performed according to the methods described herein. In some examples, aspects of the operations of 2020 may be performed by a CBG manager as described with reference to FIGS. 11 through 14.

The following provides an overview of aspects of the present disclosure:

Aspect 1: A method for wireless communication at a UE, comprising: receiving, from a base station in a first TTI, a CBG comprising a plurality of code blocks associated with a plurality of codewords, each codeword of the plurality of codewords associated with one of a plurality of decoding levels of a decoding procedure for the CBG; determining that the decoding procedure associated with at least one of a first set of code blocks of the plurality of code blocks or a second set of code blocks of the plurality of code blocks is unsuccessful, wherein the first set of code blocks are associated with a first codeword, and the second set of code blocks are associated with a second codeword; transmitting, to the base station, a feedback message comprising an indicator that the decoding procedure was unsuccessful for the CBG based at least in part on the determining that the decoding procedure associated with at least one of the first set of code blocks or the second set of code blocks is unsuccessful; and receiving, from the base station in a second TTI and based at least in part on the transmitted feedback message, a retransmission of the CBG comprising both the first set of code blocks and the second set of code blocks.

Aspect 2: The method of aspect 1, wherein determining that the decoding procedure associated with at least one of the first set of code blocks or the second set of code blocks is unsuccessful comprises: determining that the decoding procedure associated with the first set of code blocks is successful; and determining that the decoding procedure associated with the second set of code blocks is unsuccessful.

Aspect 3: The method of aspect 2, further comprising: storing a decoded payload associated with the first set of code blocks in a buffer at the UE.

Aspect 4: The method of aspect 3, further comprising: storing a log likelihood ratio associated with the second set of code blocks associated with the second codeword and a HARQ process identifier.

Aspect 5: The method of aspect 4, further comprising: decoding, in the second TTI and based at least in part on receiving the retransmission of the CBG, the second set of code blocks associated with the second codeword using the stored log likelihood ratio; determining that the decoding procedure associated with the retransmission of the second set of code blocks is successful based at least in part on the decoding; and transmitting, to the base station, a second feedback message indicating that the decoding procedure associated with the retransmission of the CBG is successful.

Aspect 6: The method of aspect 5, wherein decoding the second set of code blocks during the second TTI comprises: decoding the second set of code blocks of the retransmission of the CBG received during the second TTI after HARQ combining with the second set of code blocks of the CBG received during the first TTI.

Aspect 7: The method of any of aspects 5 or 6, further comprising: re-modulating a redundancy version of the first set of code blocks of the retransmission of the CBG during the second TTI based at least in part on the stored decoded payload associated with the first set of code blocks; and determining set partitioning information for demodulation of the second set of code blocks of the retransmission of the CBG during the second TTI based at least in part on the stored decoded payload associated with the first set of code blocks and re-encoding for obtaining a corresponding redundancy version that defines the set partitioning information.

Aspect 8: The method of aspect 7, further comprising: refraining from decoding the first set of code blocks of the retransmission of the CBG during the second TTI based at least in part on determining that the decoding procedure associated with the first set of code blocks is successful during the first TTI.

Aspect 9: The method of aspect 1, wherein determining that the decoding procedure associated with one of the first set of code blocks or the second set of code blocks is unsuccessful further comprises: determining that the decoding procedure associated with the first set of code blocks is unsuccessful; and deferring the decoding procedure associated with the second set of code blocks based at least in part on determining that the decoding procedure associated with the first set of code blocks is unsuccessful.

Aspect 10: The method of aspect 9, further comprising: storing a log likelihood ratio associated with the first set of code blocks associated with the first codeword and a HARQ process identifier; and storing post-processing samples corresponding to resources occupied by the second set of code blocks associated with the second codeword, the second set of code blocks corresponding to the first set of code blocks, wherein the post-processing samples are stored in a corresponding buffer.

Aspect 11: The method of aspect 10, further comprising: successfully decoding the first set of code blocks associated with the first codeword during the second TTI based at least in part on receiving the retransmission of the CBG and using the stored log likelihood ratio for HARQ combining with the retransmission of the CBG; determining set partitioning information for demodulation of the second set of code blocks of the retransmission of the CBG during the second TTI based at least in part on successfully decoding the first set of code blocks during the second TTI; and decoding the second set of code blocks of the retransmission of the CBG during the second TTI based at least in part on the set partitioning information for the demodulation of the second set of code blocks.

Aspect 12: The method of aspect 11, wherein successfully decoding the first set of code blocks associated with the first codeword during the second TTI comprises: decoding the first set of code blocks of the retransmission of the CBG received during the second TTI after the HARQ combining with the first set of code blocks of the CBG received during the first TTI.

Aspect 13: The method of any of aspects 11 or 12, wherein decoding the second set of code blocks of the retransmission of the CBG during the second TTI comprises: decoding the second set of code blocks of the retransmission of the CBG received during the second TTI after the HARQ combining with the second set of code blocks of the CBG received during the first TTI, wherein the HARQ combining is based at least in part on the stored post-processing samples.

Aspect 14: The method of aspect 13, wherein the HARQ combining comprises: determining a first log likelihood ratio associated with the second set of code blocks associated with the second codeword received during the first TTI based at least in part on the set partitioning information and the stored post-processing samples; and combining the first log likelihood ratio with a corresponding second log likelihood ratio associated with the second set of code blocks associated with the second codeword received during the second TTI.

Aspect 15: The method of any of aspects 9 through 14, further comprising: transmitting, to the base station, an indication of a capability of the UE to support hierarchical acknowledgment feedback, a number of HARQ processes across the plurality of decoding levels, and a corresponding number of samples buffers of the UE, wherein receiving the retransmission of the CBG comprising the first set of code blocks associated with the first codeword and the second set of code blocks associated with the second codeword using a same redundancy version for both the first set of code blocks and the second set of code blocks is based at least in part on the capability of the UE.

Aspect 16: The method of any of aspects 1 through 15, further comprising: receiving, from the base station, a control message responsive to the feedback message, the control message comprising a retransmission indicator for the CBG.

Aspect 17: The method of aspect 16, further comprising: determining that the retransmission indicator comprises a HARQ process identifier and a redundancy version associated with the first codeword and the second codeword, wherein receiving the retransmission of the CBG comprising both the first set of code blocks and the second set of code blocks comprises receiving a retransmission of first codeword and the second codeword associated with the first set of code blocks and the second set of code blocks, respectively.

Aspect 18: The method of any of aspects 16 or 17, wherein the control message comprises a DCI message.

Aspect 19: The method of any of aspects 1 through 18, wherein transmitting the feedback message comprises: transmitting the feedback message including the indicator that the decoding procedure was unsuccessful for the CBG and an indication of a lowest failing decoding level for the CBG, wherein the indication is of a first decoding level associated with the first codeword if the decoding procedure was unsuccessful for the first set of code blocks or of a second decoding level associated with the second codeword if the decoding procedure was unsuccessful for the second set of code blocks.

Aspect 20: The method of any of aspects 1 through 19, wherein the first codeword is associated with a first and lower decoding level and the second codeword is associated with a second and higher decoding level.

Aspect 21: The method of any of aspects 1 through 20, wherein the UE is configured to support multi-level coding with a multi-level sequential demodulation and decoding scheme.

Aspect 22: The method of any of aspects 1 through 21, wherein the first TTI comprises a first subframe or a first slot, and the second TTI comprises a second subframe or a second slot.

Aspect 23: A method for wireless communication at a base station, comprising: transmitting, to a UE in a first TTI, a CBG comprising a plurality of code blocks associated with a plurality of codewords, wherein each codeword of the plurality of codewords is associated with one of a plurality of decoding levels of a decoding procedure for the CBG, a first set of code blocks of the plurality of code blocks are associated with a first codeword of the plurality of codewords, and a second set of code blocks of the plurality of code blocks are associated with a second codeword of the plurality of codewords; receiving, from the UE, a feedback message comprising an indicator that the decoding procedure was unsuccessful for at least one of the first set of code blocks or the second set of code blocks; and transmitting, to the UE in a second TTI and based at least in part on the received feedback message, a retransmission of the CBG comprising both the first set of code blocks and the second set of code blocks.

Aspect 24: The method of aspect 23, further comprising: transmitting, to the UE, a control message responsive to the feedback message, the control message comprising a retransmission indicator for the CBG.

Aspect 25: The method of aspect 24, further comprising: including a HARQ process identifier and a redundancy version associated with the first codeword and the second codeword in the retransmission indicator, wherein transmitting the retransmission of the CBG comprises transmitting a retransmission of the first set of code blocks associated with the first codeword and a retransmission of the second set of code blocks associated with the second codeword.

Aspect 26: The method of any of aspects 24 or 25, wherein the control message comprises a DCI message.

Aspect 27: The method of any of aspects 23 through 26, further comprising: determining that a data type associated with the CBG corresponds to a latency-sensitive data type, wherein transmitting the retransmission of the CBG comprising both the first set of code blocks and the second set of code blocks is based at least in part on the data type being the latency-sensitive data type.

Aspect 28: The method of any of aspects 23 through 27, wherein receiving the feedback message comprises: receiving the feedback message including the indicator that the decoding procedure was unsuccessful for the CBG and an indication of a lowest failing decoding level for the CBG, wherein the indication is of a first decoding level associated with the first codeword if the decoding procedure was unsuccessful for the first set of code blocks or of a second decoding level associated with the second codeword if the decoding procedure was unsuccessful for the second set of code blocks.

Aspect 29: The method of any of aspects 23 through 28, further comprising: receiving, from the UE, an indication of a capability of the UE to support hierarchical acknowledgment feedback, a number of HARQ processes across the plurality of decoding levels, and a corresponding number of samples buffers of the UE, wherein transmitting the retransmission of the CBG comprising the first set of code blocks associated with the first codeword and the second set of code blocks associated with the second codeword using a same redundancy version for both the first set of code blocks and the second set of code blocks is based at least in part on the capability of the UE.

Aspect 30: The method of any of aspects 23 through 29, wherein the first codeword is associated with a first and lower decoding level and the second codeword is associated with a second and higher decoding level.

Aspect 31: The method of any of aspects 23 through 30, wherein the base station is configured to support multi-level coding.

Aspect 32: The method of any of aspects 23 through 31, wherein the first TTI comprises a first subframe or a first slot, and the second TTI comprises a second subframe or a second slot.

Aspect 33: An apparatus for wireless communication at a UE, comprising at least one processor; memory coupled with the at least one processor; and instructions stored in the memory and executable by the at least one processor to cause the apparatus to perform a method of any of aspects 1 through 22.

Aspect 34: An apparatus for wireless communication at a UE, comprising at least one means for performing a method of any of aspects 1 through 22.

Aspect 35: A non-transitory computer-readable medium storing code for wireless communication at a UE, the code comprising instructions executable by at least one processor to perform a method of any of aspects 1 through 22.

Aspect 36: An apparatus for wireless communication at a base station, comprising at least one processor; memory coupled with the at least one processor; and instructions stored in the memory and executable by the at least one processor to cause the apparatus to perform a method of any of aspects 23 through 32.

Aspect 37: An apparatus for wireless communication at a base station, comprising at least one means for performing a method of any of aspects 23 through 32.

Aspect 38: A non-transitory computer-readable medium storing code for wireless communication at a base station, the code comprising instructions executable by at least one processor to perform a method of any of aspects 23 through 32.

It should be noted that the methods described herein describe possible implementations, and that the operations and the steps may be rearranged or otherwise modified and that other implementations are possible. Further, aspects from two or more of the methods may be combined.

Although aspects of an LTE, LTE-A, LTE-A Pro, or NR system may be described for purposes of example, and LTE, LTE-A, LTE-A Pro, or NR terminology may be used in much of the description, the techniques described herein are applicable beyond LTE, LTE-A, LTE-A Pro, or NR networks. For example, the described techniques may be applicable to various other wireless communications systems such as Ultra Mobile Broadband (UMB), Institute of Electrical and Electronics Engineers (IEEE) 802.11 (Wi-Fi), IEEE 802.16 (WiMAX), IEEE 802.20, Flash-OFDM, as well as other systems and radio technologies not explicitly mentioned herein.

Information and signals described herein may be represented using any of a variety of different technologies and techniques. For example, data, instructions, commands, information, signals, bits, symbols, and chips that may be referenced throughout the description may be represented by voltages, currents, electromagnetic waves, magnetic fields or particles, optical fields or particles, or any combination thereof.

The various illustrative blocks and components described in connection with the disclosure herein may be implemented or performed with a general-purpose processor, a DSP, an ASIC, a CPU, an FPGA or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

The functions described herein may be implemented in hardware, software executed by a processor, or any combination thereof. Software shall be construed broadly to mean instructions, instruction sets, code, code segments, program code, programs, subprograms, software modules, applications, software applications, software packages, routines, subroutines, objects, executables, threads of execution, procedures, or functions, whether referred to as software, firmware, middleware, microcode, hardware description language, or otherwise. If implemented in software executed by a processor, the functions may be stored on or transmitted over as one or more instructions or code on a computer-readable medium. Other examples and implementations are within the scope of the disclosure and appended claims. For example, due to the nature of software, functions described herein may be implemented using software executed by a processor, hardware, hardwiring, or combinations of any of these. Features implementing functions may also be physically located at various positions, including being distributed such that portions of functions are implemented at different physical locations.

Computer-readable media includes both non-transitory computer storage media and communication media including any medium that facilitates transfer of a computer program from one place to another. A non-transitory storage medium may be any available medium that may be accessed by a general-purpose or special-purpose computer. By way of example, and not limitation, non-transitory computer-readable media may include RAM, ROM, electrically erasable programmable ROM (EEPROM), flash memory, phase change memory, compact disk (CD) ROM or other optical disk storage, magnetic disk storage or other magnetic storage devices, or any other non-transitory medium that may be used to carry or store desired program code means in the form of instructions or data structures and that may be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of computer-readable medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

As used herein, including in the claims, "or" as used in a list of items (e.g., a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an example step that is described as "based on condition A" may be based on both a condition A and a condition B without departing from the scope of the present disclosure. In other words, as used herein, the phrase "based on" shall be construed in the same manner as the phrase "based at least in part on." As used herein, the term "and/or," when used in a list of two or more items, means that any one of the listed items can be employed by itself, or any combination of two or more of the listed items can be employed. For example, if a composition is described as containing components A, B, and/or C, the composition can contain A alone; B alone; C alone; A and B in combination; A and C in combination; B and C in combination; or A, B, and C in combination.

The term "determine" or "determining" encompasses a wide variety of actions and, therefore, "determining" can include calculating, computing, processing, deriving, investigating, looking up (such as via looking up in a table, a database or another data structure), ascertaining and the like. Also, "determining" can include receiving (such as receiving information), accessing (such as accessing data in a memory) and the like. Also, "determining" can include resolving, selecting, choosing, establishing and other such similar actions.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label, or other subsequent reference label.

The description set forth herein, in connection with the appended drawings, describes example configurations and does not represent all the examples that may be implemented or that are within the scope of the claims. The term "example" used herein means "serving as an example, instance, or illustration," and not "preferred" or "advantageous over other examples." The detailed description includes specific details for the purpose of providing an understanding of the described techniques. These techniques, however, may be practiced without these specific details. In some instances, known structures and devices are shown in block diagram form in order to avoid obscuring the concepts of the described examples.

The description herein is provided to enable a person having ordinary skill in the art to make or use the disclosure. Various modifications to the disclosure will be apparent to a person having ordinary skill in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. A method for wireless communication at a user equipment (UE), comprising:
   receiving, from a base station in a first transmission time interval, a code block group comprising a plurality of code blocks associated with a plurality of codewords, each codeword of the plurality of codewords associated with one of a plurality of decoding levels of a decoding procedure for the code block group;
   determining that the decoding procedure associated with at least one of a first set of code blocks of the plurality of code blocks or a second set of code blocks of the plurality of code blocks is unsuccessful, wherein the first set of code blocks are associated with a first codeword, and the second set of code blocks are associated with a second codeword;
   transmitting, to the base station, a feedback message comprising an indicator that the decoding procedure was unsuccessful for the code block group based at least in part on the determining that the decoding procedure associated with at least one of the first set of code blocks or the second set of code blocks is unsuccessful; and
   receiving, from the base station in a second transmission time interval and based at least in part on the transmitted feedback message, a retransmission of the code block group comprising both the first set of code blocks and the second set of code blocks.

2. The method of claim 1, wherein determining that the decoding procedure associated with at least one of the first set of code blocks or the second set of code blocks is unsuccessful comprises:
   determining that the decoding procedure associated with the first set of code blocks is successful; and
   determining that the decoding procedure associated with the second set of code blocks is unsuccessful.

3. The method of claim 2, further comprising:
   storing a decoded payload associated with the first set of code blocks in a buffer at the UE.

4. The method of claim 3, further comprising:
   storing a log likelihood ratio associated with the second set of code blocks associated with the second codeword and a hybrid automatic repeat request process identifier.

5. The method of claim 4, further comprising:
   decoding, in the second transmission time interval and based at least in part on receiving the retransmission of the code block group, the second set of code blocks associated with the second codeword using the stored log likelihood ratio;
   determining that the decoding procedure associated with the retransmission of the second set of code blocks is successful based at least in part on the decoding; and
   transmitting, to the base station, a second feedback message indicating that the decoding procedure associated with the retransmission of the code block group is successful.

6. The method of claim 5, further comprising:
   re-modulating a redundancy version of the first set of code blocks of the retransmission of the code block group during the second transmission time interval based at least in part on the stored decoded payload associated with the first set of code blocks; and
   determining set partitioning information for demodulation of the second set of code blocks of the retransmission of the code block group during the second transmission time interval based at least in part on the stored decoded payload associated with the first set of code blocks and re-encoding for obtaining a corresponding redundancy version that defines the set partitioning information.

7. The method of claim 1, wherein determining that the decoding procedure associated with one of the first set of code blocks or the second set of code blocks is unsuccessful further comprises:
   determining that the decoding procedure associated with the first set of code blocks is unsuccessful; and
   deferring the decoding procedure associated with the second set of code blocks based at least in part on determining that the decoding procedure associated with the first set of code blocks is unsuccessful.

8. The method of claim 7, further comprising:
   storing a log likelihood ratio associated with the first set of code blocks associated with the first codeword and a hybrid automatic repeat request process identifier; and
   storing post-processing samples corresponding to resources occupied by the second set of code blocks associated with the second codeword, the second set of code blocks corresponding to the first set of code blocks, wherein the post-processing samples are stored in a corresponding buffer.

9. The method of claim 8, further comprising:
successfully decoding the first set of code blocks associated with the first codeword during the second transmission time interval based at least in part on receiving the retransmission of the code block group and using the stored log likelihood ratio for hybrid automatic repeat request combining with the retransmission of the code block group;
determining set partitioning information for demodulation of the second set of code blocks of the retransmission of the code block group during the second transmission time interval based at least in part on successfully decoding the first set of code blocks during the second transmission time interval; and
decoding the second set of code blocks of the retransmission of the code block group during the second transmission time interval based at least in part on the set partitioning information for the demodulation of the second set of code blocks.

10. The method of claim 9, wherein successfully decoding the first set of code blocks associated with the first codeword during the second transmission time interval comprises:
decoding the first set of code blocks of the retransmission of the code block group received during the second transmission time interval after the hybrid automatic repeat request combining with the first set of code blocks of the code block group received during the first transmission time interval.

11. The method of claim 9, wherein decoding the second set of code blocks of the retransmission of the code block group during the second transmission time interval comprises:
decoding the second set of code blocks of the retransmission of the code block group received during the second transmission time interval after the hybrid automatic repeat request combining with the second set of code blocks of the code block group received during the first transmission time interval, wherein the hybrid automatic repeat request combining is based at least in part on the stored post-processing samples.

12. The method of claim 11, wherein the hybrid automatic repeat request combining comprises:
determining a first log likelihood ratio associated with the second set of code blocks associated with the second codeword received during the first transmission time interval based at least in part on the set partitioning information and the stored post-processing samples; and
combining the first log likelihood ratio with a corresponding second log likelihood ratio associated with the second set of code blocks associated with the second codeword received during the second transmission time interval.

13. The method of claim 7, further comprising:
transmitting, to the base station, an indication of a capability of the UE to support hierarchical acknowledgment feedback, a number of hybrid automatic repeat request processes across the plurality of decoding levels, and a corresponding number of samples buffers of the UE, wherein receiving the retransmission of the code block group comprising the first set of code blocks associated with the first codeword and the second set of code blocks associated with the second codeword using a same redundancy version for both the first set of code blocks and the second set of code blocks is based at least in part on the capability of the UE.

14. The method of claim 1, further comprising:
receiving, from the base station, a control message responsive to the feedback message, the control message comprising a retransmission indicator for the code block group; and
determining that the retransmission indicator comprises a hybrid automatic repeat request process identifier and a redundancy version associated with the first codeword and the second codeword, wherein receiving the retransmission of the code block group comprising both the first set of code blocks and the second set of code blocks comprises receiving a retransmission of first codeword and the second codeword associated with the first set of code blocks and the second set of code blocks, respectively.

15. The method of claim 1, wherein transmitting the feedback message comprises:
transmitting the feedback message including the indicator that the decoding procedure was unsuccessful for the code block group and an indication of a lowest failing decoding level for the code block group, wherein the indication is of a first decoding level associated with the first codeword if the decoding procedure was unsuccessful for the first set of code blocks or of a second decoding level associated with the second codeword if the decoding procedure was unsuccessful for the second set of code blocks.

16. The method of claim 1, wherein the first codeword is associated with a first and lower decoding level and the second codeword is associated with a second and higher decoding level.

17. The method of claim 1, wherein the UE is configured to support multi-level coding with a multi-level sequential demodulation and decoding scheme.

18. A method for wireless communication at a base station, comprising:
transmitting, to a user equipment (UE) in a first transmission time interval, a code block group comprising a plurality of code blocks associated with a plurality of codewords, wherein each codeword of the plurality of codewords is associated with one of a plurality of decoding levels of a decoding procedure for the code block group, a first set of code blocks of the plurality of code blocks are associated with a first codeword of the plurality of codewords, and a second set of code blocks of the plurality of code blocks are associated with a second codeword of the plurality of codewords;
receiving, from the UE, a feedback message comprising an indicator that the decoding procedure was unsuccessful for at least one of the first set of code blocks or the second set of code blocks; and
transmitting, to the UE in a second transmission time interval and based at least in part on the received feedback message, a retransmission of the code block group comprising both the first set of code blocks and the second set of code blocks.

19. The method of claim 18, further comprising:
transmitting, to the UE, a control message responsive to the feedback message, the control message comprising a retransmission indicator for the code block group, the retransmission indicator including a hybrid automatic repeat request process identifier and a redundancy version associated with the first codeword and the second codeword, wherein transmitting the retransmission of the code block group comprises transmitting a retransmission of the first set of code blocks associated with the first codeword and a retransmission of the second set of code blocks associated with the second codeword.

20. The method of claim 18, further comprising:
determining that a data type associated with the code block group corresponds to a latency-sensitive data type, wherein transmitting the retransmission of the code block group comprising both the first set of code blocks and the second set of code blocks is based at least in part on the data type being the latency-sensitive data type.

21. The method of claim 18, wherein receiving the feedback message comprises:
receiving the feedback message including the indicator that the decoding procedure was unsuccessful for the code block group and an indication of a lowest failing decoding level for the code block group, wherein the indication is of a first decoding level associated with the first codeword if the decoding procedure was unsuccessful for the first set of code blocks or of a second decoding level associated with the second codeword if the decoding procedure was unsuccessful for the second set of code blocks.

22. The method of claim 18, further comprising:
receiving, from the UE, an indication of a capability of the UE to support hierarchical acknowledgment feedback, a number of hybrid automatic repeat request processes across the plurality of decoding levels, and a corresponding number of samples buffers of the UE, wherein transmitting the retransmission of the code block group comprising the first set of code blocks associated with the first codeword and the second set of code blocks associated with the second codeword using a same redundancy version for both the first set of code blocks and the second set of code blocks is based at least in part on the capability of the UE.

23. The method of claim 18, wherein the first codeword is associated with a first and lower decoding level and the second codeword is associated with a second and higher decoding level.

24. The method of claim 18, wherein the base station is configured to support multi-level coding.

25. An apparatus for wireless communication at a user equipment (UE), comprising:
at least one processor,
memory coupled to the at least one processor; and
instructions stored in the memory and executable by the at least one processor to cause the UE to:
receive, from a base station in a first transmission time interval, a code block group comprising a plurality of code blocks associated with a plurality of codewords, each codeword of the plurality of codewords associated with one of a plurality of decoding levels of a decoding procedure for the code block group;
determine that the decoding procedure associated with at least one of a first set of code blocks of the plurality of code blocks or a second set of code blocks of the plurality of code blocks is unsuccessful, wherein the first set of code blocks are associated with a first codeword, and the second set of code blocks are associated with a second codeword;
transmit, to the base station, a feedback message comprising an indicator that the decoding procedure was unsuccessful for the code block group based at least in part on the determining that the decoding procedure associated with at least one of the first set of code blocks or the second set of code blocks is unsuccessful; and
receive, from the base station in a second transmission time interval and based at least in part on the transmitted feedback message, a retransmission of the code block group comprising both the first set of code blocks and the second set of code blocks.

26. The apparatus of claim 25, wherein the instructions to determine that the decoding procedure associated with at least one of the first set of code blocks or the second set of code blocks is unsuccessful are executable by the at least one processor to cause the UE to:
determine that the decoding procedure associated with the first set of code blocks is successful; and
determine that the decoding procedure associated with the second set of code blocks is unsuccessful.

27. The apparatus of claim 26, wherein the instructions are further executable by the at least one processor to cause the UE to:
store a decoded payload associated with the first set of code blocks in a buffer at the UE;
store a log likelihood ratio associated with the second set of code blocks associated with the second codeword and a hybrid automatic repeat request process identifier;
decode, in the second transmission time interval and based at least in part on receiving the retransmission of the code block group, the second set of code blocks associated with the second codeword using the stored log likelihood ratio;
determine that the decoding procedure associated with the retransmission of the second set of code blocks is successful based at least in part on the decoding; and
transmit, to the base station, a second feedback message indicating that the decoding procedure associated with the retransmission of the code block group is successful.

28. The apparatus of claim 25, wherein the instructions to determine that the decoding procedure associated with one of the first set of code blocks or the second set of code blocks is unsuccessful further are executable by the at least one processor to cause the UE to:
determine that the decoding procedure associated with the first set of code blocks is unsuccessful; and
defer the decoding procedure associated with the second set of code blocks based at least in part on determining that the decoding procedure associated with the first set of code blocks is unsuccessful.

29. The apparatus of claim 28, wherein the instructions are further executable by the at least one processor to cause the UE to:
store a log likelihood ratio associated with the first set of code blocks associated with the first codeword and a hybrid automatic repeat request process identifier;
store post-processing samples corresponding to resources occupied by the second set of code blocks associated with the second codeword, the second set of code blocks corresponding to the first set of code blocks, wherein the post-processing samples are stored in a corresponding buffer;
successfully decode the first set of code blocks associated with the first codeword during the second transmission time interval based at least in part on receiving the retransmission of the code block group and using the stored log likelihood ratio for hybrid automatic repeat request combining with the retransmission of the code block group;

determine set partitioning information for demodulation of the second set of code blocks of the retransmission of the code block group during the second transmission time interval based at least in part on successfully decoding the first set of code blocks during the second transmission time interval; and decode the second set of code blocks of the retransmission of the code block group during the second transmission time interval based at least in part on the set partitioning information for the demodulation of the second set of code blocks.

30. An apparatus for wireless communication at a base station, comprising:

at least one processor, memory coupled to the at least one processor; and instructions stored in the memory and executable by the at least one processor to cause the base station to:

transmit, to a user equipment (UE) in a first transmission time interval, a code block group comprising a plurality of code blocks associated with a plurality of codewords, wherein each codeword of the plurality of codewords is associated with one of a plurality of decoding levels of a decoding procedure for the code block group, a first set of code blocks of the plurality of code blocks are associated with a first codeword of the plurality of codewords, and a second set of code blocks of the plurality of code blocks are associated with a second codeword of the plurality of codewords;

receive, from the UE, a feedback message comprising an indicator that the decoding procedure was unsuccessful for at least one of the first set of code blocks or the second set of code blocks; and transmit, to the UE in a second transmission time interval and based at least in part on the received feedback message, a retransmission of the code block group comprising both the first set of code blocks and the second set of code blocks.

* * * * *